US010304817B2

(12) United States Patent
Lin et al.

(10) Patent No.: US 10,304,817 B2
(45) **Date of Patent: *May 28, 2019**

(54) SEMICONDUCTOR DEVICE AND METHOD OF FORMING BUILD-UP INTERCONNECT STRUCTURES OVER A TEMPORARY SUBSTRATE

(71) Applicant: STATS ChipPAC Pte. Ltd., Singapore (SG)

(72) Inventors: Yaojian Lin, Jiangyin (CN); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 5 days.

This patent is subject to a terminal disclaimer.

(21) Appl. No.: 15/705,646

(22) Filed: Sep. 15, 2017

(65) Prior Publication Data

US 2018/0006008 A1 Jan. 4, 2018

Related U.S. Application Data

(63) Continuation of application No. 14/624,136, filed on Feb. 17, 2015, now Pat. No. 9,818,734, and a (Continued)

(51) Int. Cl.
*H01L 23/31* (2006.01)
*H01L 23/498* (2006.01)
(Continued)

(52) U.S. Cl.
CPC .............. *H01L 25/50* (2013.01); *H01L 21/56* (2013.01); *H01L 23/3121* (2013.01);
(Continued)

(58) Field of Classification Search
CPC ..... H01L 24/97; H01L 24/73; H01L 2224/97; H01L 2224/73204; H01L 23/5389;
(Continued)

(56) References Cited

U.S. PATENT DOCUMENTS 4,955,523 A 9/1990 Calomagno et al.
5,371,654 A 12/1994 Beaman et al.
(Continued)

FOREIGN PATENT DOCUMENTS

CN 102637608 A 8/2012

*Primary Examiner* — Michael M Trinh
(74) *Attorney, Agent, or Firm* — Brian M. Kaufman; Robert D. Atkins; Patent Law Group: Atkins and Associates, P.C.

(57) ABSTRACT

A semiconductor device has a first build-up interconnect structure formed over a substrate. The first build-up interconnect structure includes an insulating layer and conductive layer formed over the insulating layer. A vertical interconnect structure and semiconductor die are disposed over the first build-up interconnect structure. The semiconductor die, first build-up interconnect structure, and substrate are disposed over a carrier. An encapsulant is deposited over the semiconductor die, first build-up interconnect structure, and substrate. A second build-up interconnect structure is formed over the encapsulant. The second build-up interconnect structure electrically connects to the first build-up interconnect structure through the vertical interconnect structure. The substrate provides structural support and prevents warpage during formation of the first and second build-up interconnect structures. The substrate is removed after forming the second build-up interconnect structure. A portion of the insulating layer is removed exposing the conductive layer for electrical interconnect with subsequently stacked semiconductor devices.

22 Claims, 58 Drawing Sheets

Related U.S. Application Data continuation-in-part of application No. 13/832,118, filed on Mar. 15, 2013, now Pat. No. 9,385,052.

(60) Provisional application No. 62/021,135, filed on Jul. 5, 2014, provisional application No. 61/701,366, filed on Sep. 14, 2012.

(51) Int. Cl.

| | |
|---|---|
| ***H01L 25/065*** | (2006.01) |
| ***H01L 25/00*** | (2006.01) |
| ***H01L 21/56*** | (2006.01) |
| ***H01L 23/538*** | (2006.01) |
| ***H01L 23/00*** | (2006.01) |
| ***H01L 25/10*** | (2006.01) |
| ***H01L 23/552*** | (2006.01) |
| *H01L 21/66* | (2006.01) |

(52) U.S. Cl.

CPC .... *H01L 23/3128* (2013.01); *H01L 23/49811* (2013.01); *H01L 23/49816* (2013.01); *H01L 23/49833* (2013.01); *H01L 23/5389* (2013.01); *H01L 23/552* (2013.01); *H01L 24/19* (2013.01); *H01L 24/20* (2013.01); *H01L 24/96* (2013.01); *H01L 24/97* (2013.01); *H01L 25/105* (2013.01); *H01L 21/568* (2013.01); *H01L 22/12* (2013.01); *H01L 22/14* (2013.01); *H01L 22/20* (2013.01); *H01L 23/3192* (2013.01); *H01L 23/49822* (2013.01); *H01L 23/5383* (2013.01); *H01L 24/03* (2013.01); *H01L 24/05* (2013.01); *H01L 24/11* (2013.01); *H01L 24/13* (2013.01); *H01L 24/16* (2013.01); *H01L 24/29* (2013.01); *H01L 24/32* (2013.01); *H01L 2224/03* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04105* (2013.01); *H01L 2224/0558* (2013.01); *H01L 2224/05567* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/13022* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/16237* (2013.01); *H01L 2224/19* (2013.01); *H01L 2224/24227* (2013.01); *H01L 2224/2929* (2013.01); *H01L 2224/29298* (2013.01); *H01L 2224/32225* (2013.01); *H01L 2224/48091* (2013.01); *H01L 2224/73104* (2013.01); *H01L 2224/73204* (2013.01); *H01L 2224/73253* (2013.01); *H01L 2224/73265* (2013.01); *H01L 2224/73267* (2013.01); *H01L 2224/81005* (2013.01); *H01L 2224/83* (2013.01); *H01L 2224/83005* (2013.01); *H01L 2224/83191* (2013.01); *H01L 2224/92125* (2013.01); *H01L 2224/92244* (2013.01); *H01L 2224/94* (2013.01); *H01L 2224/97* (2013.01); *H01L 2225/1023* (2013.01); *H01L 2225/1035* (2013.01); *H01L 2225/1041* (2013.01); *H01L 2225/1058* (2013.01); *H01L 2924/00014* (2013.01); *H01L 2924/01082* (2013.01); *H01L 2924/01322* (2013.01); *H01L 2924/12041* (2013.01); *H01L 2924/12042* (2013.01); *H01L 2924/1305* (2013.01); *H01L 2924/1306* (2013.01); *H01L 2924/13091* (2013.01); *H01L 2924/141* (2013.01); *H01L 2924/143* (2013.01); *H01L 2924/1433* (2013.01); *H01L 2924/1434* (2013.01); *H01L 2924/1461* (2013.01); *H01L 2924/14335* (2013.01); *H01L 2924/153* (2013.01); *H01L 2924/157* (2013.01); *H01L 2924/1533* (2013.01); *H01L 2924/15311* (2013.01); *H01L 2924/15321* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01); *H01L 2924/3025* (2013.01); *H01L 2924/3511* (2013.01)

(58) Field of Classification Search

CPC ........... H01L 23/3128; H01L 23/49811; H01L 23/49816; H01L 25/0652; H01L 25/0655; H01L 2224/96; H01L 2224/16225; H01L 2224/32225; H01L 2224/73267; H01L 2224/73253; H01L 2224/83005; H01L 2224/81005; H01L 23/49822; H01L 23/49823; H01L 23/5383; H01L 23/3121; H01L 23/3192; H01L 24/96

See application file for complete search history.

(56) References Cited

U.S. PATENT DOCUMENTS

| | | | | |
|---|---|---|---|---|
| 5,455,390 | A | 10/1995 | DiStefano et al. | |
| 5,495,667 | A | 3/1996 | Farnworth et al. | |
| 5,601,740 | A | 2/1997 | Eldridge et al. | |
| 5,635,767 | A | 6/1997 | Wenzel et al. | |
| 6,133,072 | A | 10/2000 | Fjelstad | |
| 6,207,549 | B1 | 3/2001 | Higashi et al. | |
| 6,476,503 | B1 | 11/2002 | Imamura et al. | |
| 6,477,768 | B1 | 11/2002 | Wildner | |
| 6,690,090 | B2 | 2/2004 | Kimura | |
| 6,972,496 | B2 | 12/2005 | Choi | |
| 7,227,095 | B2 | 6/2007 | Roberts et al. | |
| 7,271,497 | B2 | 9/2007 | Joshi et al. | |
| 7,497,694 | B2 | 3/2009 | Kariya et al. | |
| 7,608,921 | B2 | 10/2009 | Pendse | |
| 7,855,462 | B2 | 12/2010 | Boon et al. | |
| 7,993,972 | B2 * | 8/2011 | Lin | H01L 21/6835 216/14 |
| 7,994,431 | B2 | 8/2011 | Yamano et al. | |
| 8,035,210 | B2 | 10/2011 | Yang et al. | |
| 8,035,211 | B2 | 10/2011 | Ko et al. | |
| 8,138,017 | B2 | 3/2012 | Chin | |
| 8,174,119 | B2 | 5/2012 | Pendse | |
| 8,193,034 | B2 | 6/2012 | Pagaila et al. | |
| 8,466,544 | B2 | 6/2013 | Pagaila | |
| 9,818,734 | B2 * | 11/2017 | Lin | H01L 25/50 |
| 2006/0084253 | A1 | 4/2006 | Mizukoshi et al. | |
| 2007/0108583 | A1 | 5/2007 | Shim et al. | |
| 2009/0008762 | A1 * | 1/2009 | Jung | H01L 23/5389 257/686 |
| 2009/0072375 | A1 | 3/2009 | Song et al. | |
| 2009/0166835 | A1 | 7/2009 | Yang et al. | |

(56) References Cited

U.S. PATENT DOCUMENTS

| | | | | |
|---|---|---|---|---|
| 2009/0261460 | A1 | 10/2009 | Kuan et al. | |
| 2009/0261466 | A1 | 10/2009 | Pagaila et al. | |
| 2009/0273094 | A1 | 11/2009 | Ha et al. | |
| 2009/0309212 | A1 | 12/2009 | Shim et al. | |
| 2010/0193928 | A1 | 8/2010 | Zudock et al. | |
| 2010/0214759 | A1 | 8/2010 | Beddingfield et al. | |
| 2010/0244222 | A1 | 9/2010 | Chi et al. | |
| 2010/0270656 | A1 | 10/2010 | Do et al. | |
| 2010/0327439 | A1 | 12/2010 | Hwang et al. | |
| 2011/0068444 | A1* | 3/2011 | Chi | H01L 21/6835 257/669 |
| 2011/0241193 | A1* | 10/2011 | Ding | H01L 21/568 257/686 |
| 2011/0278736 | A1 | 11/2011 | Lin et al. | |
| 2011/0285005 | A1 | 11/2011 | Lin et al. | |
| 2012/0018897 | A1 | 1/2012 | Park et al. | |
| 2012/0018900 | A1 | 1/2012 | Pagaila et al. | |
| 2012/0038064 | A1 | 2/2012 | Camacho et al. | |
| 2012/0049366 | A1 | 3/2012 | Zeng | |
| 2012/0056329 | A1 | 3/2012 | Pagaila et al. | |
| 2012/0074585 | A1* | 3/2012 | Koo | H01L 21/486 257/774 |
| 2012/0119388 | A1 | 5/2012 | Cho et al. | |
| 2012/0199972 | A1 | 8/2012 | Pagaila et al. | |
| 2012/0217645 | A1 | 8/2012 | Pagaila | |
| 2012/0273947 | A1 | 11/2012 | Mo | |
| 2012/0273960 | A1 | 11/2012 | Park et al. | |
| 2012/0286419 | A1 | 11/2012 | Kwon et al. | |
| 2013/0147041 | A1 | 6/2013 | Chan et al. | |
| 2013/0270682 | A1 | 10/2013 | Hu et al. | |
| 2013/0292850 | A1 | 11/2013 | Chua et al. | |

* cited by examiner

SEMICONDUCTOR DEVICE AND METHOD OF FORMING BUILD-UP INTERCONNECT STRUCTURES OVER A TEMPORARY SUBSTRATE

CLAIM TO DOMESTIC PRIORITY

The present application is a continuation of U.S. patent application Ser. No. 14/624,136, now U.S. Pat. No. 9,818,734, filed Feb. 17, 2015, which claims the benefit of U.S. Provisional Application No. 62/021,135, filed Jul. 5, 2014, and said application Ser. No. 14/624,136 is a continuation-in-part of U.S. patent application Ser. No. 13/832,118, now U.S. Pat. No. 9,385,052, filed Mar. 15, 2013, which claims the benefit of U.S. Provisional Application No. 61/701,366, filed Sep. 14, 2012, which applications are incorporated herein by reference.

CROSS REFERENCE TO RELATED APPLICATIONS

The present application is related to U.S. patent application Ser. No. 13/832,205, filed Mar. 15, 2013, and to U.S. patent application Ser. No. 13/832,449, filed Mar. 13, 2013.

FIELD OF THE INVENTION

The present invention relates in general to semiconductor devices and, more particularly, to a semiconductor device and method of forming build-up interconnect structures over a temporary substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die can be tested to be a known good die (KGD) prior to mounting in a semiconductor package, e.g., a fan-out wafer level chip scale package (Fo-WLCSP). The semiconductor package can still fail due to defects in the build-up interconnect structure, causing loss of the KGD. A semiconductor package size greater than 10 by 10 millimeter (mm) with fine line spacing and multilayer structures is particularly susceptible to defects in the build-up interconnect structure. The larger size Fo-WLCSP is also subject to warpage defects.

One approach to achieving the objectives of greater integration and smaller semiconductor devices is to focus on three dimensional (3D) packaging technologies including package-on-package (PoP). The manufacturing of smaller semiconductor devices relies on implementing improvements to horizontal and vertical electrical interconnection between multiple semiconductor devices on multiple levels, i.e., 3D device integration. A reduced package profile is of particular importance for packaging in the cellular or smart phone industry. However, PoP devices often require laser drilling to form vertical interconnect structures, e.g., through mold vias, which increases equipment costs and requires drilling through an entire package thickness. Laser drilling increases cycle time and decreases manufacturing throughput. Vertical interconnections formed exclusively by a laser drilling process can result in reduced control and design flexibility. Furthermore, conductive materials used for forming through mold vias within a PoP, can be incidentally transferred to semiconductor die during package formation, thereby contaminating the semiconductor die within the package.

Additionally, electrical connection between stacked semiconductor devices often requires top and bottom side redistribution layers (RDLs) to be formed over opposing surfaces of the semiconductor die. In the manufacture of semiconductor packages having top and bottom side RDLs, semiconductor die are mounted to a temporary carrier and an encapsulant is deposited over the semiconductor die and carrier to form a reconstituted wafer. The temporary carrier is then removed. The reconstituted wafer is subject to warpage or bending after removal of the carrier due to differences in the coefficient of thermal expansion (CTE) of the semiconductor die and encapsulant. Warpage of the reconstituted wafer creates defects and handling issues during subsequent manufacturing steps, such as during formation of a interconnect structure over the semiconductor die and encapsulant.

DETAILED DESCRIPTION OF THE DRAWINGS

Figure 1:
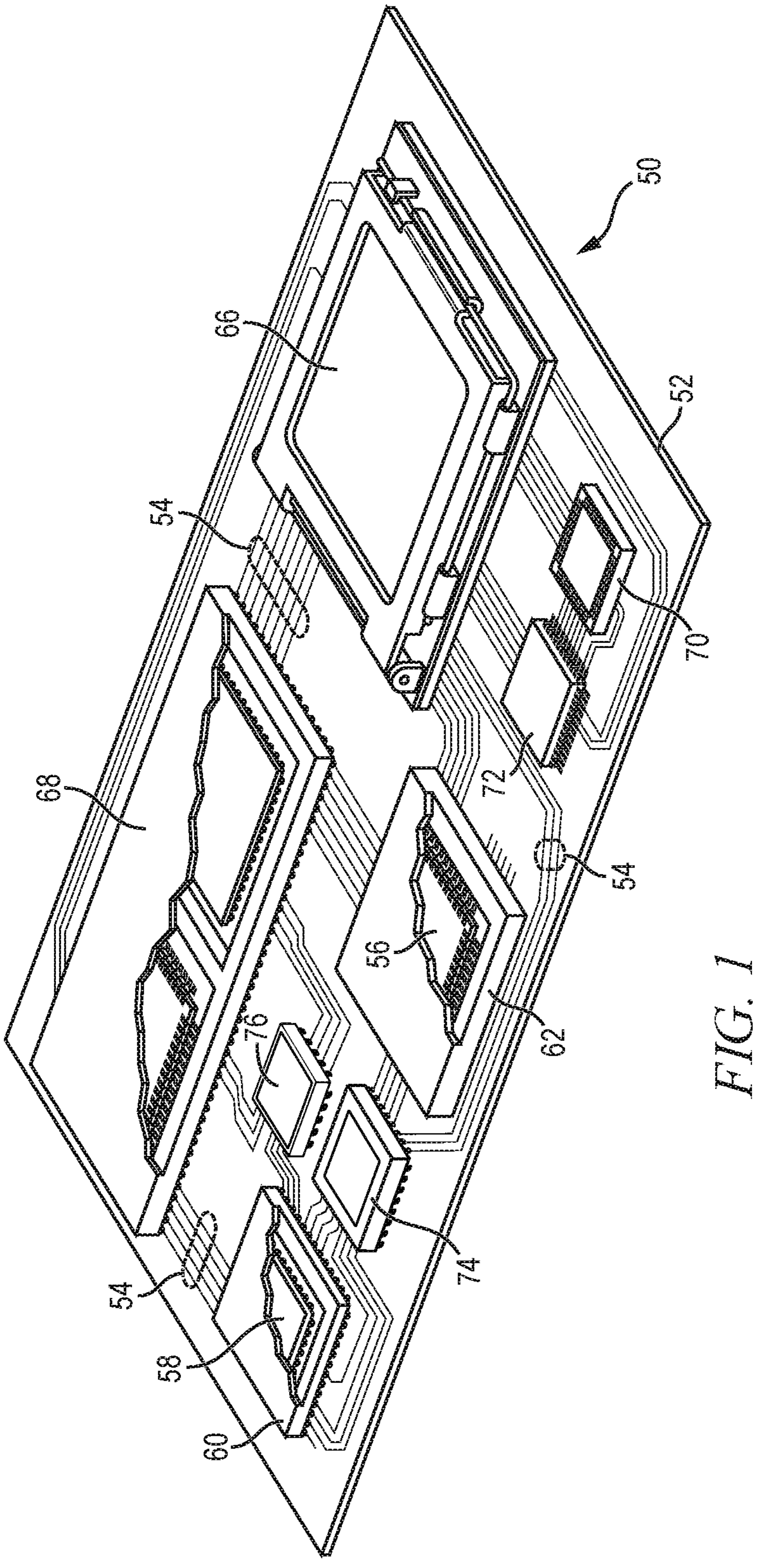
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), MEMS, logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
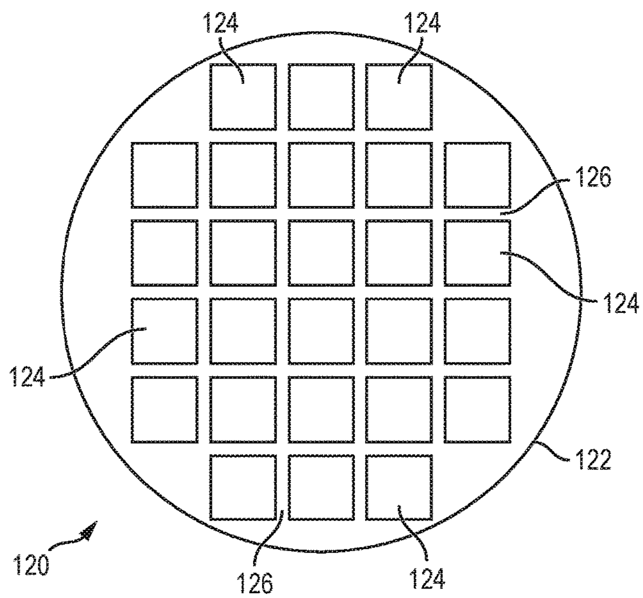
FIGS. 2*a*-2*d* illustrate a semiconductor wafer with a plurality of semiconductor die separated by a saw street.

FIG. 2*a* shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 mm.

Figure 2B:
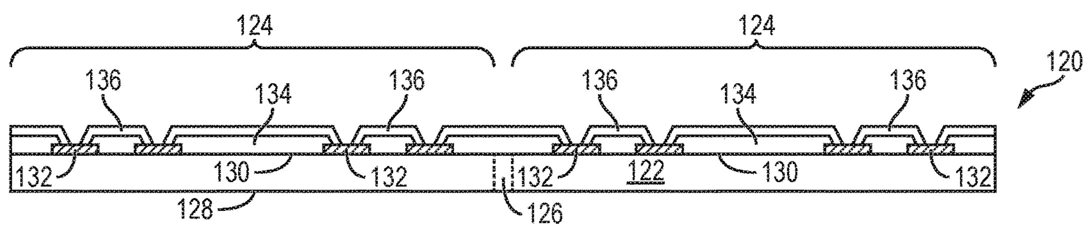

FIG. 2*b* shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. In one embodiment, active surface 130 contains a MEMS, such as an accelerometer, gyroscope, strain gauge, microphone, or other sensor responsive to various external stimuli. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 includes one or more layers of aluminum (Al), copper (Cu), tin (Sn), nickel (Ni), gold (Au), silver (Ag), or other suitable electrically conductive material or combination thereof. Conductive layer 132 operates as contact pads electrically connected to the circuits on active surface 130. Conductive layer 132 is formed as contact pads disposed side-by-side a first distance from the edge of semiconductor die 124, as shown in FIG. 2*b*. Alternatively, conductive layer 132 is formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 134 is removed by laser direct ablation (LDA) or an etching process through a patterned photoresist layer to expose conductive layer 132.

An insulating or passivation layer 136 is formed over conductive layer 132 and insulating layer 134 using PVD, CVD, printing, spin coating, spray coating, sintering, or thermal oxidation. The insulating layer 136 contains one or more layers of SiO2, Si3N4, SiON, Ta2O5, Al2O3, or other material having similar insulating and structural properties. A portion of insulating layer 136 is removed by LDA or etching process through a patterned photoresist layer to expose conductive layer 132.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
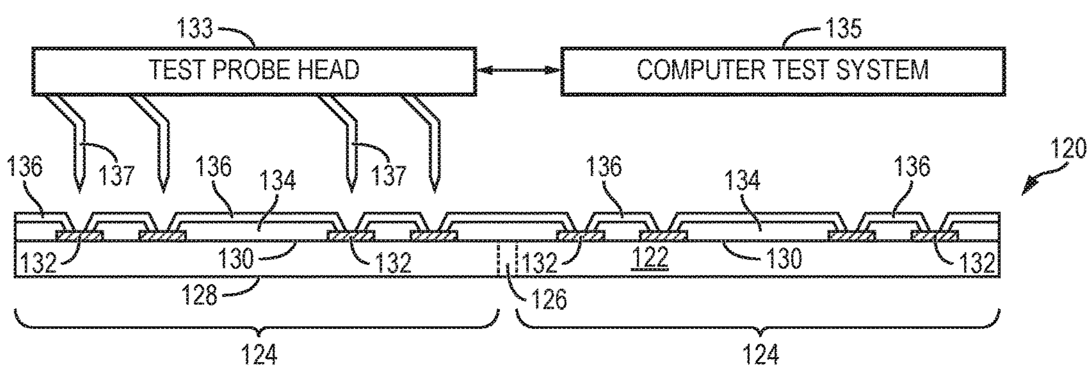

The active and passive components within semiconductor die 124 undergo testing at the wafer level for electrical performance and circuit function. Each semiconductor die 124 is tested for functionality and electrical parameters, as shown in FIG. 2*c*, using a test probe head 133 including a plurality of probes or test leads 137, or other testing device. Probes 137 are used to make electrical contact with nodes or conductive layer 132 on each semiconductor die 124 and provide electrical stimuli to the contact pads. Semiconductor die 124 responds to the electrical stimuli, which is measured by computer test system 135 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as KGD for use in a semiconductor package.

Figure 2D:
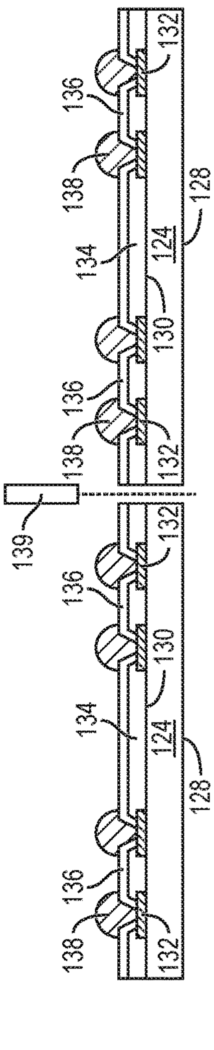

In FIG. 2*d*, an electrically conductive bump material is deposited over conductive layer 132 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above the material's melting point to form balls or bumps 138. In some applications, bumps 138 are reflowed a second time to improve electrical contact to conductive layer 132. In one embodiment, bumps 138 are formed over an under bump metallization (UBM) having a wetting layer, barrier layer, and adhesive layer. The bumps can also be compression bonded or thermocompression bonded to conductive layer 132. Bumps 138 represent one type of interconnect structure that can be formed over conductive layer 132. The interconnect structure can also use stud bump, micro bump, or other electrical interconnect.

Semiconductor wafer 120 is singulated through saw street 126 using a saw blade or laser cutting tool 139 into individual semiconductor die 124. Individual semiconductor die 124 can be inspected and electrically tested for identification of KGD post singulation.

Figure 3A:
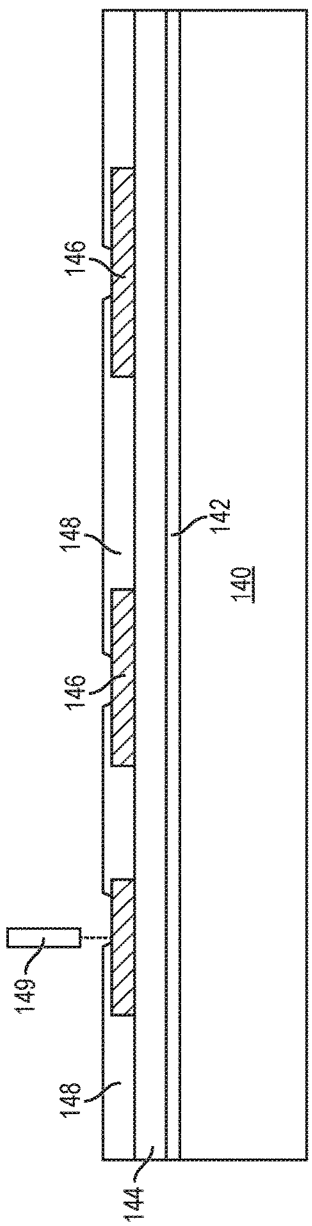
FIGS. 3*a*-3*i* illustrate a process of forming top and bottom build-up interconnect structures over a carrier for testing at interim stages.

FIGS. 3*a*-3*i* illustrate, in relation to FIG. 1, a process of forming top and bottom build-up interconnect structures over a carrier for testing at interim stages. FIG. 3*a* shows a cross-sectional view of a portion of carrier or temporary substrate 140 containing sacrificial or reusable base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or thermal release layer. Carrier 140 can be partially laser grooved for stress relief in subsequent build-up interconnect structure and encapsulation processes. Carrier 140 has sufficient size to accommodate multiple semiconductor die during build-up interconnect formation.

An insulating or passivation layer 144 is formed over interface layer 142 of carrier 140 using PVD, CVD, printing, lamination, spin coating, spray coating, sintering or thermal oxidation. The insulating layer 144 contains one or more layers of SiO2, Si3N4, SiON, Ta2O5, Al2O3, hafnium oxide (HfO2), benzocyclobutene (BCB), polyimide (PI), polybenzoxazoles (PBO), or other material having similar structural and dielectric properties. In one embodiment, insulating layer 144 includes a glass cloth, glass cross, filler, or fiber, such as E-glass cloth, T-glass cloth, Al2O3, or silica filler, for enhanced bending strength.

An electrically conductive layer or RDL 146 is formed over insulating layer 144 using a patterning and metal deposition process such as sputtering, electrolytic plating, electroless plating, or Cu foil lamination. Conductive layer 146 can be one or more layers of Al, Cu, Sn, Ni, Au, Ag, or other suitable electrically conductive material. Alternatively, insulating layer 144 and conductive layer 146, with an optional Cu layer formed under insulating layer 144, together provide a resin coat copper (RCC) tape or prepreg sheet laminated on carrier 140. Conductive layer 146 is patterned with optional etch-thinning process before patterning.

An insulating or passivation layer 148 is formed over insulating layer 144 and conductive layer 146 using PVD, CVD, printing, lamination, spin coating, spray coating, sintering or thermal oxidation. The insulating layer 148 contains one or more layers of SiO2, Si3N4, SiON, Ta2O5, Al2O3, polymer dielectric resist with or without fillers or fibers, or other material having similar insulating and structural properties. A portion of insulating layer 148 is removed by LDA using laser 149 to expose conductive layer 146. Alternatively, a portion of insulating layer 148 is removed by an etching process through a patterned photoresist layer to expose conductive layer 146. In one embodiment, insulating layer 148 includes a glass cloth, glass cross, filler, or fiber, such as E-glass cloth, T-glass cloth, Al2O3, or silica filler, for enhanced bending strength.

Figure 3B:
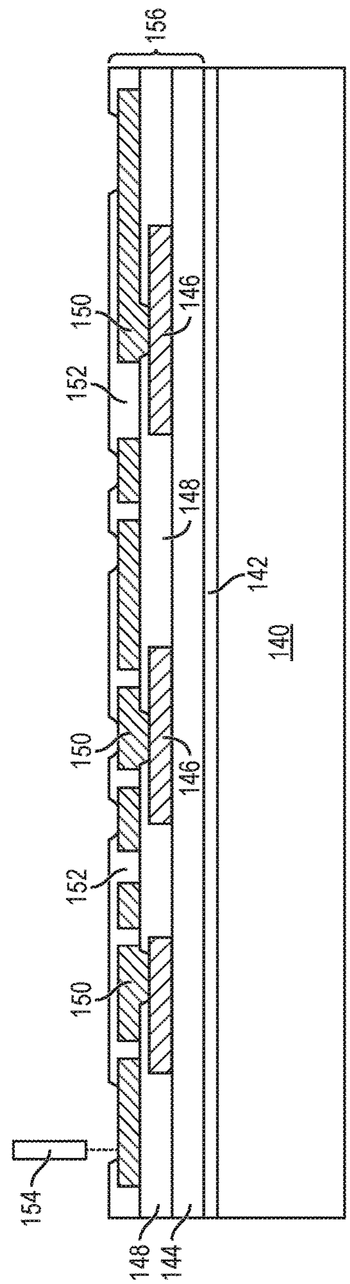

In FIG. 3*b*, an electrically conductive layer or RDL 150 is formed over conductive layer 146 and insulating layer 148 using a patterning and metal deposition process such as sputtering, electrolytic plating, and electroless plating. Conductive layer 150 can be one or more layers of Al, Cu, Sn, Ni, Au, Ag, or other suitable electrically conductive material. One portion of conductive layer 150 is electrically connected to conductive layer 146. Other portions of conductive layer 150 can be electrically common or electrically isolated depending on the design and function of later mounted semiconductor die.

An insulating or passivation layer 152 is formed over insulating layer 148 and conductive layer 150 using PVD, CVD, printing, lamination, spin coating, spray coating, sintering or thermal oxidation. The insulating layer 152 contains one or more layers of SiO2, Si3N4, SiON, Ta2O5, Al2O3, polymer dielectric resist with or without fillers or fibers, or other material having similar insulating and structural properties. A portion of insulating layer 152 is removed by LDA using laser 154 to expose conductive layer 150. Alternatively, a portion of insulating layer 152 is removed by an etching process through a patterned photoresist layer to expose conductive layer 150.

The combination of insulating layers 144, 148, and 152 and conductive layers 146 and 150 constitutes a build-up interconnect structure 156. Build-up interconnect structure 156 may include as few as one RDL or conductive layer, such as conductive layer 146, and one insulating layer, such as insulating layer 148. Additional insulating layers and RDLs can be formed over insulating layer 152 to provide additional vertical and horizontal electrical connectivity across the package according to the design and functionality of later mounted semiconductor devices. Additional insulating and metal layers may also be formed within build-up interconnect structure 156 to provide grounding and electromagnetic interference (EMI) shielding layers within the semiconductor package. The build-up interconnect structure 156 is inspected and tested to be known good at the wafer level by open/short probe or auto-scope inspection at the present interim stage, i.e., prior to mounting semiconductor die 124. Leakage can be tested at a sampling location.

Figure 3C:
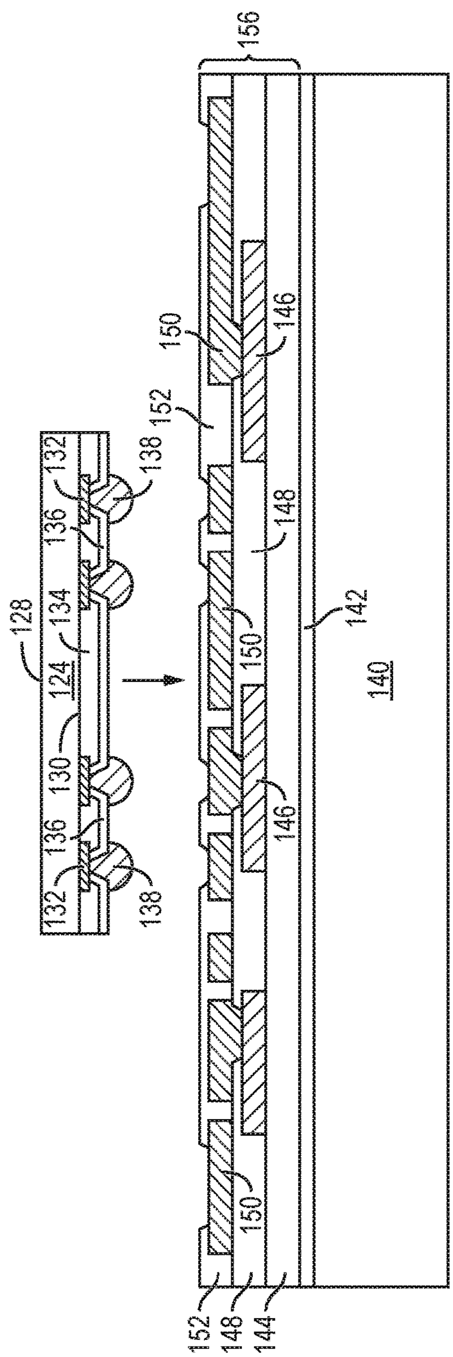
Figure 3D:
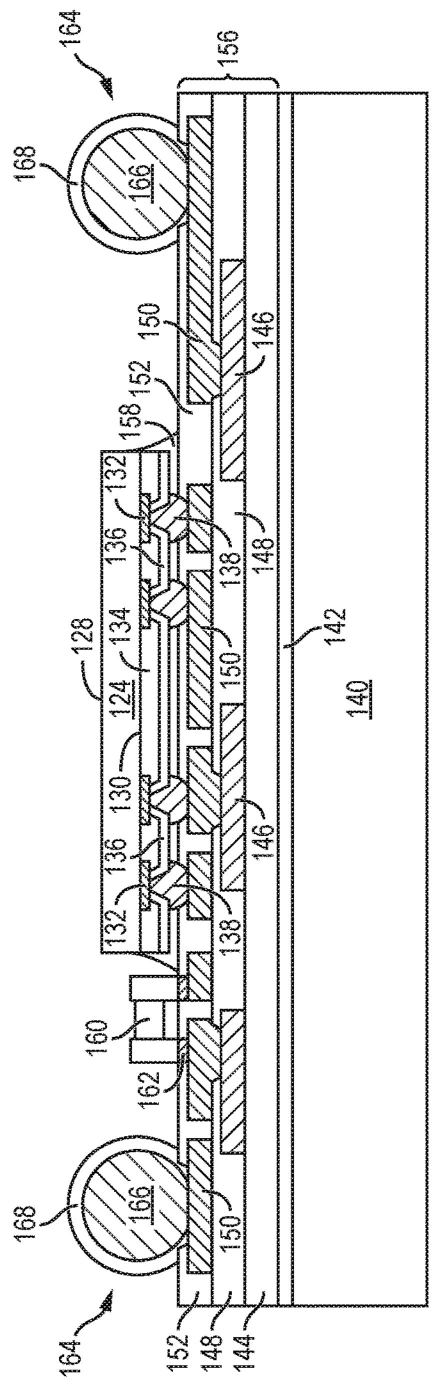

In FIG. 3*c*, semiconductor die 124 from FIG. 2*d* is mounted to build-up interconnect structure 156 using, for example, a pick and place operation with bumps 138 oriented toward the build-up interconnect structure. Bumps 138 are metallurgically and electrically coupled to conductive layer 150. FIG. 3*d* shows semiconductor die 124 mounted to build-up interconnect structure 156 as a reconstituted wafer. Semiconductor die 124 is a KGD having been tested prior to mounting to semiconductor die 124 build-up interconnect structure 156. An underfill material 158, such as an epoxy resin with fillers, is deposited between semiconductor die 124 and build-up interconnect structure 156. Alternatively, underfill may be applied as non-conductive paste (NCP) or non-conductive film (NCF) on semiconductor die 124 before singulation of the die. Discrete semiconductor device 160 is also metallurgically and electrically coupled to conductive layer 150 using conductive paste 162. Discrete semiconductor device 160 can be an inductor, capacitor, resistor, transistor, or diode.

A 3D interconnect structure 164 is formed over conductive layer 150 by ball mounting process with optional solder paste. The 3D interconnect structure 164 includes an inner conductive alloy bump 166, such as Cu or Al, and protective layer 168, such as solder alloy SAC305, Cu, polymer, or plastic. Alternatively, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps. In some applications, the bumps are reflowed a second time to improve electrical contact to conductive layer 150. The bumps can also be compression bonded or thermocompression bonded to conductive layer 150. Alternatively, 3D interconnect structure 164 is formed over conductive layer 150 prior to mounting semiconductor die 124.

Figure 3E:
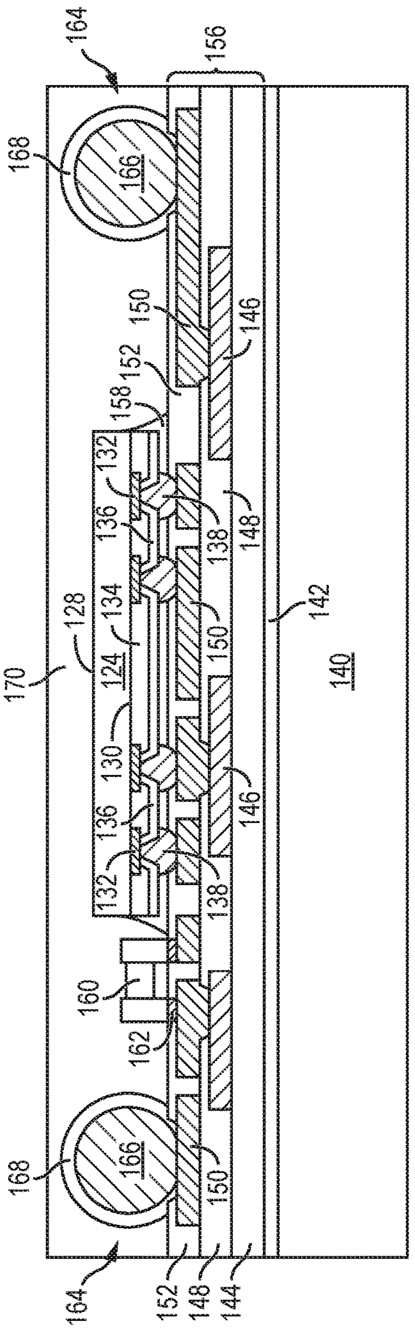

In FIG. 3*e*, an encapsulant or molding compound 170 is deposited over semiconductor die 124, build-up interconnect structure 156, and 3D interconnect structure 164 using a paste printing, compressive molding, transfer molding, liquid encapsulant molding, vacuum lamination, spin coating, or other suitable applicator. Encapsulant 170 can be polymer composite material, such as epoxy resin with filler, epoxy acrylate with filler, or polymer with proper filler. Encapsulant 170 is non-conductive and environmentally protects the semiconductor device from external elements and contaminants.

Figure 3F:
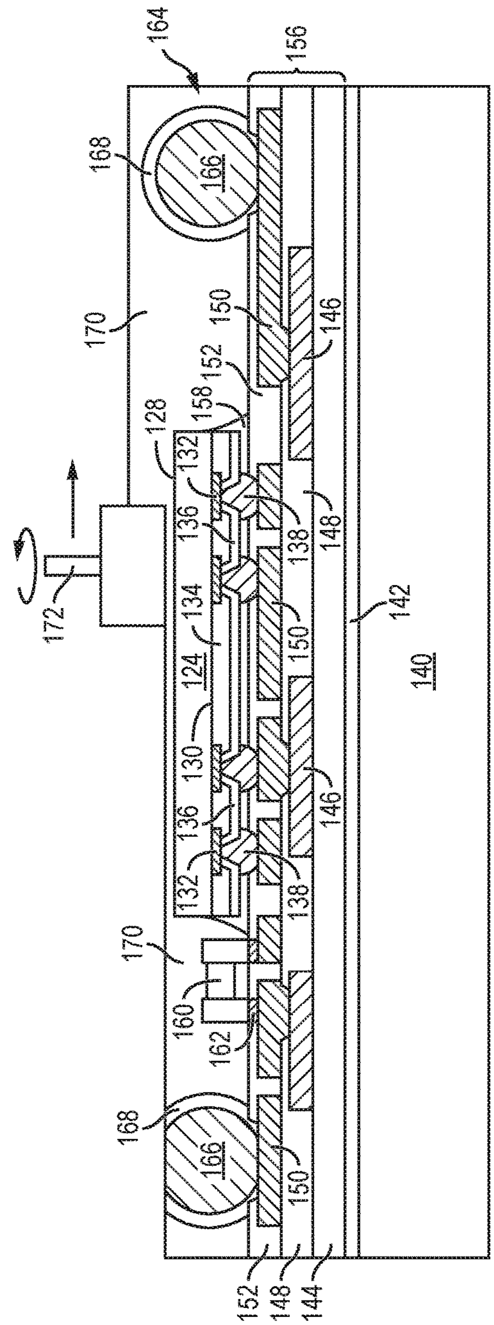
Figure 3G:
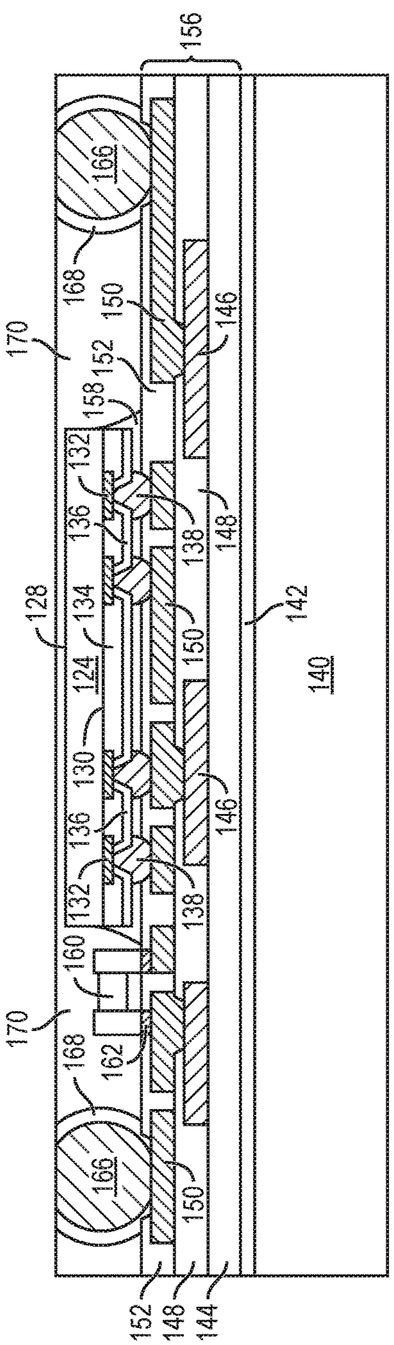

In FIG. 3*f*, a portion of encapsulant 170 in removed in a grinding operation with grinder 172 to planarize the surface and reduce a thickness of the encapsulant and to expose inner conductive bump 166. A chemical etch or CMP process can also be used to remove mechanical damage resulting from the grinding operation and planarize encapsulant 170. Alternatively, a portion of encapsulant 170 in removed by LDA or drilling to expose inner conductive bump 166. FIG. 3*g* shows the assembly after the grinding operation. Back surface 128 of semiconductor die 124 remains covered by encapsulant 170 after the grinding operation. In one embodiment, the backgrinding operation exposes back surface 128 of semiconductor die 128 for increased thermal performance.

Figure 3H:
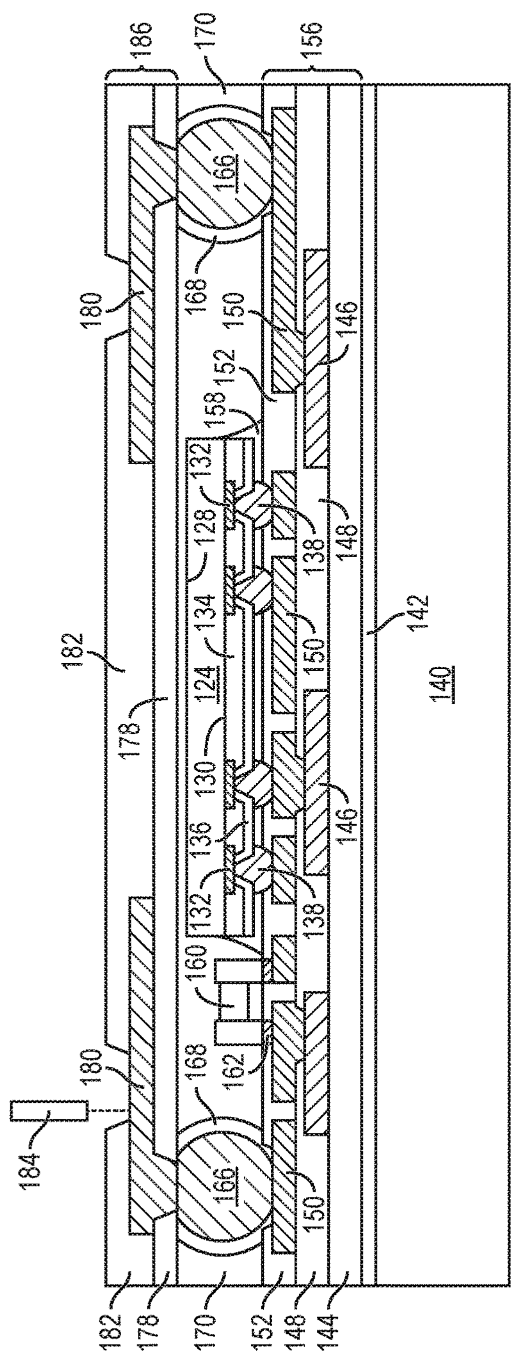

In FIG. 3*h*, an optional insulating or passivation layer 178 is formed over encapsulant 170 and 3D interconnect structure 164 using PVD, CVD, printing, lamination, spin coating, spray coating, sintering or thermal oxidation. The optional insulating layer 178 contains one or more layers of SiO2, Si3N4, SiON, Ta2O5, Al2O3, polymer dielectric resist with or without fillers or fibers, or other material having similar insulating and structural properties. A portion of insulating layer 178 is removed by LDA or etching process through a patterned photoresist layer to expose inner conductive bump 166.

An electrically conductive layer or RDL 180 is formed over insulating layer 178 and inner conductive bump 166 using a patterning and metal deposition process such as sputtering, electrolytic plating, and electroless plating. Conductive layer 180 can be one or more layers of Al, Cu, Sn, Ni, Au, Ag, or other suitable electrically conductive material. One portion of conductive layer 180 is electrically connected to inner conductive bump 166. Other portions of conductive layer 180 can be electrically common or electrically isolated depending on the design and function of semiconductor die 124. In one embodiment, a portion of conductive layer 180 extends over back surface 128 of semiconductor die 124 and provides an EMI shield or heat sink over semiconductor die 124.

An insulating or passivation layer 182 is formed over insulating layer 178 and conductive layer 180 using PVD, CVD, printing, lamination, spin coating, spray coating, sintering or thermal oxidation. The insulating layer 182 contains one or more layers of SiO2, Si3N4, SiON, Ta2O5, Al2O3, polymer dielectric resist with or without fillers or fibers, or other material having similar insulating and structural properties. In one embodiment, insulating layer 182 includes an embedded glass cloth, glass cross, filler, or fiber, such as E-glass cloth, T-glass cloth, Al2O3, or silica filler, for enhanced bending strength. A portion of insulating layer 182 is removed by LDA using laser 184 to expose conductive layer 180. Alternatively, a portion of insulating layer 182 is removed by an etching process through a patterned photoresist layer to expose conductive layer 180.

The combination of insulating layers 178 and 182 and conductive layer 180 constitutes a build-up interconnect structure 186. The build-up interconnect structures 186 is formed over carrier 140 but at a different time than build-up interconnect structure 156, i.e., after depositing encapsulant 170. The build-up interconnect structure 186 is inspected and tested to be known good at an interim stage, i.e., prior to additional device integration, see FIG. 9. Build-up interconnect structure 186 may include as few as one RDL or conductive layer, such as conductive layer 180, and one insulating layer, such as insulating layer 182. Additional insulating layers and RDLs can be formed over insulating layer 182 to provide additional vertical and horizontal electrical connectivity across the package according to the design and functionality of later mounted semiconductor devices. Additional insulating and metal layers may also be formed within build-up interconnect structure 186 to provide grounding and EMI shielding layers within the semiconductor package.

Figure 3I:
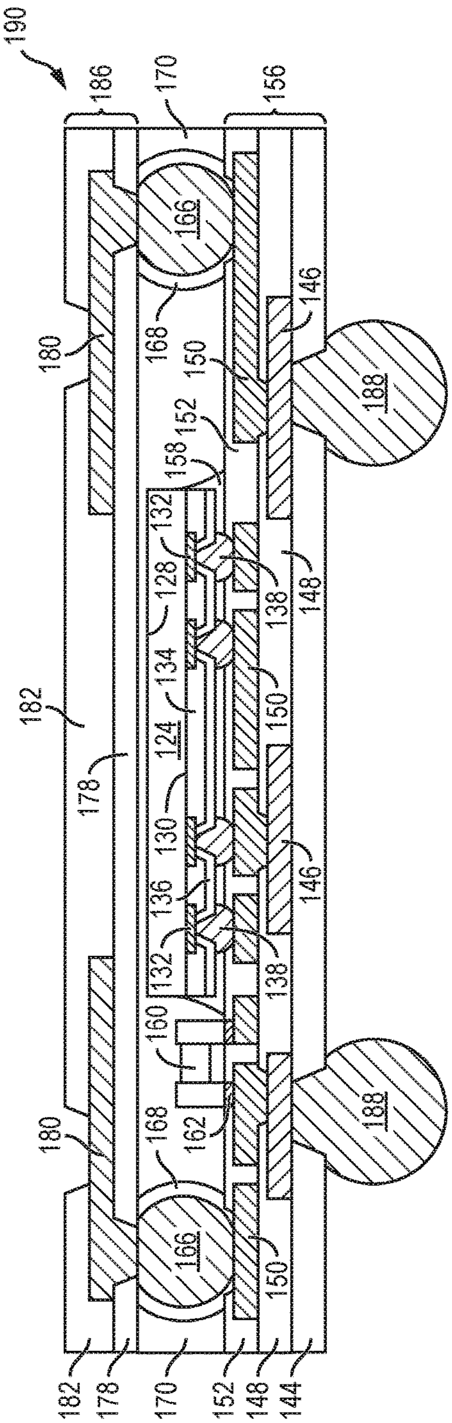

In FIG. 3*i*, carrier 140 and interface layer 142 are removed by chemical etching, mechanical peeling, chemical mechanical planarization (CMP), mechanical grinding, thermal release, UV light, laser scanning, or wet stripping to expose insulating layer 144. A backgrinding tape or support carrier can be applied to insulating layer 182 prior to removing carrier 140. A portion of insulating layer 144 is removed by LDA or etching process through a patterned photoresist layer to expose conductive layer 146.

An electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 188. In some applications, bumps 188 are reflowed a second time to improve electrical contact to conductive layer 146. In one embodiment, bumps 188 are formed over a UBM having a wetting layer, barrier layer, and adhesive layer. The bumps can also be compression bonded or thermocompression bonded to conductive layer 146. Bumps 188 represent one type of interconnect structure that can be formed over conductive layer 146. The interconnect structure can also use bond wires, conductive paste, stud bump, micro bump, or other electrical interconnect.

The reconstituted wafer or panel is singulated into individual Fo-WLCSP 190 units. Semiconductor die 124 embedded in Fo-WLCSP 190 is electrically connected through bumps 138 to build-up interconnect structure 156 and bumps 188. The build-up interconnect structure 156 is inspected and tested to be known good by open/short probe or auto-scope inspection at an interim stage, i.e., prior to mounting semiconductor die 124. Semiconductor die 124 is further electrically connected through inner conductive bump 166 to build-up interconnect structure 186. The build-up interconnect structures 156 and 186 are formed over carrier 140 at different times with respect to opposite surfaces of encapsulant 170. The build-up interconnect structures 186 is inspected and tested to be known good before additional device integration.

Figure 4:
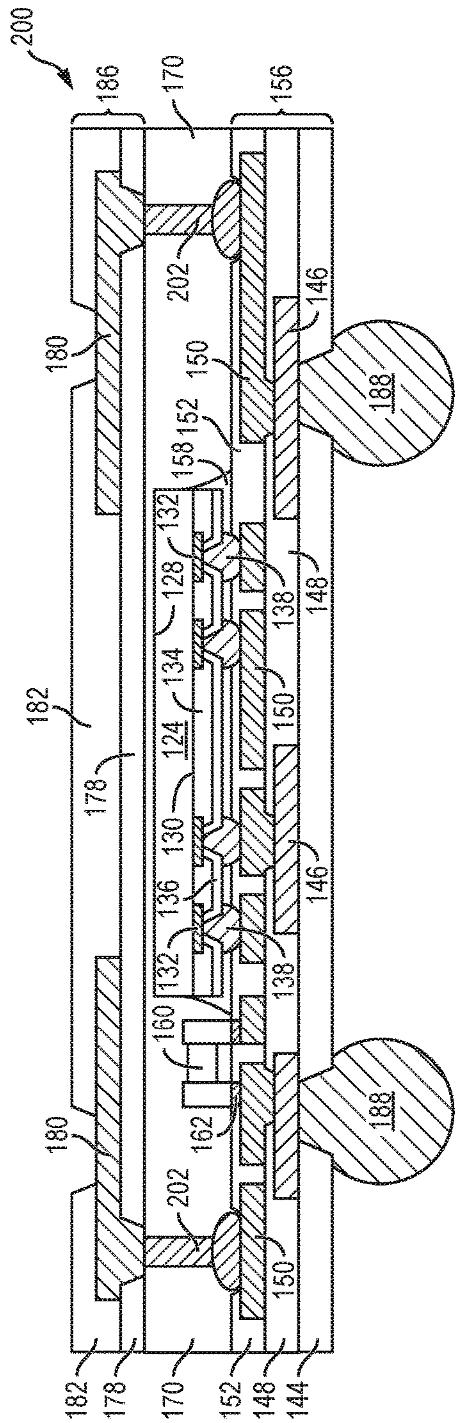
FIG. 4 illustrates a Fo-WLCSP with a stud bump disposed between the top and bottom build-up interconnect structures.

FIG. 4 shows an embodiment of Fo-WLCSP 200, similar to FIG. 3*i*, with embedded semiconductor die 124 and stud bumps 202 disposed within encapsulant 170 for vertical interconnect between build-up interconnect structure 156 and build-up interconnect structure 186.

Figure 5A:
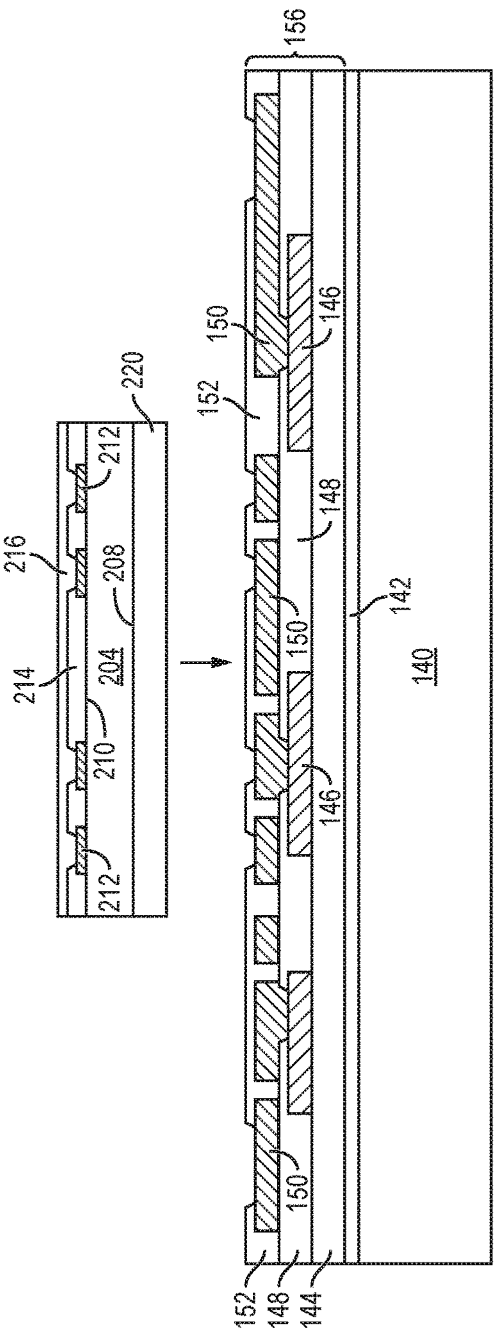
FIGS. 5*a*-5*f* illustrate another process of forming top and bottom build-up interconnect structures over a carrier for testing at interim stages.

FIGS. 5*a*-5*f* illustrate another process of forming top and bottom build-up interconnect structures over a carrier for testing at interim stages. Continuing from FIG. 3*b*, FIG. 5*a* shows a semiconductor die 204, as singulated from a semiconductor wafer similar to FIG. 2*a*, disposed over build-up interconnect structure 156. Semiconductor die 204 has a back surface 208 and active surface 210 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 210 to implement analog circuits or digital circuits, such as DSP, ASIC, MEMS, memory, or other signal processing circuit. In one embodiment, active surface 210 contains a MEMS, such as an accelerometer, gyroscope, strain gauge, microphone, or other sensor responsive to various external stimuli. Semiconductor die 204 may also contain IPDs, such as inductors, capacitors, and resistors, for RF signal processing. In one embodiment, conductive layers 146 or 150 may be designed to function as a grounding layer or as an EMI shielding layer within the semiconductor package.

An electrically conductive layer 212 is formed over active surface 210 using PVD, CVD, electrolytic plating, electroless plating process, or other suitable metal deposition process. Conductive layer 212 can be one or more layers of Al, Cu, Sn, Ni, Au, Ag, or other suitable electrically conductive material. Conductive layer 212 operates as contact pads electrically connected to the circuits on active surface 210.

An insulating or passivation layer 214 is formed over active surface 210 and conductive layer 212 using PVD, CVD, printing, lamination, spin coating, spray coating, sintering or thermal oxidation. The insulating layer 214 contains one or more layers of $SiO_2$, $Si_3N_4$, SiON, $Ta_2O_5$, $Al_2O_3$, or other material having similar insulating and structural properties. A portion of insulating layer 214 is removed by LDA to expose conductive layer 212.

An insulating or passivation layer 216 is formed over insulating layer 214 and conductive layer 212 using PVD, CVD, printing, lamination, spin coating, spray coating, sintering or thermal oxidation. The insulating layer 216 contains one or more layers of $SiO_2$, $Si_3N_4$, SiON, $Ta_2O_5$, $Al_2O_3$, or other material having similar insulating and structural properties. The insulating layer 216 protects semiconductor die 204. Alternatively, insulating layers 214 and 216 can be the same layer with thickness greater than 15 micrometers (μm).

Figure 5B:
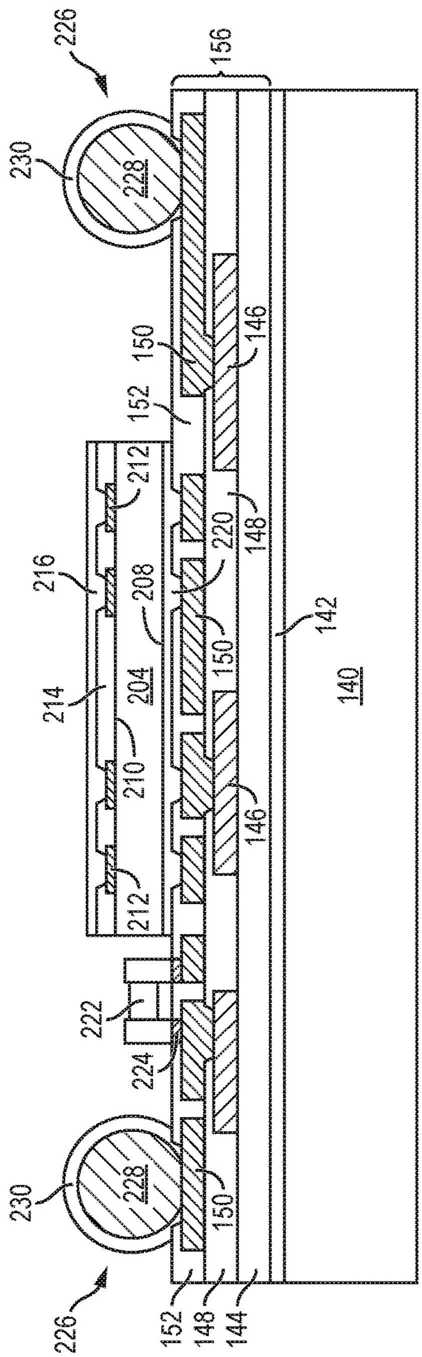

Semiconductor die 204 with die attach film (DAF) 220 is mounted to build-up interconnect structure 156 using a pick and place operation with back surface 208 oriented toward the build-up interconnect structure. FIG. 5*b* shows semiconductor die 204 mounted to build-up interconnect structure 156 with DAF 220 as a reconstituted wafer. Semiconductor die 204 is a KGD having been tested prior to mounting semiconductor die 204 to build-up interconnect structure 156. Discrete semiconductor device 222 is also metallurgically and electrically coupled to conductive layer 150 using conductive paste 224. Discrete semiconductor device 222 can be an inductor, capacitor, resistor, transistor, or diode.

A 3D interconnect structure 226 is formed over conductive layer 150. The 3D interconnect structure 226 includes an inner conductive alloy bump 228, such as Cu or Al, and protective layer 230, such as solder alloy SAC305, Cu, polymer, or plastic. Alternatively, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps. In some applications, the bumps are reflowed a second time to improve electrical contact to conductive layer 150. The bumps can also be compression bonded or thermocompression bonded to conductive layer 150. Alternatively, 3D interconnect structure 226 is formed prior to mounting semiconductor die 204.

Figure 5C:
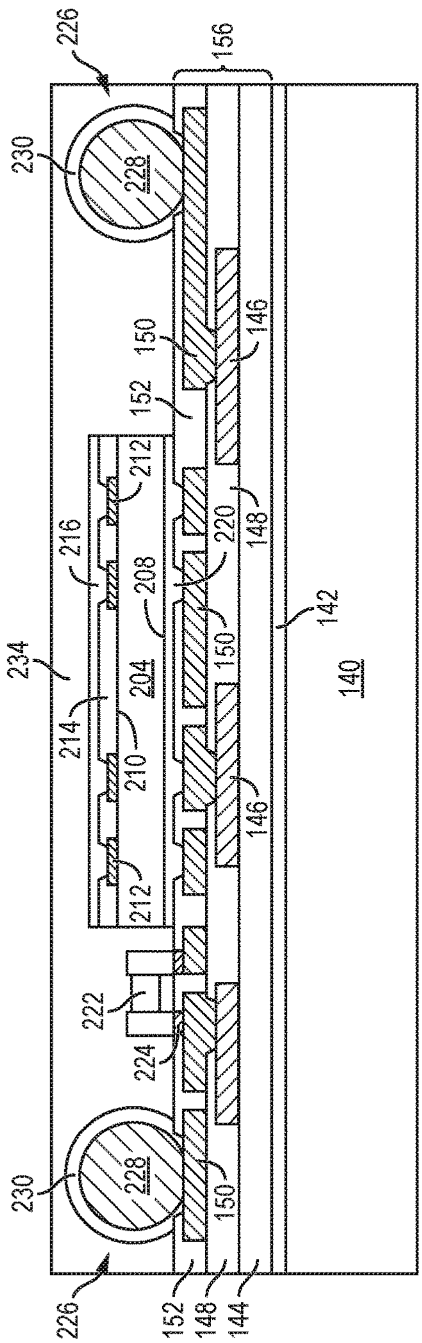

In FIG. 5*c*, an encapsulant or molding compound 234 is deposited over semiconductor die 204, build-up interconnect structure 156, and 3D interconnect structure 226 using a paste printing, compressive molding, transfer molding, liquid encapsulant molding, vacuum lamination, spin coating, or other suitable applicator. Encapsulant 234 can be polymer composite material, such as epoxy resin with filler, epoxy acrylate with filler, or polymer with proper filler. Encapsulant 234 is non-conductive and environmentally protects the semiconductor device from external elements and contaminants.

Figure 5D:
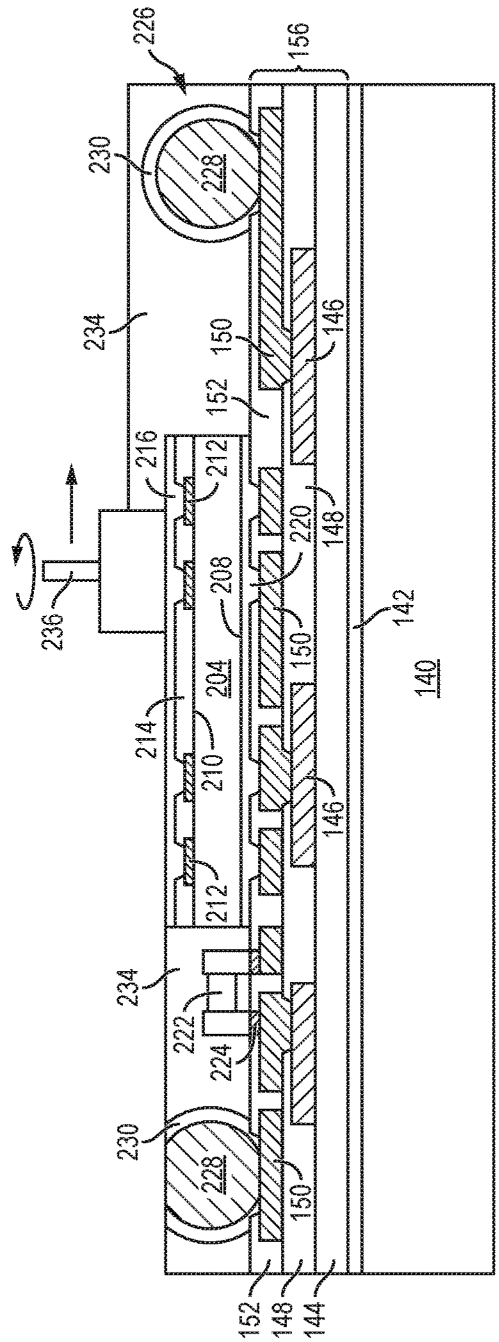

In FIG. 5*d*, a portion of encapsulant 234 is removed in a grinding operation with grinder 236 to planarize the surface and reduce a thickness of the encapsulant and to expose insulating layer 216 and inner conductive bump 228. A chemical etch or CMP process can also be used to remove mechanical damage resulting from the grinding operation and planarize encapsulant 234. Alternatively, a portion of encapsulant 234 in removed by LDA or drilling to expose inner conductive bump 228. The insulating layer 216 is stripped by wet chemical stripping or LDA to expose conductive layer 212.

Figure 5E:
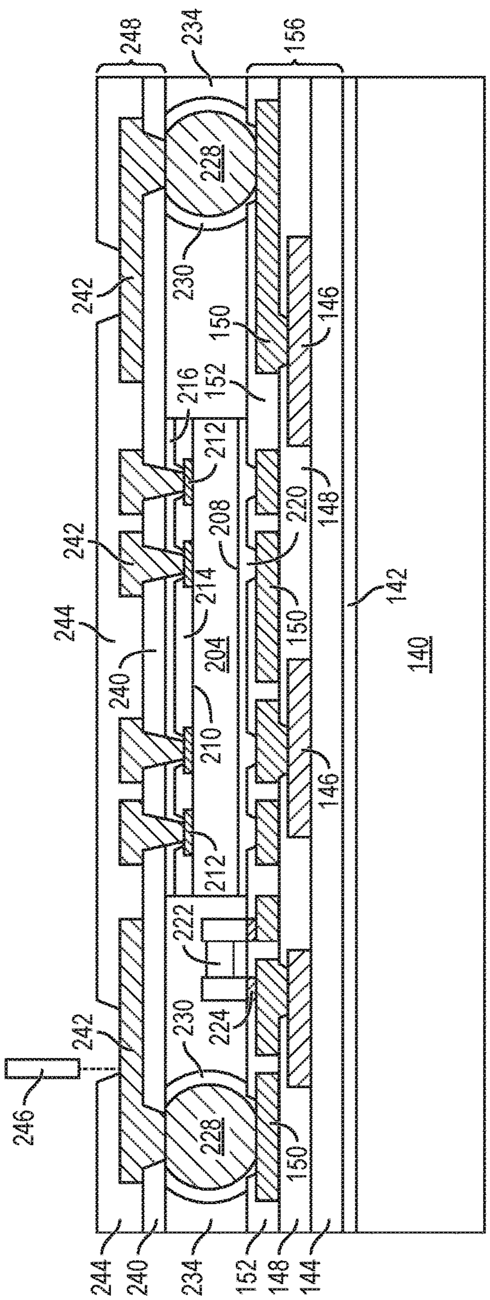

In FIG. 5*e*, an optional insulating or passivation layer 240 is formed over encapsulant 234 and 3D interconnect structure 226 using PVD, CVD, printing, lamination, spin coating, spray coating, sintering or thermal oxidation. The optional insulating layer 240 contains one or more layers of SiO2, Si3N4, SiON, Ta2O5, Al2O3, polymer dielectric resist with or without fillers or fibers, or other material having similar insulating and structural properties. A portion of insulating layers 216 and 240 is removed by LDA or etching process through a patterned photoresist layer to expose conductive layer 212 and inner conductive bump 228.

An electrically conductive layer or RDL 242 is formed over insulating layer 240 and inner conductive bump 228 using a patterning and metal deposition process such as sputtering, electrolytic plating, and electroless plating. Conductive layer 242 can be one or more layers of Al, Cu, Sn, Ni, Au, Ag, or other suitable electrically conductive material. One portion of conductive layer 242 is electrically connected to inner conductive bump 228. Another portion of conductive layer 242 is electrically connected to conductive layer 212. Other portions of conductive layer 242 can be electrically common or electrically isolated depending on the design and function of semiconductor die 204.

An insulating or passivation layer 244 is formed over insulating layer 240 and conductive layer 242 using PVD, CVD, printing, lamination, spin coating, spray coating, sintering or thermal oxidation. The insulating layer 244 contains one or more layers of SiO2, Si3N4, SiON, Ta2O5, Al2O3, or other material having similar insulating and structural properties. In one embodiment, insulating layer 244 includes an embedded glass cloth, glass cross, filler, or fiber for enhanced bending strength. A portion of insulating layer 244 is removed by LDA using laser 246 to expose conductive layer 242. Alternatively, a portion of insulating layer 244 is removed by an etching process through a patterned photoresist layer to expose conductive layer 242.

The combination of insulating layers 240 and 244, and conductive layer 242 constitutes a build-up interconnect structure 248. The build-up interconnect structures 248 is formed over carrier 140, but at a different time than build-up interconnect structure 156, i.e., after depositing encapsulant 234. The build-up interconnect structure 248 is inspected and tested to be known good at an interim stage, i.e., prior to additional device integration, see FIG. 9. Build-up interconnect structure 248 may include as few as one RDL or conductive layer, such as conductive layer 242, and one insulating layer, such as insulating layer 244. Additional insulating layers and RDLs can be formed over insulating layer 244 to provide additional vertical and horizontal electrical connectivity across the package according to the design and functionality of later mounted semiconductor devices. Additional insulating and metal layers may also be formed within build-up interconnect structure 248 to provide grounding and EMI shielding layers within the semiconductor package.

Figure 5F:
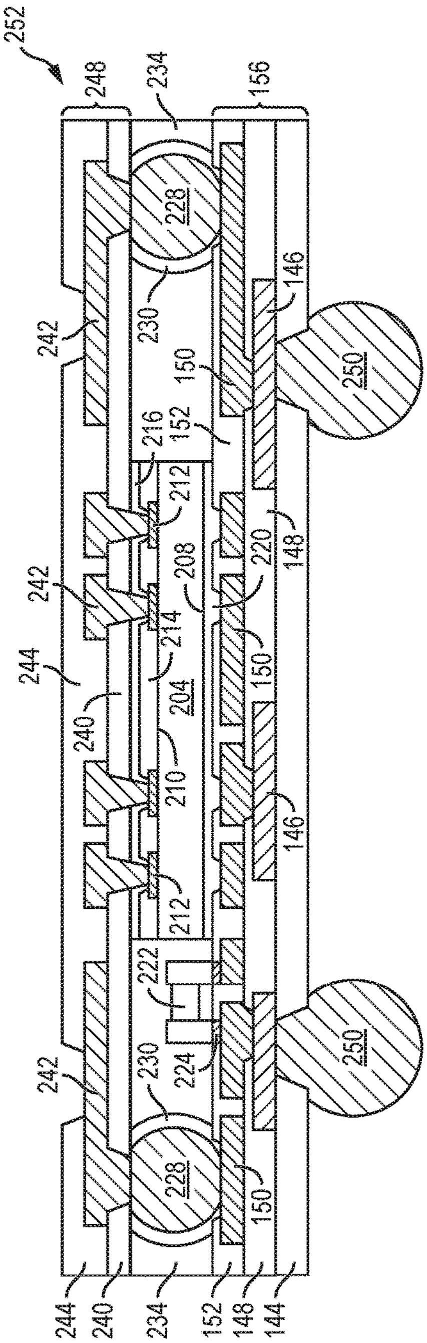

In FIG. 5*f*, carrier 140 and interface layer 142 are removed by chemical etching, mechanical peeling, CMP, mechanical grinding, thermal release, UV light, laser scanning, or wet stripping to expose insulating layer 144. A backgrinding tape or support carrier can be applied to insulating layer 244 prior to removing carrier 140. A portion of insulating layer 144 is removed by LDA or etching process through a patterned photoresist layer to expose conductive layer 146.

An electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 250. In some applications, bumps 250 are reflowed a second time to improve electrical contact to conductive layer 146. In one embodiment, bumps 250 are formed over a UBM having a wetting layer, barrier layer, and adhesive layer. The bumps can also be compression bonded or thermocompression bonded to conductive layer 146. Bumps 250 represent one type of interconnect structure that can be formed over conductive layer 146. The interconnect structure can also use bond wires, conductive paste, stud bump, micro bump, or other electrical interconnect.

The reconstituted wafer or panel is singulated into individual Fo-WLCSP 252 units. Semiconductor die 204 embedded in Fo-WLCSP 252 is electrically connected to build-up interconnect structure 248. The build-up interconnect structures 248 are inspected and tested to be known good before additional device integration. Semiconductor die 204 is further electrically connected through inner conductive bump 228 to build-up interconnect structure 156. The build-up interconnect structures 156 and 248 are formed over carrier 140 at different times with respect to opposite surfaces of encapsulant 234. The build-up interconnect structure 156 is inspected and tested to be known good by open/short probe or auto-scope inspection at an interim stage, i.e., prior to mounting semiconductor die 204.

Figure 6A:
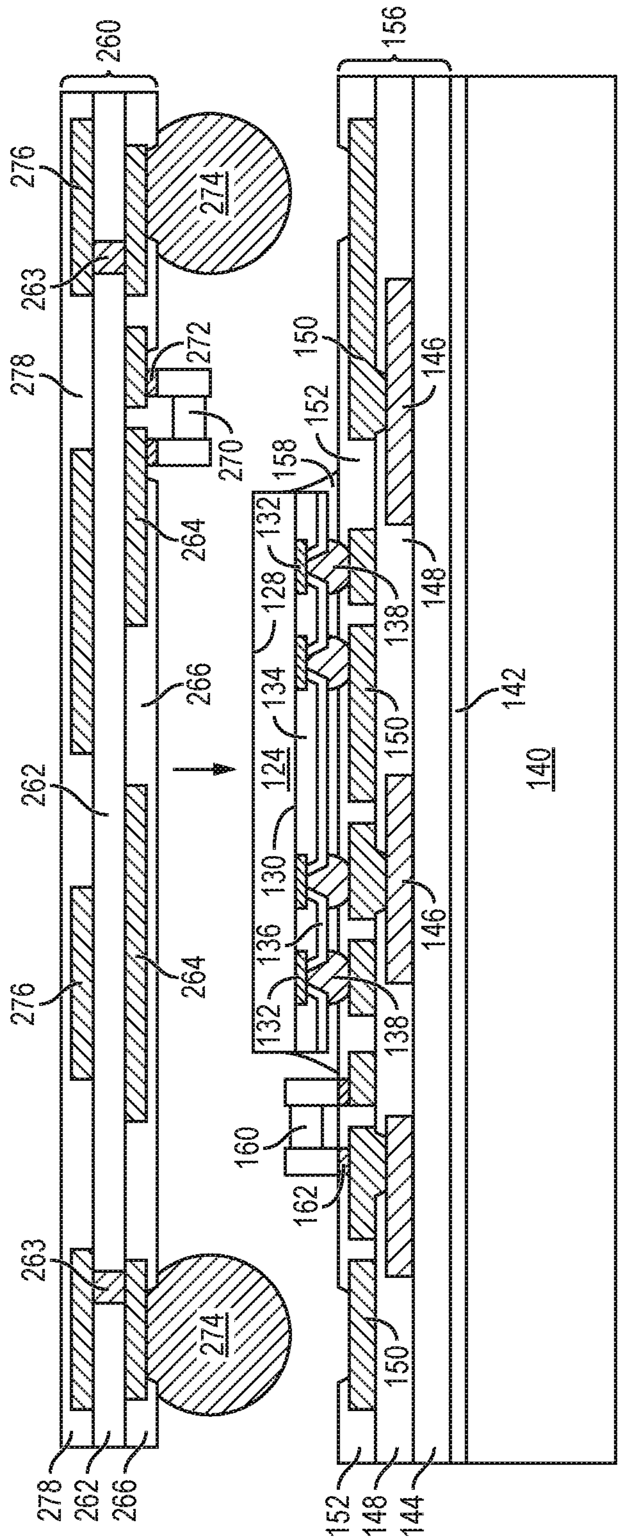
FIGS. 6*a*-6*d* illustrate a first build-up interconnect structure mounted to a second build-up interconnect structure.

FIGS. 6*a*-6*d* illustrate another embodiment with a first build-up interconnect structure mounted to a second build-up interconnect structure. Continuing from FIG. 3*c*, FIG. 6*a* shows a build-up interconnect structure 260 including a core laminate substrate 262. A plurality of through hole vias is formed through substrate 262 using laser drilling, mechanical drilling, or deep reactive ion etching (DRIE). The vias are filled with Al, Cu, Sn, Ni, Au, Ag, titanium (Ti), tungsten (W), or other suitable electrically conductive material using electrolytic plating, electroless plating process, or other suitable deposition process to form conductive vias 263. Alternatively, Cu is deposited on the sidewalls of the through hole vias by electroless and electrolytic Cu plating, and the vias are filled with Cu paste or resin having fillers.

An electrically conductive layer or RDL 264 is formed over substrate 262 and conductive vias 263 using a patterning and metal deposition process such as sputtering, electrolytic plating, and electroless plating. Conductive layer 264 can be one or more layers of Al, Cu, Sn, Ni, Au, Ag, or other suitable electrically conductive material. One portion of conductive layer 264 is electrically connected to conductive vias 263. Other portions of conductive layer 264 can be electrically common or electrically isolated depending on the design and function of semiconductor die 124 or 204.

An insulating or passivation layer 266 is formed over substrate 262 and conductive layer 264 using PVD, CVD, printing, lamination, spin coating, spray coating, sintering or thermal oxidation. The insulating layer 266 contains one or more layers of $SiO_2$, $Si_3N_4$, SiON, $Ta_2O_5$, $Al_2O_3$, polymer dielectric resist with or without fillers or fibers, or other material having similar insulating and structural properties. A portion of insulating layer 266 is removed by LDA or etching process through a patterned photoresist layer to expose conductive layer 264. Discrete semiconductor device 270 is metallurgically and electrically coupled to conductive layer 264 using conductive paste 272. Discrete semiconductor device 270 can be an inductor, capacitor, resistor, transistor, or diode.

An electrically conductive layer or RDL 276 is formed over substrate 262 and conductive vias 263 using a patterning and metal deposition process such as sputtering, electrolytic plating, and electroless plating. Conductive layer 276 can be one or more layers of Al, Cu, Sn, Ni, Au, Ag, or other suitable electrically conductive material. One portion of conductive layer 276 is electrically connected to conductive vias 263. Other portions of conductive layer 276 can be electrically common or electrically isolated depending on the design and function of semiconductor die 204.

An insulating or passivation layer 278 is formed over substrate 262 and conductive layer 276 using PVD, CVD, printing, lamination, spin coating, spray coating, sintering or thermal oxidation. The insulating layer 278 contains one or more layers of $SiO_2$, $Si_3N_4$, SiON, $Ta_2O_5$, $Al_2O_3$, polymer dielectric resist with/without fillers or fibers or other material having similar insulating and structural properties.

Additional insulating layers and RDLs can be formed over within build-up interconnect structure 260 to provide additional vertical and horizontal electrical connectivity across the package according to the design and functionality of semiconductor package. Additional insulating and metal layers may also be formed within build-up interconnect structure 260 to provide grounding and EMI shielding layer within the semiconductor package. In one embodiment, interconnect structure 260, i.e., core substrate 262, conductive vias 263, conductive layer 264, insulating layer 266, conductive layer 276, and insulating layer 278, is formed using a lamination or similar substrate fabrication process. Conductive layer 264 or 268 of build-up interconnect structure 260 may be configured to provide a grounding or EMI shielding layer within the semiconductor package.

An electrically conductive bump material is deposited over conductive layer 264 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 264 using a suitable attachment or bonding process. In one embodiment, the bump material is reflowed by heating the material above its melting point to form balls or bumps 274. In some applications, bumps 274 are reflowed a second time to improve electrical contact to conductive layer 264. In one embodiment, bumps 274 are formed over a UBM having a wetting layer, barrier layer, and adhesive layer. The bumps can also be compression bonded or thermocompression bonded to conductive layer 264. Bumps 274 represent one type of interconnect structure that can be formed over conductive layer 264. The interconnect structure can also use bond wires, conductive paste, stud bump, micro bump, or other electrical interconnect.

Discrete semiconductor device 270 is metallurgically and electrically coupled to conductive layer 264 using conductive paste 272. Discrete semiconductor device 270 can be an inductor, capacitor, resistor, transistor, or diode.

Figure 6B:
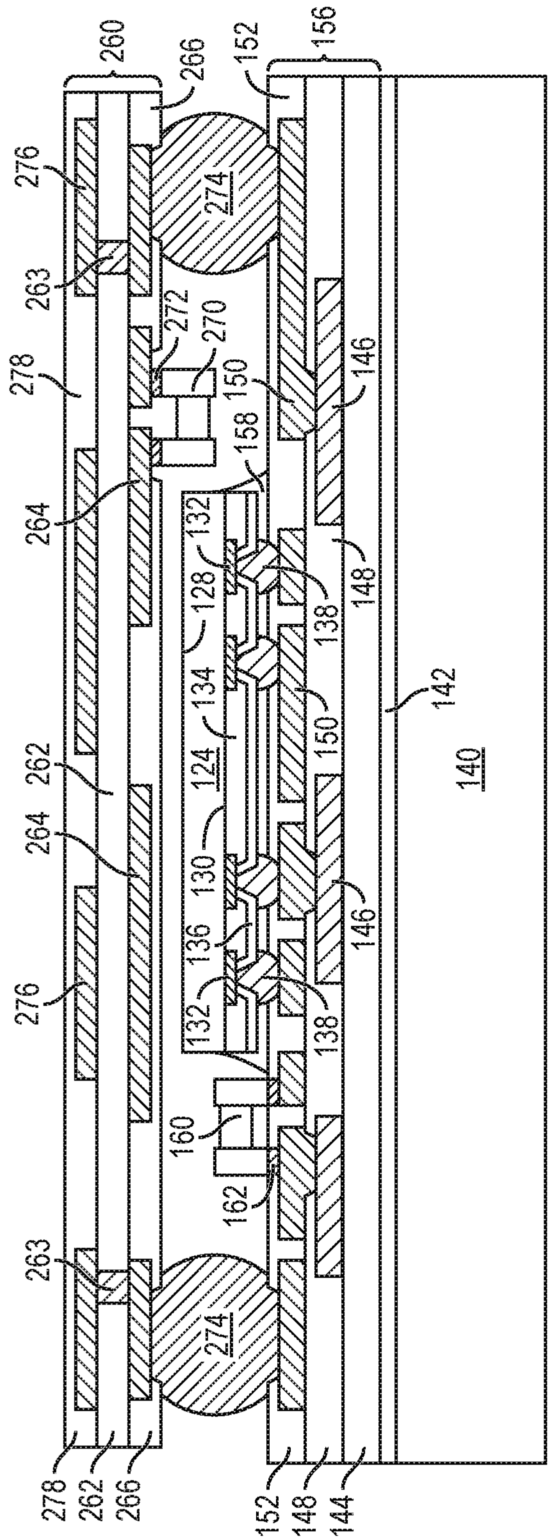

Build-up interconnect structure 260 with core substrate 262 is mounted to build-up interconnect structure 156, in a reconstituted wafer or panel form, using a pick and place operation with bumps 274 oriented toward build-up interconnect structure 156. FIG. 6*b* shows build-up interconnect structure 260 with core substrate 262 mounted to build-up interconnect structure 156 with bumps 274 bonded to conductive layer 150.

Figure 6C:
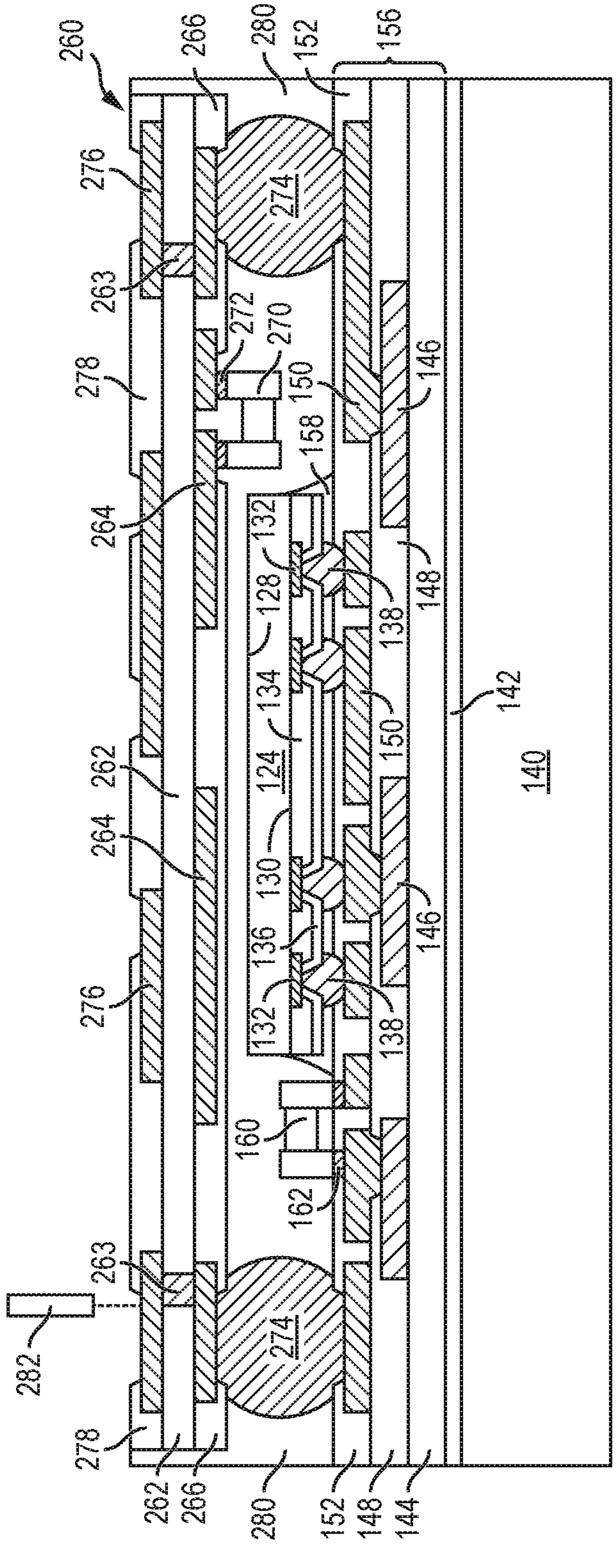

In FIG. 6*c*, an encapsulant or molding compound 280 is deposited over semiconductor die 124 and around bumps 274 between build-up interconnect structures 156 and 260 using a paste printing, with vacuum and high pressure curing, compressive molding, transfer molding, liquid encapsulant molding, vacuum lamination, spin coating, or other suitable applicator. Encapsulant 280 can be polymer composite material, such as epoxy resin with filler, epoxy acrylate with filler, or polymer with proper filler. Encapsulant 280 is non-conductive and environmentally protects the semiconductor device from external elements and contaminants. Encapsulant 280 may be overmolded or overflow on the surface of insulating layer 278.

A portion of insulating layer 278 and the optional overmold portion of encapsulant 280 are removed by LDA using laser 282 to expose conductive layer 276. Alternatively, a portion of insulating layer 278 is removed by an etching process through a patterned photoresist layer to expose conductive layer 276.

Figure 6D:
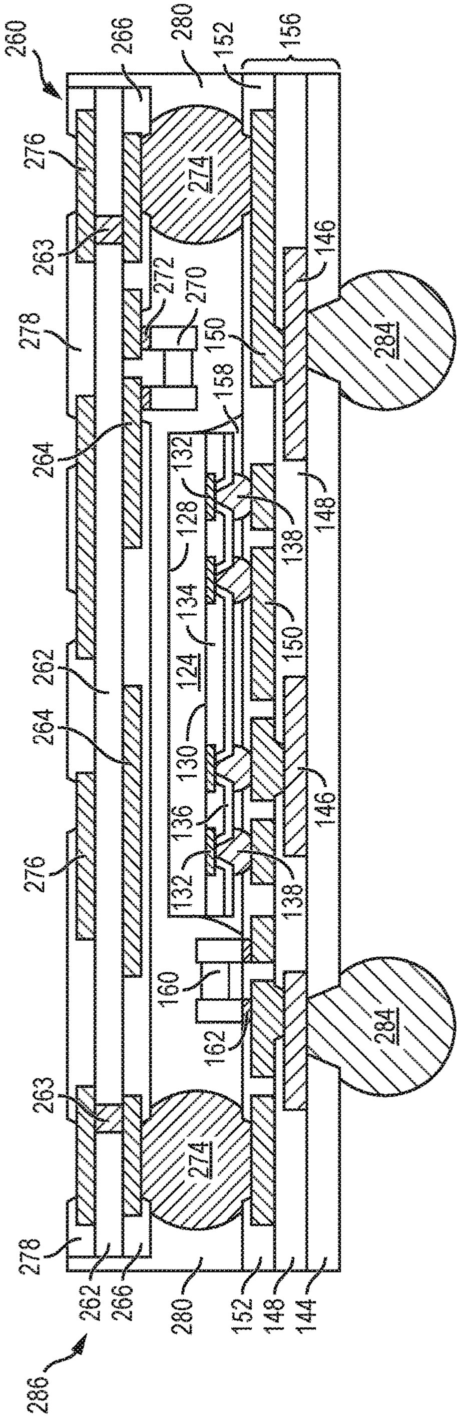

In FIG. 6*d*, carrier 140 and optional interface layer 142 are removed by chemical etching, mechanical peeling, CMP, mechanical grinding, thermal release, UV light, laser scanning, or wet stripping to expose insulating layer 144. A backgrinding tape or support carrier can be applied to insulating layer 244 prior to removing carrier 140. A portion of insulating layer 144 is removed by LDA or etching process through a patterned photoresist layer to expose conductive layer 146.

An electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 284. In some applications, bumps 284 are reflowed a second time to improve electrical contact to conductive layer 146. In one embodiment, bumps 284 are formed over a UBM having a wetting layer, barrier layer, and adhesive layer. The bumps can also be compression bonded or thermocompression bonded to conductive layer 146. Bumps 284 represent one type of interconnect structure that can be formed over conductive layer 146. The interconnect structure can also use bond wires, conductive paste, stud bump, micro bump, or other electrical interconnect.

The reconstituted wafer or panel is singulated into individual Fo-WLCSP 286 units. Semiconductor die 124 embedded in Fo-WLCSP 286 is electrically connected through bumps 138 to build-up interconnect structure 156 and bumps 284. The build-up interconnect structure 156 is inspected and tested to be known good by open/short probe or auto-scope inspection at an interim stage, i.e., prior to mounting semiconductor die 124. Semiconductor die 124 is further electrically connected through bumps 274 to build-up interconnect structure 260. The build-up interconnect structures 156 and 260 are formed at different times with respect to opposite surfaces of encapsulant 280. The build-up interconnect structures 260 are inspected and tested to be known good before additional device integration.

Figure 7:
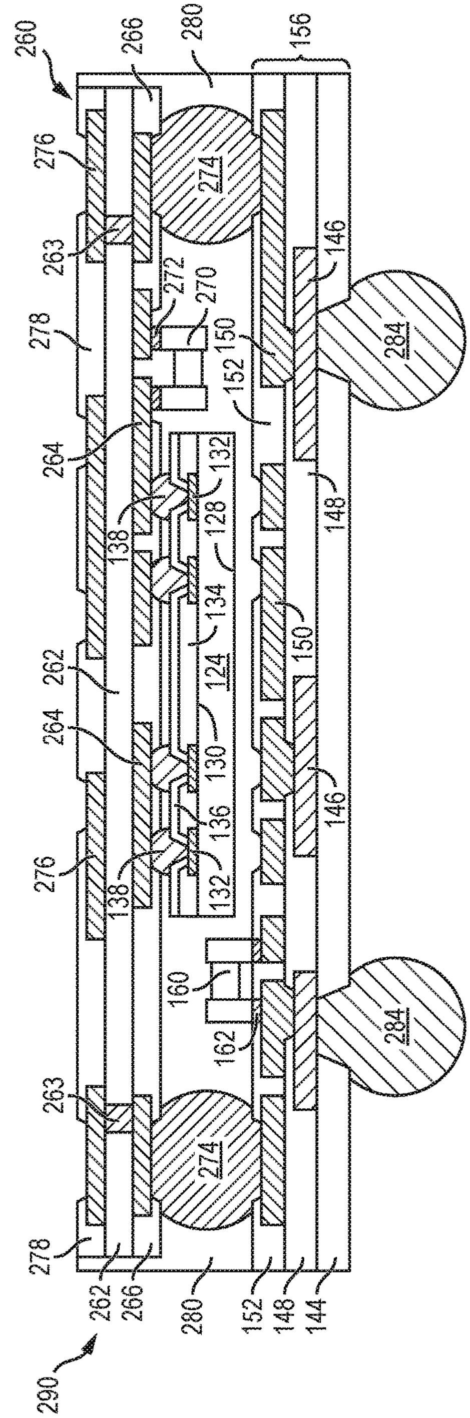
FIG. 7 illustrates a Fo-WLCSP with top and bottom build-up interconnect structures and a semiconductor die mounted to the top build-up interconnect structure.

FIG. 7 shows an embodiment of Fo-WLCSP 290, similar to FIG. 6*d*, with embedded semiconductor die 124 mounted to build-up interconnect structure 260. In one embodiment, conductive layer 146 or 150 of build-up interconnect structure 156 is configured to provide an EMI shield within Fo-WLCSP 290. Conductive layer 146 or 150 can also be configured as a heat sink within Fo-WLCSP 290.

Figure 8A:
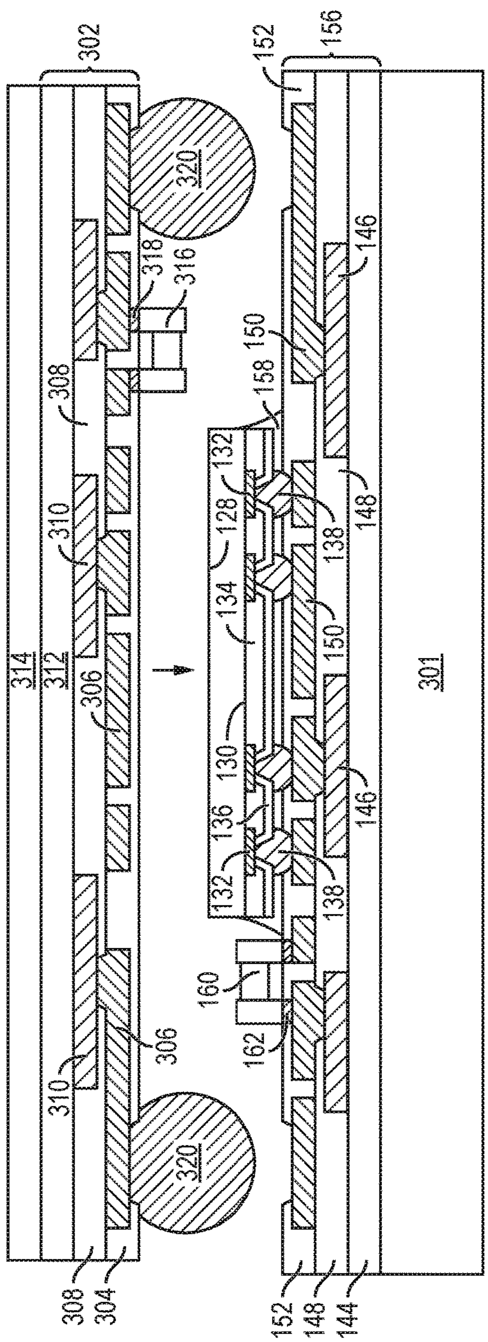
FIGS. 8*a*-8*b* illustrate another type of first build-up interconnect structure mounted to a second build-up interconnect structure.
Figure 8B:
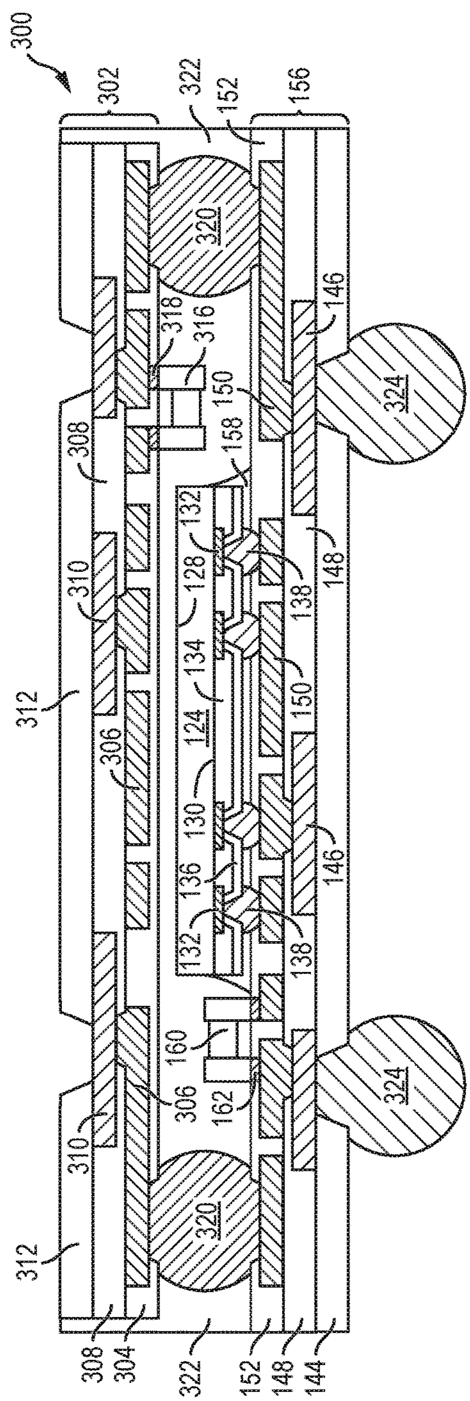

FIGS. 8*a*-8*b* show an embodiment of Fo-WLCSP 300, similar to FIG. 6*d*, with build-up interconnect structure 156 formed over carrier or temporary substrate 301. Carrier 301 contains sacrificial or reusable base material such as silicon, polymer, beryllium oxide, glass, or other suitable low-cost, rigid material for structural support. A build-up interconnect structure 302, including insulating layer 304, conductive layer 306, insulating layer 308, conductive layer 310, and insulating layer 312, is formed over carrier or temporary substrate 314, as shown in FIG. 8*a*. Substrate 314 contains a sacrificial or reusable base material such as silicon, polymer, beryllium oxide, glass, or other suitable low-cost, rigid material for structural support. In one embodiment, insulating layer 312 includes an embedded glass cloth, glass cross, filler, or fiber, such as E-glass cloth, T-glass cloth, Al2O3, or silica filler, for enhanced bending strength. In one embodiment, conductive layer 306 or conductive layer 310 is configured to provide an EMI shield within the semiconductor package.

Discrete semiconductor device 316 is metallurgically and electrically coupled to conductive layer 306 using conductive paste 318. Discrete semiconductor device 316 can be an inductor, capacitor, resistor, transistor, or diode.

An electrically conductive bump material is deposited over conductive layer 306 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 306 using a suitable attachment or bonding process. In one embodiment, the bump material is reflowed by heating the material above its melting point to form balls or bumps 320. In some applications, bumps 320 are reflowed a second time to improve electrical contact to conductive layer 306. In one embodiment, bumps 320 are formed over a UBM having a wetting layer, barrier layer, and adhesive layer. The bumps can also be compression bonded or thermocompression bonded to conductive layer 306. Bumps 320 represent one type of interconnect structure that can be formed over conductive layer 306. The interconnect structure can also use stud bump, micro bump, or other electrical interconnect.

Build-up interconnect structure 302 is mounted to build-up interconnect structure 156, in a reconstituted wafer or panel form, using a pick and place operation with bumps 320 oriented toward build-up interconnect structure 156. FIG. 8*b* shows build-up interconnect structure 260 mounted to build-up interconnect structure 156 with bumps 320 bonded to conductive layer 150. An encapsulant or molding compound 322 is deposited over semiconductor die 124 and around bumps 320 between build-up interconnect structures 156 and 302 using a paste printing, compressive molding, transfer molding, liquid encapsulant molding, vacuum lamination, spin coating, or other suitable applicator. Encapsulant 322 can be polymer composite material, such as epoxy resin with filler, epoxy acrylate with filler, or polymer with proper filler. Encapsulant 322 is non-conductive and environmentally protects the semiconductor device from external elements and contaminants.

Carrier 314 is removed by chemical etching, mechanical peeling, CMP, mechanical grinding, thermal release, UV light, laser scanning, or wet stripping. A portion of insulating layer 312 is removed by LDA or etching process through a patterned photoresist layer to expose conductive layer 310.

Carrier 301 is removed by chemical etching, mechanical peeling, CMP, mechanical grinding, thermal release, UV light, laser scanning, or wet stripping. An electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 324. In some applications, bumps 324 are reflowed a second time to improve electrical contact to conductive layer 146. In one embodiment, bumps 324 are formed over a UBM having a wetting layer, barrier layer, and adhesive layer. The bumps can also be compression bonded or thermocompression bonded to conductive layer 146. Bumps 324 represent one type of interconnect structure that can be formed over conductive layer 146. The interconnect structure can also use bond wires, conductive paste, stud bump, micro bump, or other electrical interconnect.

The reconstituted wafer or panel is singulated into individual Fo-WLCSP 300 units. Semiconductor die 124 embedded in Fo-WLCSP 300 is electrically connected through bumps 138 to build-up interconnect structure 156 and bumps 324. The build-up interconnect structure 156 is inspected and tested to be known good by open/short probe or auto-scope inspection at an interim stage, i.e., prior to mounting semiconductor die 124. Semiconductor die 124 is further electrically connected through bumps 320 to build-up interconnect structure 302. The build-up interconnect structures 156 and 302 are formed at different times with respect to opposite surfaces of encapsulant 322. The build-up interconnect structures 302 are inspected and tested to be known good before additional device integration.

Figure 9:
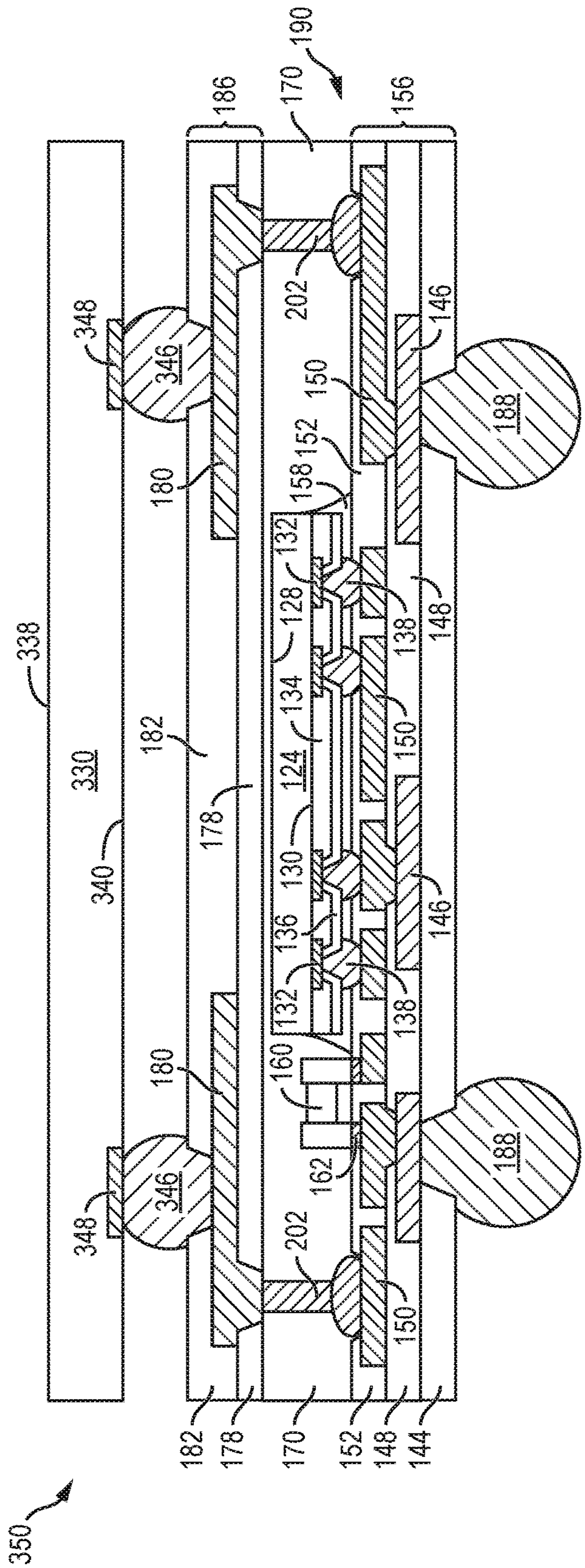
FIG. 9 illustrates a PoP including the Fo-WLCSP with bumps disposed between the top and bottom build-up interconnect structures.

FIG. 9 illustrates a PoP arrangement with semiconductor die 330 as singulated from a semiconductor wafer similar to FIG. 2*a* and having a back surface 338 and active surface 340 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 340 to implement analog circuits or digital circuits, such as DSP, ASIC, MEMS, memory, or other signal processing circuit. In one embodiment, active surface 340 contains a MEMS, such as an accelerometer, gyroscope, strain gauge, microphone, or other sensor responsive to various external stimuli. Semiconductor die 330 may also contain IPDs, such as inductors, capacitors, and resistors, for RF signal processing.

A plurality of bumps 346 is formed on contact pads 348 of semiconductor die 330. Semiconductor die 330 is mounted to Fo-WLCSP 190 with bumps 346 metallurgically and electrically connected to conductive layer 180 as PoP 350.

Figure 10A:
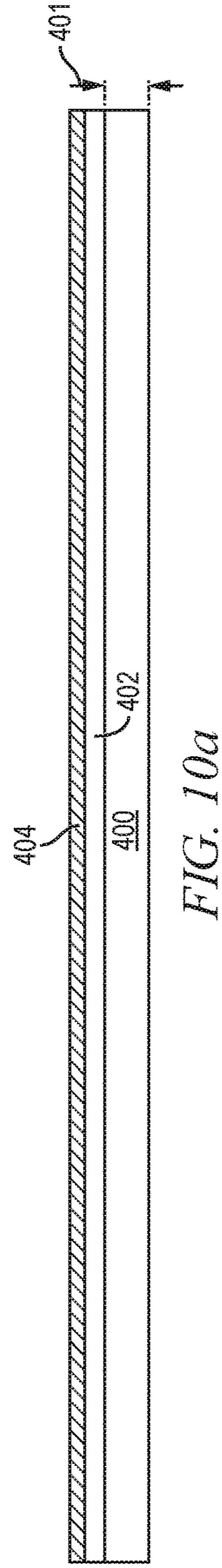
FIGS. 10*a*-10*r* illustrate a process of forming top and bottom build-up interconnect structures using an embedded temporary substrate.
Figure 10B:
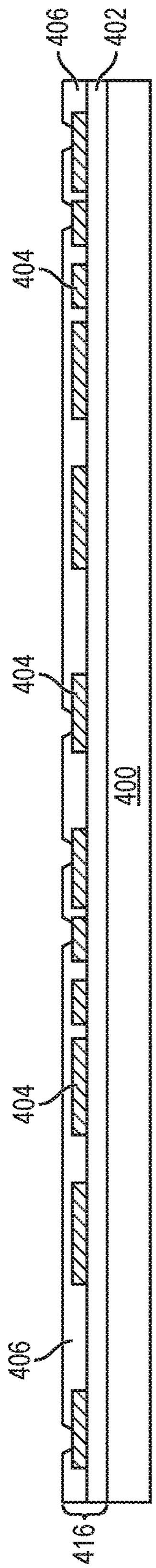
Figure 10C:
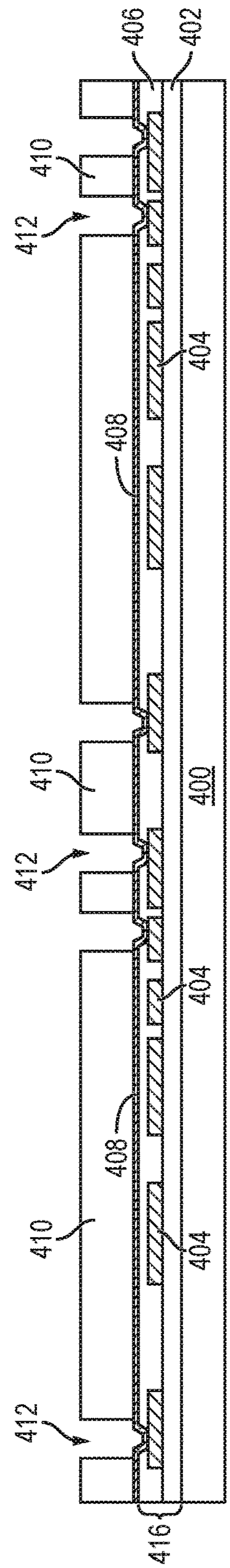
Figure 10D:
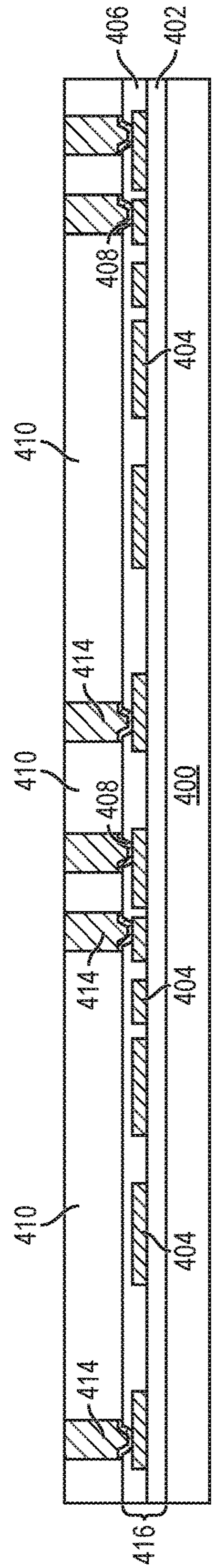
Figure 10E:
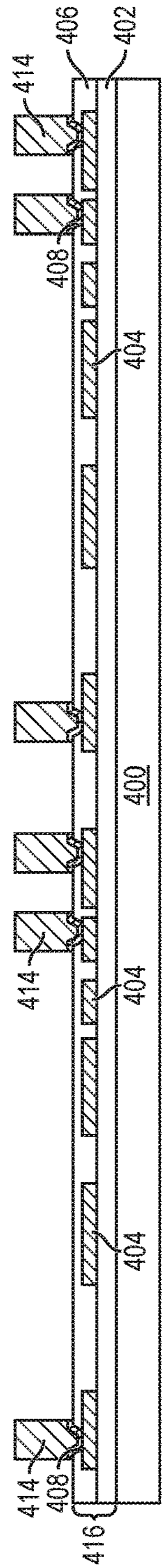
Figure 10F:
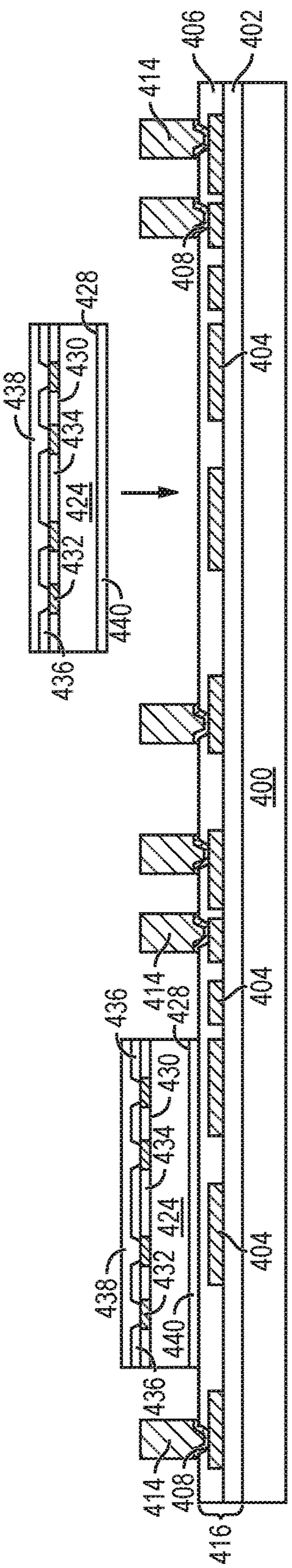
Figure 10G:
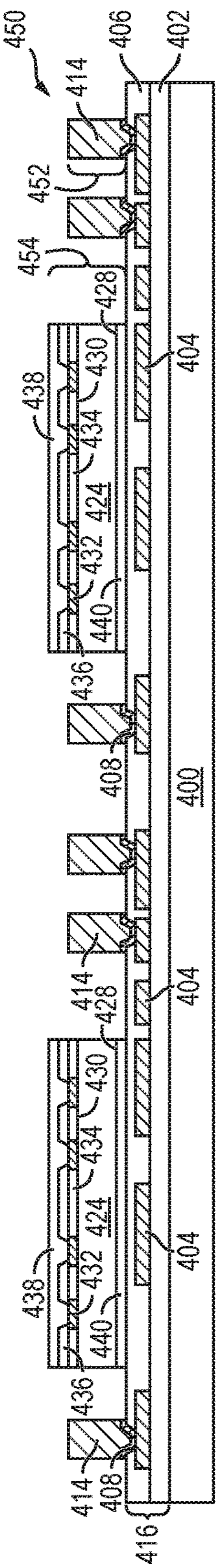
Figure 10H:
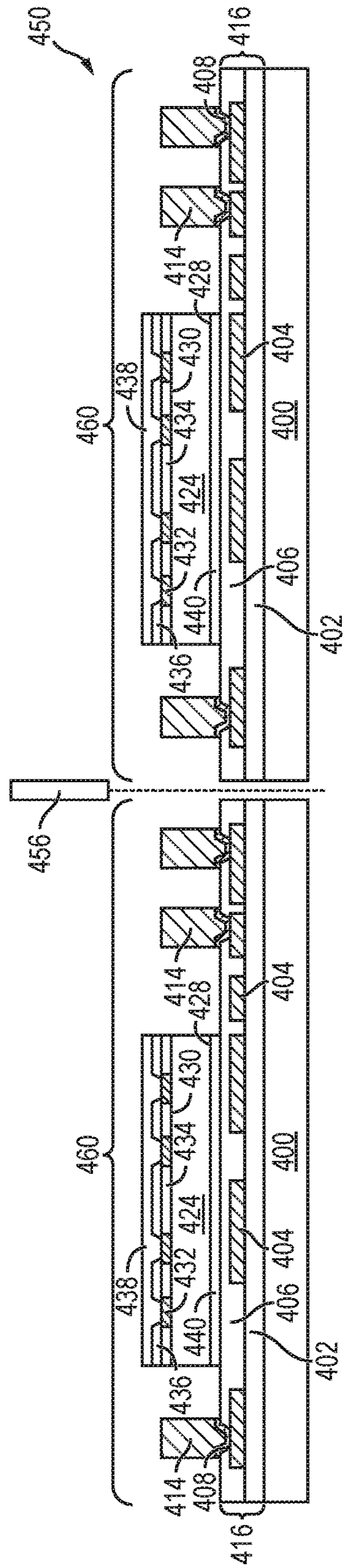
Figure 10I:
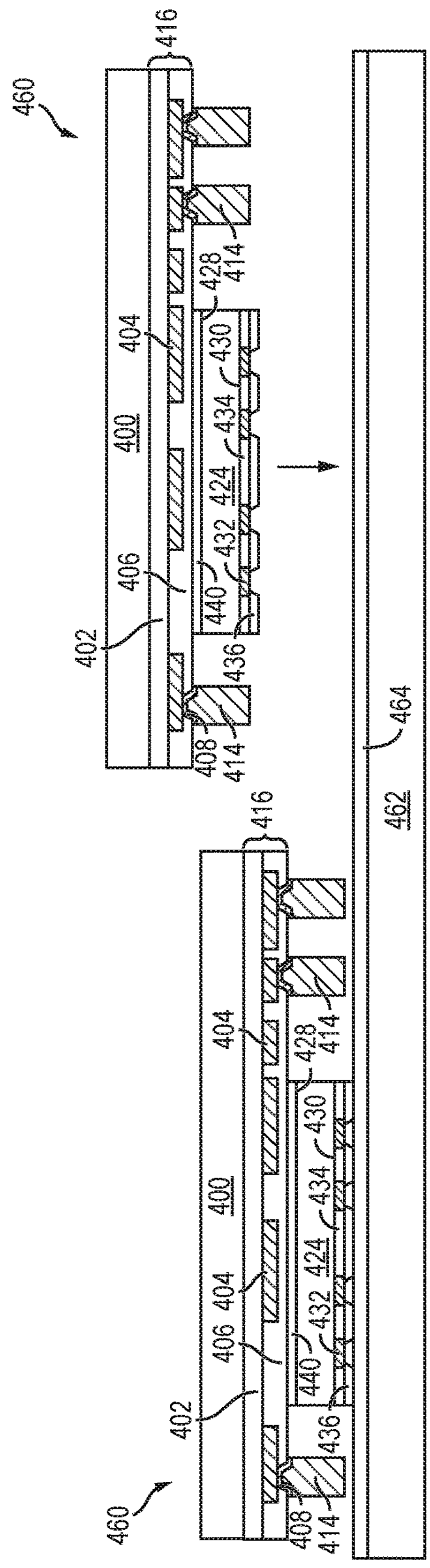
Figure 10J:
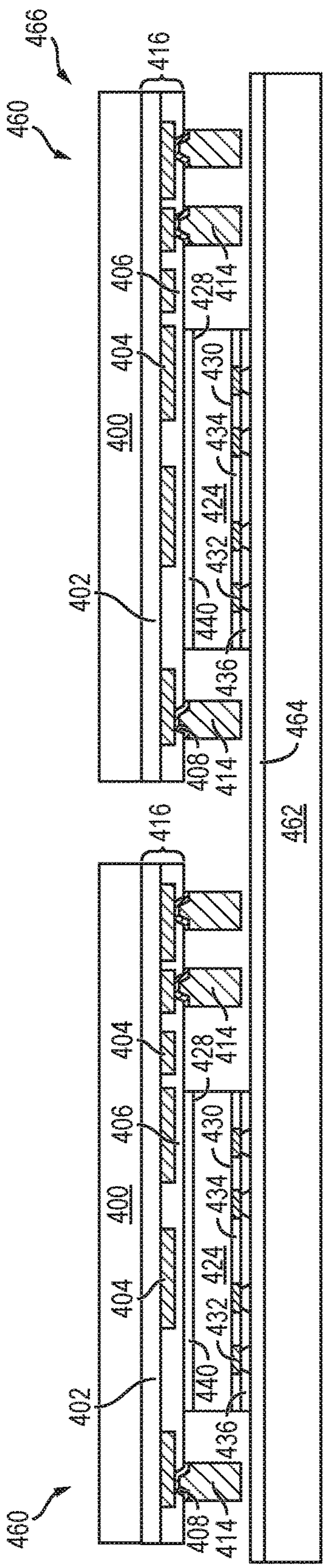
Figure 10K:
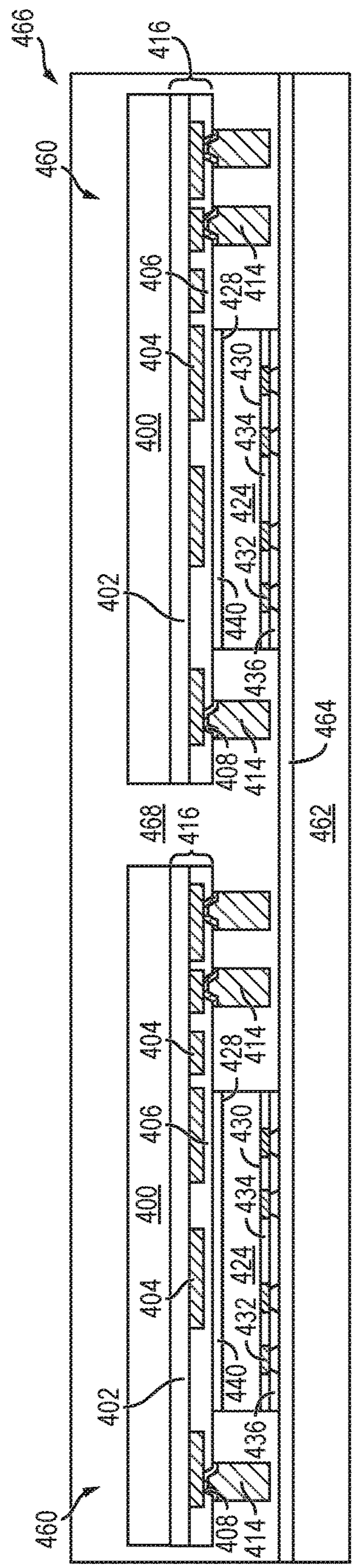
Figure 10L:
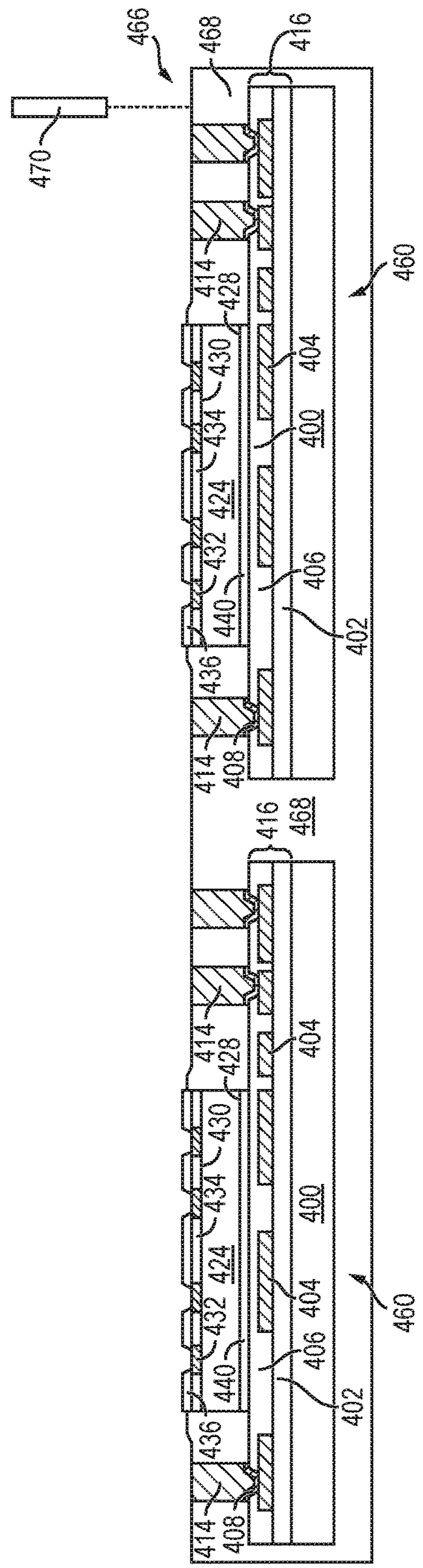
Figure 10M:
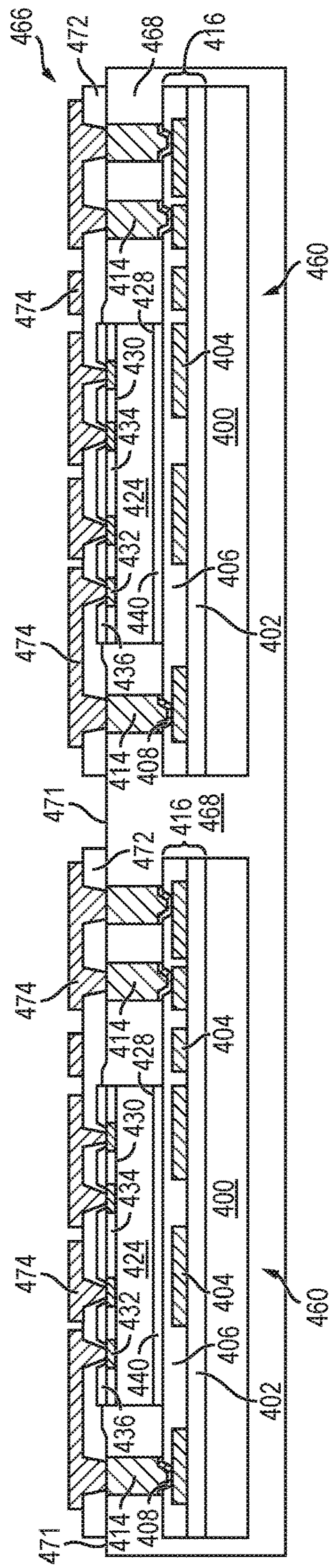
Figure 10N:
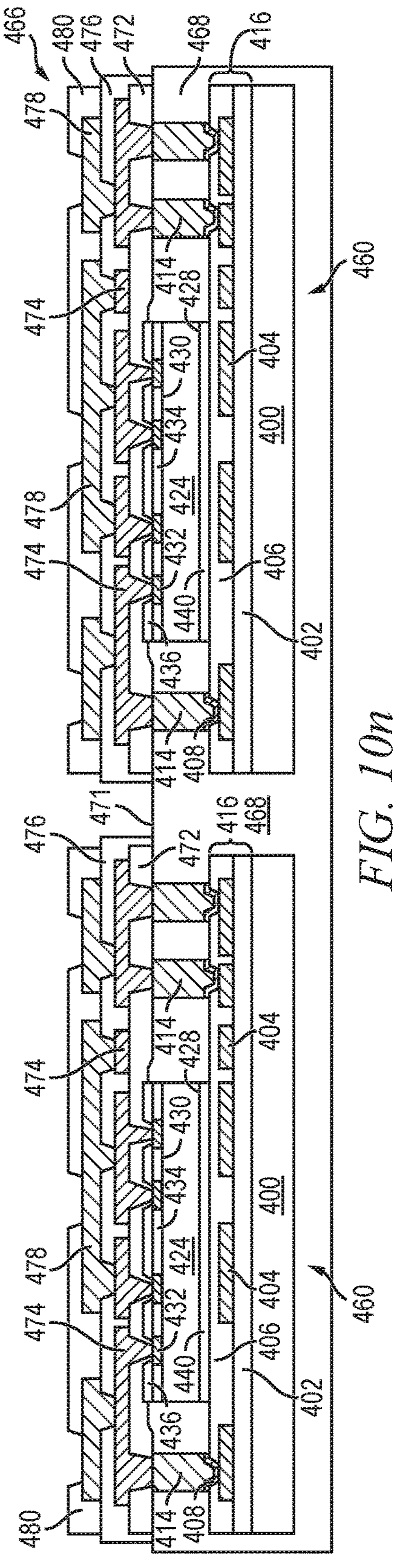
Figure 10O:
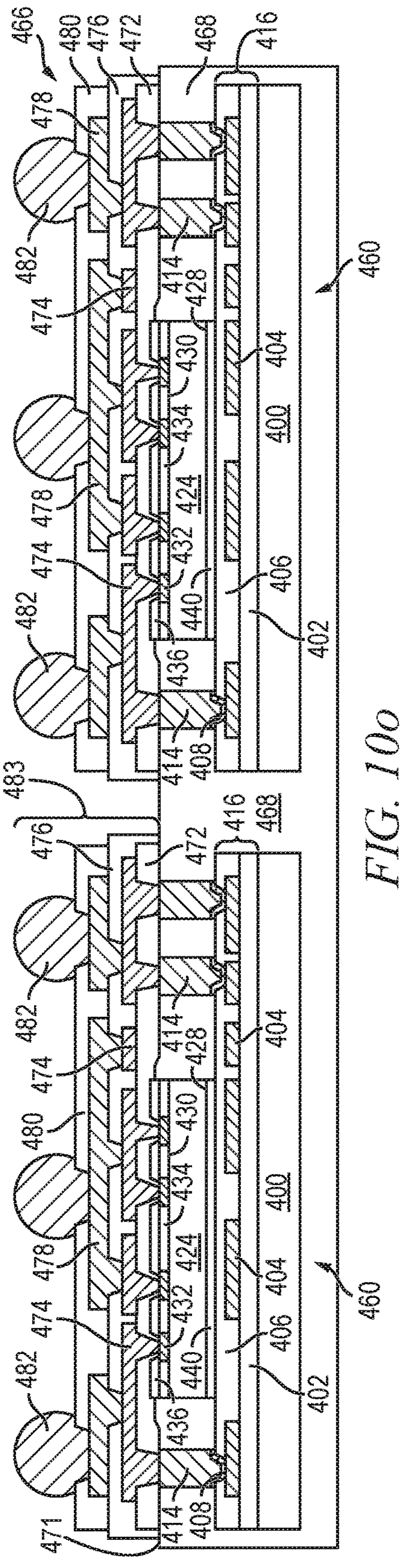
Figure 10P:
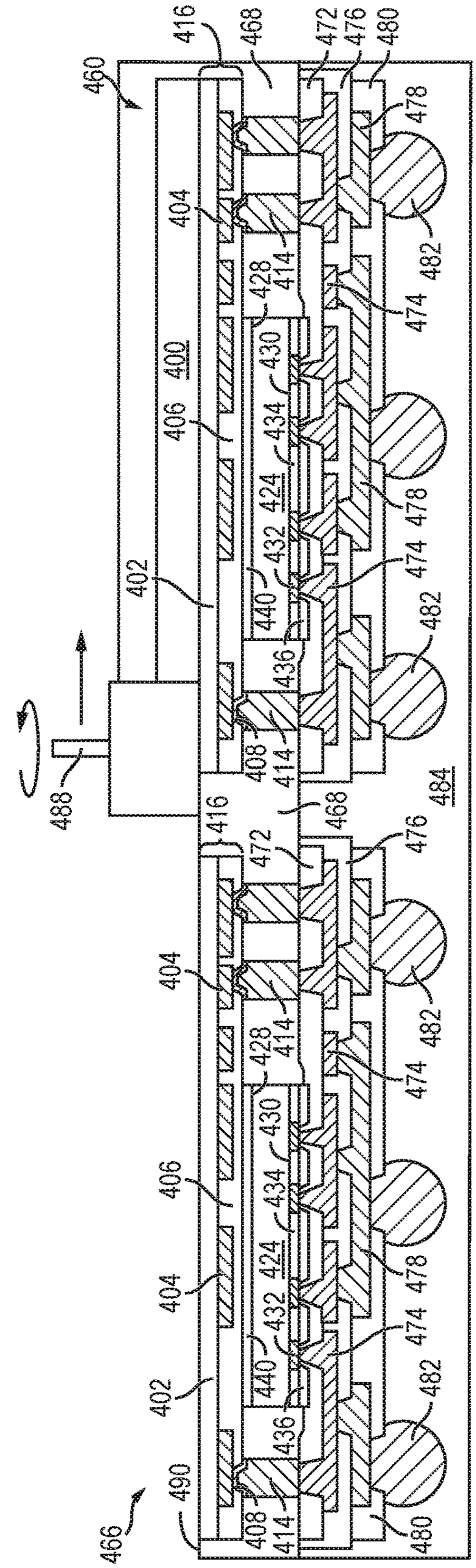
Figure 10Q:
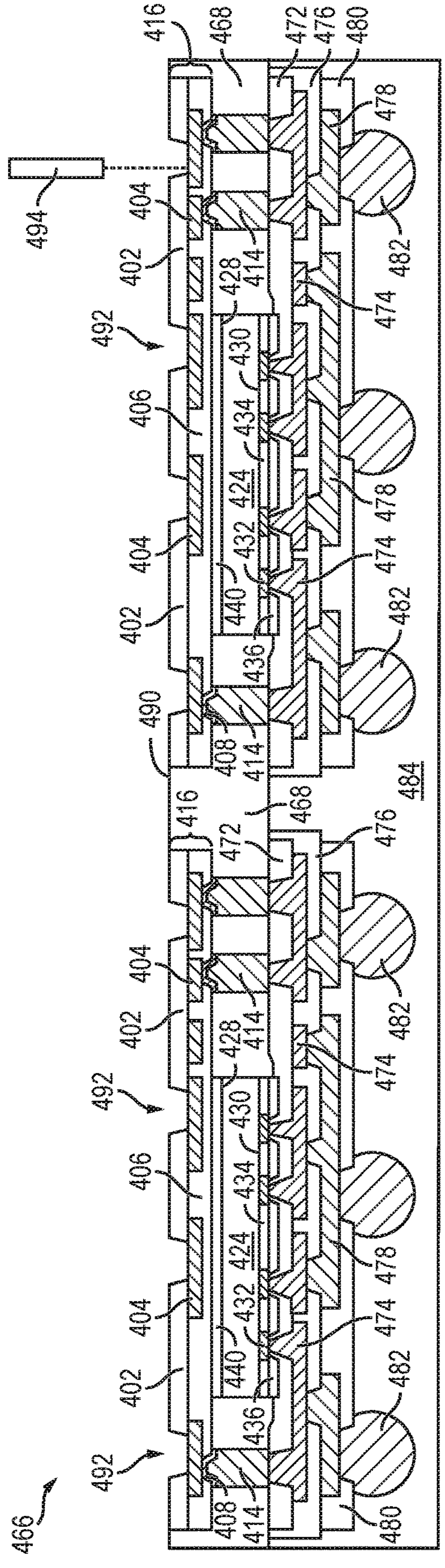
Figure 10R:
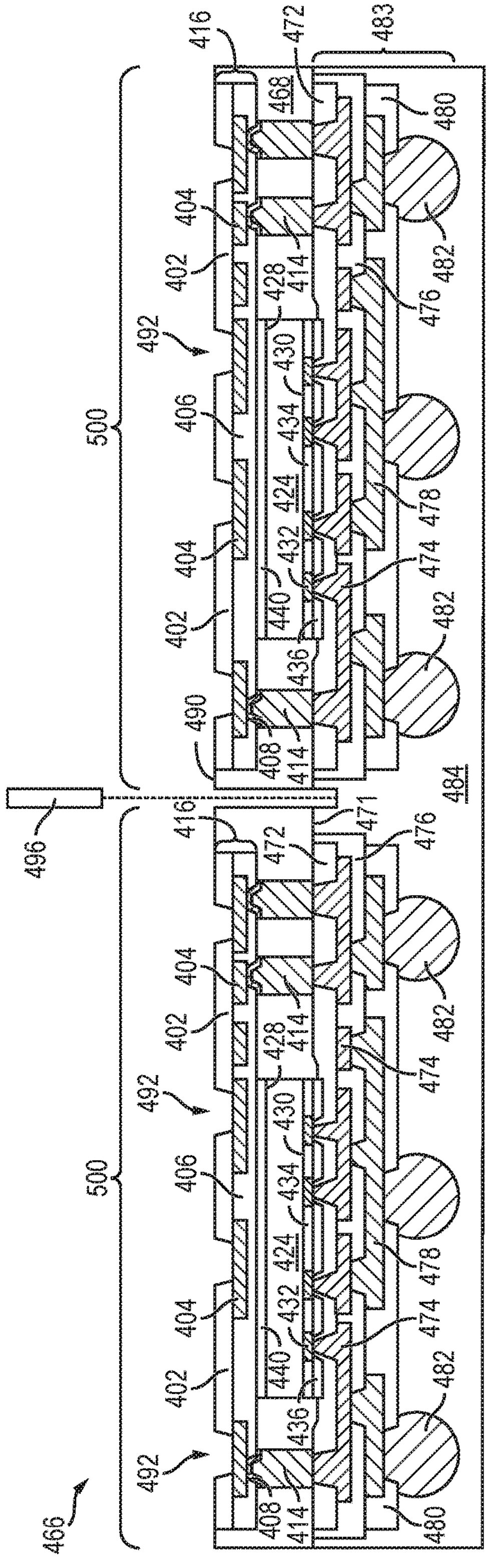

FIGS. 10*a*-10*r* illustrate, in relation to FIG. 1, a process of forming top and bottom interconnect structures in a Fo-WLP using an embedded temporary substrate for warpage control. FIG. 10*a* shows a cross-sectional view of a portion of a substrate 400. Substrate 400 is silicon (Si) or other material having a CTE similar to the CTE of Si, e.g. within 5 ppm/° C. of the CTE of Si. A thickness 401 of substrate 400 is between 200-775 μm. In one embodiment, the thickness 401 of substrate 400 is between 300-550 μm. An interface layer or double-sided tape may be formed over substrate 400 as a temporary adhesive bonding film, etch-stop layer, or thermal release layer.

An insulating or passivation layer 402 is formed over substrate 400 using PVD, CVD, printing, lamination, spin coating, spray coating, sintering or thermal oxidation. The insulating layer 402 contains one or more layers of SiO2, Si3N4, SiON, Ta2O5, Al2O3, polymer dielectric resist with or without fillers or fibers, or other material having similar insulating and structural properties. Insulating layer 402 may be transparent or semi-transparent. In one embodiment, insulating layer 402 includes a glass cloth, glass cross, filler, or fiber, such as E-glass cloth, T-glass cloth, Al2O3, or silica filler, for enhanced bending strength.

An electrically conductive layer 404 is formed over insulating layer 402 using lamination, printing, PVD, CVD, sputtering, electrolytic plating, or electroless plating. In one embodiment, conductive layer 404 is Cu foil or RCC. Conductive layer 404 is patterned using an etching process through a patterned photoresist layer or an ink printing process, as shown in FIG. 10*b*. The individual portions of conductive layer or RDL 404 can be electrically common or electrically isolated depending on the design and function of later mounted semiconductor die. In one embodiment, the Cu foil is thinned prior to forming the photoresist, and a selective, semi-additive plating process is used to form patterned conductive layer 404. Alternatively, conductive layer 404 includes one or more layers of Al, Cu, Sn, Ti, Ni, Au, Ag, or other suitable electrically conductive material and is formed over insulating layer 402 using a patterning and metal deposition process such as lamination, printing, PVD, CVD, sputtering, electrolytic plating, or electroless plating.

An insulating or passivation layer 406 is formed over insulating layer 402 and conductive layer 404 using PVD, CVD, printing, lamination, spin coating, spray coating, sintering or thermal oxidation. The insulating layer 406 contains one or more layers of SiO2, Si3N4, SiON, Ta2O5, Al2O3, polymer dielectric resist with or without fillers or fibers, or other material having similar insulating and structural properties. A portion of insulating layer 406 is removed by LDA to expose conductive layer 404. Alternatively, a portion of insulating layer 406 is removed by an etching process through a patterned photoresist layer to expose conductive layer 404. Insulating layer 406 may be transparent or semi-transparent. In one embodiment, insulating layer 406 includes a glass cloth, glass cross, filler, or fiber, such as E-glass cloth, T-glass cloth, Al2O3, or silica filler, for enhanced bending strength.

Collectively, insulating layers 402 and 406, conductive layer 404, constitute a build-up interconnect structure 416 formed over Si substrate 400. Build-up interconnect structure 416 may include as few as one RDL or conductive layer, such as conductive layer 404, and one insulating layer, such as insulating layer 406. Additional insulating layers and RDLs can be formed over insulating layer 406 to provide additional vertical and horizontal electrical connectivity across the package according to the design and functionality of later mounted semiconductor die and devices. Additional insulating and metal layers may also be formed within build-up interconnect structure 416 to provide grounding and EMI shielding layers within the semiconductor package.

In FIG. 10*c*, an electrically conductive layer 408 is conformally applied over insulating layer 406 and along the exposed portions of conductive layer 404 using a patterning and metal deposition process such as PVD, CVD, sputtering, electrolytic plating, and electroless plating. Conductive layer 408 is a Cu plating seed layer. Seed layer 408 includes Ti/Cu, TiW/Cu, Ni, NiV, Au, Al, or other suitable seed material.

A patterning or photoresist layer 410 is formed over seed layer 408. A portion of photoresist layer 410 is removed by a photolithography and etching process or by LDA to form openings 412. Openings 412 extend to seed layer 408 and are formed over the removed portions of insulating layer 406.

In FIG. 10*d*, an electrically conductive material is deposited in the removed portions of photoresist layer 410, i.e., in openings 412, using Cu plating, electrolytic plating, electroless plating, or other suitable metal deposition process to form conductive columns or vertical interconnect structures 414. In one embodiment, columns 414 are formed to a height of at least 75 μm above the surface of insulating layer 406.

In FIG. 10*e*, the remaining portions of photoresist layer 410 are stripped leaving conductive columns or vertical interconnect structures 414. After stripping the remaining the portion of photoresist layer 410, the portions of seed layer 408 outside conductive columns 414 are etched away and a leakage descum is performed. Conductive columns 414 can have a cylindrical shape with a circular or oval cross-section, or conductive columns 414 can have a cubic shape with a rectangular cross-section.

Forming conductive columns 414 over Si substrate 400 provides increased design flexibility and minimizes fabrication costs because the fabrication materials and equipment compatible with Si substrates have a more established infrastructure, i.e., more materials and standardized equipment are available and common to fabrication methods that employ Si substrates. The common materials and standardized equipment lowers manufacturing costs and capital risk by reducing or eliminating the need for specialized semiconductor processing lines based on other substrate materials or methods of forming 3D interconnect structures.

The build-up interconnect structure 416 and conductive columns 414 are inspected and tested to be known good at the wafer level by open/short probe or auto-scope inspection at the present interim stage, i.e., prior to mounting a semiconductor die. Leakage can be tested at a sampling location. Screening for defective interconnections prior to mounting semiconductor die over build-up interconnect structure 416 minimizes KGD die loss as KGD are not wasted over defective interconnect structures.

In FIG. **10*f*, semiconductor die 424, as singulated from a semiconductor wafer similar to FIG. 2*a*, are disposed over build-up interconnect structure 416 between conductive columns 414. Semiconductor die 424 are KGD having been tested prior to mounting semiconductor die 424 to insulating layer 406. Semiconductor die 424 has a back surface 428 and active surface 430 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 430 to implement analog circuits or digital circuits, such as DSP, ASIC, MEMS, memory, or other signal processing circuit. In one embodiment, active surface 430 contains a MEMS, such as an accelerometer, gyroscope, strain gauge, microphone, or other sensor responsive to various external stimuli. Semiconductor die 424** may also contain IPDs, such as inductors, capacitors, and resistors, for RF signal processing.

An electrically conductive layer 432 is formed over active surface 430 using PVD, CVD, electrolytic plating, electroless plating process, or other suitable metal deposition process. Conductive layer 432 can be one or more layers of Al, Cu, Sn, Ni, Au, Ag, or other suitable electrically conductive material. Conductive layer 432 operates as contact pads electrically connected to the circuits on active surface 430.

An insulating or passivation layer 434 is formed over active surface 430 and conductive layer 432 using PVD, CVD, printing, lamination, spin coating, spray coating, sintering or thermal oxidation. The insulating layer 434 contains one or more layers of SiO2, Si3N4, SiON, Ta2O5, Al2O3, or other material having similar insulating and structural properties. A portion of insulating layer 434 is removed by LDA to expose conductive layer 432. Alternatively, a portion of insulating layer 434 is removed by an etching process through a patterned photoresist layer to expose conductive layer 432.

An optional insulating or protection layer 436 is formed over insulating layer 434 and conductive layer 432 using PVD, CVD, printing, lamination, spin coating, spray coating, sintering or thermal oxidation. The insulating layer 436 contains one or more layers of SiO2, Si3N4, SiON, Ta2O5, Al2O3, or other material having similar insulating and structural properties. The insulating layer 436 protects semiconductor die 424. Alternatively, insulating layers 434 and 436 can be the same layer. A portion of insulating layer 436 is removed by LDA to expose conductive layer 432. Alternatively, a portion of insulating layer 436 is removed by an etching process through a patterned photoresist layer to expose conductive layer 432.

A temporary insulating or protection layer 438 is formed over insulating layer 436 and conductive layer 432 using PVD, CVD, printing, lamination, spin coating, spray coating, sintering or thermal oxidation. The insulating layer 438 contains one or more layers of SiO2, Si3N4, SiON, Ta2O5, Al2O3, or other material having similar insulating and structural properties. The insulating layer 438 protects semiconductor die 424 during handling and subsequent manufacturing steps.

A DAF 440 is disposed over back surface 428 of semiconductor die 424. Alternatively, DAF can be disposed on insulating layer 406 prior to mounting semiconductor die 424. Semiconductor die 424 are disposed on insulating layer 406 using a pick and place operation with back surface 428 oriented toward insulating layer 406.

FIG. **10*g* shows semiconductor die 424 mounted to insulating layer 406 as a reconstituted wafer 450. Conductive columns 414 are disposed around or in a peripheral region of semiconductor die 424. A height 452 of conductive columns 414 is 0-50 μm less than a height 454 of semiconductor die 424. In one embodiment, the height 452 of conductive column 414 is 10 μm less than the height 454 of semiconductor die 424**.

In FIG. **10*h*, reconstituted wafer 450 is singulated into individual semiconductor units 460 using a saw blade or laser cutting tool 456. Semiconductor units 460 each include a semiconductor die 424 disposed over build-up interconnect structure 416 and Si substrate 400 with conductive columns 414 disposed around semiconductor die 424. Conductive columns 414 are electrically connected to conductive layer 404 and provide vertical or 3D electrical interconnect for subsequent PoP fabrication. Substrate 400 provides structural support during subsequent handling of semiconductor units 460 and fabrication processes performed over semiconductor units 460**.

FIG. **10*i* shows a cross-sectional view of a portion of a carrier or temporary substrate 462 containing sacrificial base material such as silicon, polymer, beryllium oxide, glass, or other suitable low-cost, rigid material for structural support. An interface layer or double-sided tape 464 is formed over carrier 462** as a temporary adhesive bonding film, etch-stop layer, or thermal release layer.

Carrier 462 can be a round or rectangular panel (greater than 300 mm) with capacity for multiple semiconductor die 424 and semiconductor units 460. Carrier 462 may have a larger surface area than the surface area of semiconductor wafer 120 or reconstituted wafer 450. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 462 is selected independent of the size of semiconductor unit 460 or the size of the reconstituted wafer 450. That is, carrier 462 has a fixed or standardized size, which can accommodate various size semiconductor die 424 and semiconductor units 460 singulated from one or more semiconductor wafers or reconstituted wafers. In one embodiment, carrier 462 is circular with a diameter of 330 mm. In another embodiment, carrier 462 is rectangular with a width of 560 mm and length of 600 mm. Semiconductor units 460 having semiconductor die 424 with dimensions of 10 mm by 10 mm, may be placed on the standardized carrier 462. Alternatively, semiconductor units 460 that have semiconductor die 424 with dimensions of 20 mm by 20 mm, can also be placed on the same standardized carrier 462. Accordingly, standardized carrier 462 can handle any size semiconductor unit 460, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 462 lowers manufacturing costs and capital risk by reducing or eliminating the need for specialized semiconductor processing lines based on die size or incoming wafer size. By selecting a predetermined carrier size to use for any size semiconductor die or unit from all semiconductor and reconstituted wafers, a flexible manufacturing line can be implemented.

Semiconductor units 460 from FIG. 10*h* are mounted to carrier 462 and interface layer 464 using, for example, a pick and place operation with insulating layer 436 and conductive columns 414 oriented toward the carrier. In one embodiment, temporary protective layer 438 is removed from over semiconductor die 424 prior to disposing semiconductor units 460 over carrier 462. In other embodiments, temporary protective layer 438 remains over semiconductor die 424 until later in the manufacturing process.

FIG. 10*j* shows semiconductor units 460 mounted to interface layer 464 of carrier 462 as reconstituted or reconfigured wafer 466. Reconstituted wafer 466 is configured according to the specifications of the resulting final semiconductor package. In one embodiment, a distance between adjacent semiconductor units 460 on carrier 462 is 100 μm or greater.

In FIG. 10*k*, an encapsulant or molding compound 468 is deposited over semiconductor units 460 and carrier 462 using a paste printing, compressive molding, transfer molding, liquid encapsulant molding, vacuum lamination, spin coating, or other suitable applicator. Encapsulant 468 can be polymer composite material, such as epoxy resin with filler, epoxy acrylate with filler, or polymer with proper filler. Encapsulant 468 has a filler size of 55 μm or less. In one embodiment, encapsulant 468 has a filler size of 30 μm or less. The small filler size allows encapsulant 468 to easily flow into the area between the surface of insulating layer 406 and interface layer 464. Encapsulant 468 flows around conductive columns 414 and semiconductor die 424. Encapsulant 468 also flows between interface layer 464 and the surface of conductive columns 414 that is opposite seed layer 408 due to the height of conductive columns 414 being less than the height of semiconductor die 424. Encapsulant 468 is non-conductive and environmentally protects the semiconductor device from external elements and contaminants. Encapsulant 468 also protects semiconductor die 424 from degradation due to exposure to light.

In FIG. 10*l*, carrier 462 and interface layer 464 are removed by chemical etching, mechanical peeling, CMP, mechanical grinding, thermal bake, UV light, laser scanning, or wet stripping to expose insulating layer 436 and conductive layer 432 of semiconductor die 424. In one embodiment, protective layer 438 of semiconductor die 424 is removed from over insulating layer 436 after debonding carrier 462 and interface layer 464.

A portion of encapsulant 468 is removed by LDA using laser 470 to expose conductive columns 414. Alternately, encapsulant 468 can be removed from over conductive columns 414 by grinding or other suitable removal process.

In FIG. 10*m*, an insulating or passivation layer 472 is formed over encapsulant 468, conductive columns 414, and insulating layer 436 and conductive layer 432 of semiconductor die 424 using PVD, CVD, printing, spin coating, spray coating, screen printing or lamination. Insulating layer 472 can be one or more layers of $SiO_2$, $Si_3N_4$, SiON, $Ta_2O_5$, $Al_2O_3$, or other material having similar insulating and structural properties. In one embodiment, insulating layer 472 is a photosensitive dielectric polymer low-cured at less than 200° C. A portion of insulating layer 472 is removed by an etching process with a patterned photoresist layer or by LDA to form openings over and exposing conductive layer 432 and conductive columns 414. In one embodiment, insulating layer 472 is formed within the footprint of semiconductor unit 460 and does not extend beyond the footprint of semiconductor unit 460. In other words, a portion of surface 471 of encapsulant 468 that is in a peripheral region of semiconductor unit 460 adjacent to semiconductor unit 460 is devoid of insulating layer 472. In another embodiment, insulating layer 472 is formed continuously over surface 471 of encapsulant 468 between semiconductor units 460, and a portion of insulating layer 472 is removed from over the portions of surface 471 that are outside the footprint of semiconductor unit 460 by an etching process with a patterned photoresist layer or by LDA. Alternatively, insulating layer 472 is formed over and remains over the portions of encapsulant 468 that are outside the footprint of semiconductor unit 460.

An electrically conductive layer or RDL 474 is formed over insulating layer 472, conductive layer 432, and conductive columns 414 using a patterning and metal deposition process such as printing, PVD, CVD, sputtering, electrolytic plating, and electroless plating. Conductive layer 474 can be one or more layers of Al, Cu, Sn, Ti, Ni, Au, Ag, W, or other suitable electrically conductive material. A portion of conductive layer 474 extends horizontally along insulating layer 472 and parallel to active surface 430 of semiconductor die 424 to laterally redistribute the electrical interconnect to conductive layer 432 and conductive columns 414. Conductive layer 474 is formed over the footprint of semiconductor unit 460 and does not extend over the portion of surface 471 of encapsulant 468 that is outside the footprint of semiconductor unit 460. In other words, a peripheral region of semiconductor unit 460 adjacent to semiconductor unit 460 is devoid of conductive layer 474. A portion of conductive layer 474 is electrically connected to conductive layer 432. A portion of conductive layer 474 is electrically connected to conductive columns 414. Other portions of conductive layer 474 are electrically common or electrically isolated depending on the design and function of the semiconductor device.

In FIG. 10*n*, an insulating or passivation layer 476 is formed over insulating layer 472 and conductive layer 474 using PVD, CVD, printing, spin coating, spray coating, screen printing or lamination. Insulating layer 476 can be one or more layers of $SiO_2$, $Si_3N_4$, SiON, $Ta_2O_5$, $Al_2O_3$, or other material having similar insulating and structural properties. In one embodiment, insulating layer 476 is a photosensitive dielectric polymer low-cured at less than 200° C. A portion of insulating layer 476 is removed by an etching process with a patterned photoresist layer or by LDA to form openings exposing conductive layer 474. In one embodiment, insulating layer 476 is formed within the footprint of semiconductor unit 460 and does not extend over the portion of surface 471 of encapsulant 468 that is beyond the footprint of semiconductor unit 460. In other words, the portions of surface 471 of encapsulant 468 in a peripheral region of semiconductor unit 460 remain exposed from insulating layer 476. In another embodiment, insulating layer 476 is formed continuously over surface 471 of encapsulant 468 between semiconductor units 460, and a portion of insulating layer 476 is removed from over the portions of surface 471 that are outside the footprint of semiconductor unit 460 by an etching process with a patterned photoresist layer or by LDA. Alternatively, insulating layer 476 is formed over and remains over the portions encapsulant 468 that are outside the footprint of semiconductor unit 460.

An electrically conductive layer or RDL 478 is formed over insulating layer 476 and conductive layer 474 using a patterning and metal deposition process such as printing, PVD, CVD, sputtering, electrolytic plating, and electroless plating. Conductive layer 474 can be one or more layers of Al, Cu, Sn, Ti, Ni, Au, Ag, W, or other suitable electrically conductive material. A portion of conductive layer 478 extends horizontally along insulating layer 476 and parallel to active surface 430 of semiconductor die 424 to laterally redistribute the electrical interconnect to conductive layer 474. Conductive layer 478 is formed over the footprint of semiconductor unit 460 and does not extend over the portions of surface 471 of encapsulant 468 that are outside the footprint of semiconductor unit 460. A portion of conductive layer 478 is electrically connected to conductive layer 474. Other portions of conductive layer 478 are electrically common or electrically isolated depending on the design and function of the semiconductor device.

An insulating or passivation layer 480 is formed over insulating layer 476 and conductive layer 478 using PVD, CVD, printing, spin coating, spray coating, screen printing or lamination. Insulating layer 480 can be one or more layers of SiO2, Si3N4, SiON, Ta2O5, Al2O3, or other material having similar insulating and structural properties. In one embodiment, insulating layer 480 is a photosensitive dielectric polymer low-cured at less than 200° C. A portion of insulating layer 480 is removed by an etching process with a patterned photoresist layer or by LDA to form openings exposing conductive layer 478. In one embodiment, insulating layer 480 is formed within the footprint of semiconductor unit 460 and does not extend over the portion of surface 471 of encapsulant 468 that is beyond the footprint of semiconductor unit 460. In other words, the portions of surface 471 of encapsulant 468 in a peripheral region of semiconductor unit 460 remain exposed from insulating layer 480. In another embodiment, insulating layer 480 is formed continuously over surface 471 of encapsulant 468 between semiconductor units 460, and a portion of insulating layer 480 is removed from over the portions of surface 471 that are outside the footprint of semiconductor unit 460 by an etching process with a patterned photoresist layer or by LDA. Alternatively, insulating layer 480 is formed over and remains over the portions of encapsulant 468 that are outside the footprint of semiconductor unit 460.

In FIG. 10*o*, an electrically conductive bump material is deposited over conductive layer 478 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 478 using a suitable attachment or bonding process. In one embodiment, the bump material is reflowed by heating the material above the material's melting point to form balls or bumps 482. In some applications, bumps 482 are reflowed a second time to improve electrical contact to conductive layer 478. Bumps 482 can also be compression bonded or thermocompression bonded to conductive layer 478. In one embodiment, bumps 482 are formed over a UBM having a wetting layer, barrier layer, and adhesive layer. Bumps 482 represent one type of interconnect structure that can be formed over conductive layer 478. The interconnect structure can also use bond wires, conductive paste, stud bump, micro bump, or other electrical interconnect.

Collectively, insulating layers 472, 476, and 480, conductive layers 474 and 478, and bumps 482 constitute a build-up interconnect structure 483 formed over semiconductor unit 460. Build-up interconnect structure 483 may include as few as one RDL or conductive layer, such as conductive layer 474, and one insulating layer, such as insulating layer 472. Additional insulating layers and RDLs can be formed over insulating layer 480 prior to forming bumps 482, to provide additional vertical and horizontal electrical connectivity across the package according to the design and functionality of the semiconductor device. Additional insulating and metal layers may also be formed within build-up interconnect structure 483 to provide grounding and EMI shielding layers within the semiconductor package. Build-up interconnect structure 483 is inspected and tested to be known good at an interim stage, i.e., prior to additional device integration, see FIG. 9.

Substrate 400 is present during the formation of build-up interconnect structure 483. Substrate 400 provides support during formation of build-up interconnect structure 483 and decreases warpage of reconstituted wafer 466. The decreased warpage increases the reliability of interconnect structures 416 and 483, i.e., decreases a likelihood and occurrence of defective interconnections within build-up interconnect structures 416 and 483 and between conductive columns 414 and build-up interconnect structures 416 and 483.

In FIG. 10*p*, a backgrinding tape or support carrier 484 is applied over interconnect structure 483 and in contact with insulating layer 480 and bumps 482. Substrate 400 of semiconductor unit 460 and a portion of encapsulant 468 is removed in a grinding operation using grinder 488. The grinding operation exposes insulating layer 402 of semiconductor unit 460. After grinding, a new back surface 490 of encapsulant 468 is coplanar with the surface of insulating layer 402 that is opposite conductive layer 404.

In FIG. 10*q*, a portion of insulating layer 402 is removed to form openings 492 over and exposing conductive layer 404. Openings 492 are formed by LDA using laser 494, etching, or other suitable process. Openings 492 are configured to provide electrical interconnect to semiconductor die or devices, for example, semiconductor die, memory devices, passive devices, saw filters, inductors, antenna, etc., stacked over semiconductor die 424. In one embodiment, a finish such as Cu organic solderability preservative (OSP) is applied to the exposed portions of conductive layer 404 to prevent Cu oxidation.

In FIG. 10*r*, reconstituted wafer 466 is singulated through encapsulant 468 using a saw blade or laser cutting tool 496 into individual Fo-WLPs 500. Insulating layers 472, 476, and 480, and conductive layers 474 and 478 of build-up interconnect structure 483 are formed over that footprint of semiconductor unit 460 such that a portion of surface 471 of encapsulant 468 is exposed from build-up interconnect structure 483. After singulation, a distance between the side surface, or sidewall, of build-up interconnect structure 483 and the outer edge, or sidewall, of encapsulant 468 is greater than 0 μm. Forming build-up interconnect structure 483 over the footprint of semiconductor unit 460 allows reconstituted wafer 466 to be singulated by cutting through only encapsulant 468, thereby eliminating a need to cut through build-up interconnect structure 483, and reducing a risk of damaging the layers of build-up interconnect structure 483 during singulation.

Figure 11:
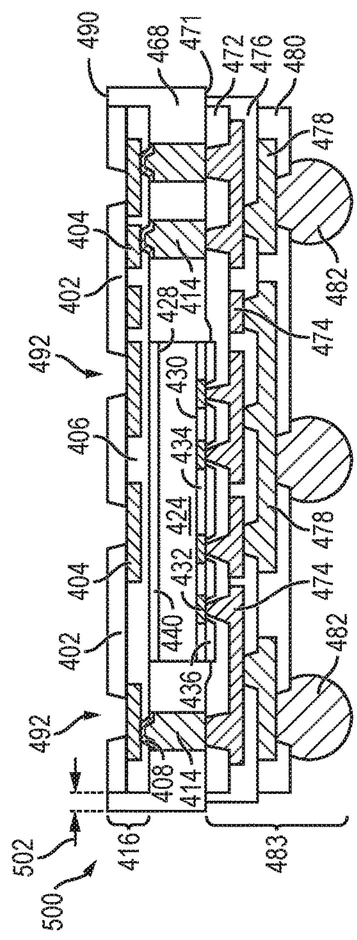
FIG. 11 illustrates a fan-out wafer level package (Fo-WLP) with top and bottom interconnect structures formed using an embedded temporary substrate.

FIG. 11 shows Fo-WLP 500 after singulation. Semiconductor die 424 is electrically connected through conductive layers 474 and 478 to bumps 482 for connection to external devices, for example a PCB. Build-up interconnect structures 416 and 483 route electrical signals between semiconductor die 424, conductive columns 414, and external devices stacked over conductive layer 404. Build-up interconnect structure 416 and conductive columns 414 are formed over substrate 400 prior to mounting semiconductor die 424. Forming build-up interconnect structure 416 and conductive columns 414 over substrate 400 allows established Si substrate fabrication materials and techniques to be utilized during the formation of build-up interconnect structure 416 and conductive columns 414. The established materials and standardized equipment lowers manufacturing costs and capital risk by reducing or eliminating the need for specialized semiconductor processing lines for forming interconnect structures within Fo-WLP 500. Forming conductive columns 414 over substrate 400 eliminates the need for through mold vias or laser drilling through the semiconductor package. Accordingly, forming build-up interconnect structure 416 and conductive columns 414 on substrate 400 minimizes the manufacturing time and cost of Fo-WLP 500, while providing increased flexibility in interconnect location and design.

Build-up interconnect structure 416 and conductive columns 414 are inspected and tested to be known good before additional device integration, which prevents fabrication materials and KGD from being wasted over defective interconnect structures 416. Forming build-up interconnect structure 416 prior to depositing encapsulant 468 reduces the number of manufacturing steps taking place over reconstituted wafer 466, as only interconnect structure 483 is formed over reconstituted wafer 466, i.e., after deposition of encapsulant 468. Reducing the number of manufacturing steps taking place over reconstituted wafer 466 decreases the amount of stress placed on reconstituted wafer 466 and semiconductor die 424 as less insulating and conductive layer fabrication cycles are performed over encapsulated semiconductor die 424.

Semiconductor units 460 are disposed over carrier 462 prior to deposition of encapsulant 468. Disposing individual, or singulated, semiconductor units 460 over carrier 462 allows each semiconductor unit 460 to be tested prior mounting semiconductor units 460 to interface layer 464. Accordingly, only known good semiconductor units 460 are included in reconstituted wafer 466. Encapsulating individual, or singulated, semiconductor units 460 also allows encapsulant 468 to flow between the semiconductor units and around the side surfaces of build-up interconnect structure 416. After singulation of reconstituted wafer 466, encapsulant 468 is disposed around the side surfaces, or sidewalls, of build-up interconnect structure 416 such that a distance 502 between the side surface of build-up interconnect structure 416 and an outer edge of Fo-WLP 500 is greater than 0 μm. Disposing encapsulant 468 around build-up interconnect structure 416 provides structural support and environmentally protects the insulating and conductive layers of build-up interconnect structure 416 from external elements and contaminants.

Substrate 400 is encapsulated within reconstituted wafer 466 to provide structural support during subsequent wafer handling and during the formation of build-up interconnect structure 483. Substrate 400 is a Si substrate and has a CTE similar to the CTE of semiconductor die 424. The similarity in the CTEs of substrate 400 and semiconductor die 424 decreases CTE mismatch within reconstituted wafer 466 and reduces warpage caused by CTE-induced stress. The reduction of warpage and decrease of thermal stress in reconstituted wafer 466 decreases the occurrence of interconnection failures within build-up interconnect structures 416 and 483, thereby increasing the reliability of Fo-WLP 500. Substrate 400 is removed prior to singulation of reconstituted wafer 466. Thus, substrate 400 is able to provide support and reduce warpage during the manufacturing of Fo-WLP 500 without increasing a final height of Fo-WLP 500.

Figure 12A:
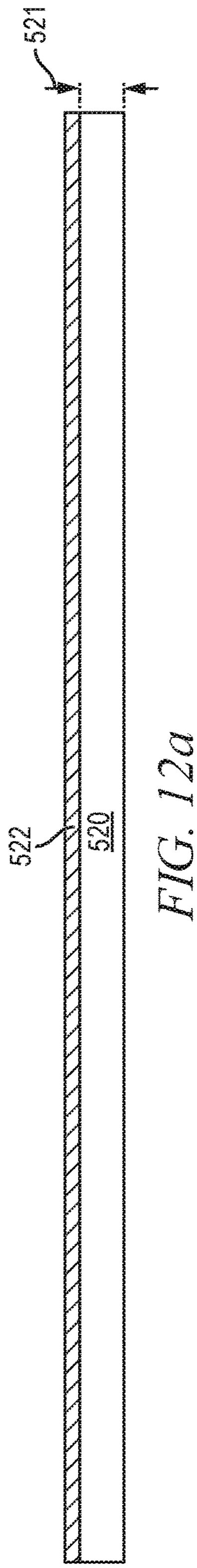
FIGS. 12*a*-12*j* illustrate another process of forming top and bottom build-up interconnect structures using an embedded temporary substrate.

FIGS. 12*a*-12*j* illustrate, in relation to FIG. 1, a process of forming top and bottom interconnect structures in a Fo-WLP using an embedded temporary substrate for warpage control. FIG. 12*a* shows a cross-sectional view of a portion of a substrate 520. Substrate 520 is Si or other material having a CTE similar to the CTE of Si, e.g. within 5 ppm/° C. of the CTE of Si. In one embodiment, an interface layer or double-sided tape is formed over substrate 520 as a temporary adhesive bonding film, etch-stop layer, or thermal release layer. A thickness 521 of substrate 520 is between 200-775 μm. In one embodiment, thickness 521 of substrate 520 is between 300-550 μm.

Figure 12B:
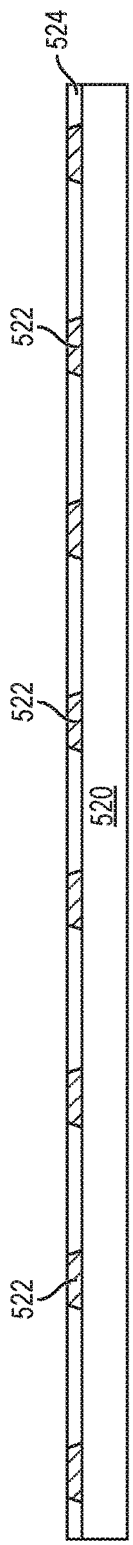

An electrically conductive layer 522 is formed over substrate 520 using lamination, printing, PVD, CVD, sputtering, electrolytic plating, or electroless plating. In one embodiment, conductive layer 522 is Cu foil or RCC. Conductive layer 522 is patterned using an etching process through a patterned photoresist layer or an ink printing process, as shown in FIG. 12*b*. The individual portions of conductive layer or RDL 522 can be electrically common or electrically isolated depending on the design and function of later mounted semiconductor die. In one embodiment, the Cu foil is thinned prior to forming the photoresist, and a selective, semi-additive plating process is used to form patterned conductive layer 522. Alternatively, conductive layer 522 includes one or more layers of Al, Cu, Sn, Ti, Ni, Au, Ag, or other suitable electrically conductive material and is formed over substrate 520 using a patterning and metal deposition process such as lamination, printing, PVD, CVD, sputtering, electrolytic plating, or electroless plating. Conductive layer 522 forms a plurality of interconnect pads for subsequently stacked semiconductor die or components.

An insulating or passivation layer 524 is formed over substrate 520 and conductive layer 522 using PVD, CVD, printing, lamination, spin coating, spray coating, sintering or thermal oxidation. Insulating layer 524 contains one or more layers of $SiO_2$, $Si_3N_4$, SiON, $Ta_2O_5$, $Al_2O_3$, polymer dielectric resist with or without fillers or fibers, or other material having similar insulating and structural properties. A portion of insulating layer 524 is removed by LDA to expose conductive layer 522. Alternatively, a portion of insulating layer 524 is removed by an etching process through a patterned photoresist layer to expose conductive layer 522. Insulating layer 524 may be transparent or semi-transparent. In one embodiment, insulating layer 524 includes a glass cloth, glass cross, filler, or fiber, such as E-glass cloth, T-glass cloth, Al2O3, or silica filler, for enhanced bending strength.

Figure 12C:
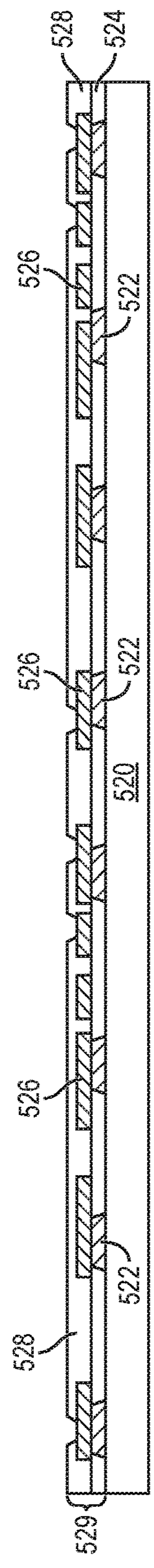

In FIG. 12*c*, an electrically conductive layer or RDL 526 is formed over conductive layer 522 and insulating layer 524 using PVD, CVD, electrolytic plating, electroless plating process, or other suitable metal deposition process. Conductive layer 526 can be one or more layers of Al, Ti, TiW, Cu, Sn, Ni, Au, Ag, or other suitable electrically conductive material. One portion of conductive layer 526 is electrically connected to conductive layer 522. Other portions of conductive layer 526 can be electrically common or electrically isolated depending on the design and function of later mounted semiconductor die.

An insulating or passivation layer 528 is formed over insulating layer 524 and conductive layer 526 using PVD, CVD, printing, lamination, spin coating, spray coating, sintering or thermal oxidation. Insulating layer 528 contains one or more layers of SiO2, Si3N4, SiON, Ta2O5, Al2O3, polymer dielectric resist with or without fillers or fibers, or other material having similar insulating and structural properties. A portion of insulating layer 528 is removed by LDA to expose conductive layer 526. Alternatively, a portion of insulating layer 528 is removed by an etching process through a patterned photoresist layer to expose conductive layer 526. Insulating layer 528 may be transparent or semi-transparent. In one embodiment, insulating layer 528 includes a glass cloth, glass cross, filler, or fiber, such as E-glass cloth, T-glass cloth, Al2O3, or silica filler, for enhanced bending strength.

Collectively, insulating layers 524 and 528, and conductive layers 522 and 526, constitute a build-up interconnect structure 529 formed over Si substrate 520. Build-up interconnect structure 529 may include as few as one RDL or conductive layer, such as conductive layer 522, and one insulating layer, such as insulating layer 524. Additional insulating layers and RDLs can be formed over insulating layer 528, to provide additional vertical and horizontal electrical connectivity across the package according to the design and functionality of the semiconductor device. Additional insulating and metal layers may also be formed within build-up interconnect structure 529 to provide grounding and EMI shielding layers within the semiconductor package.

Figure 12D:
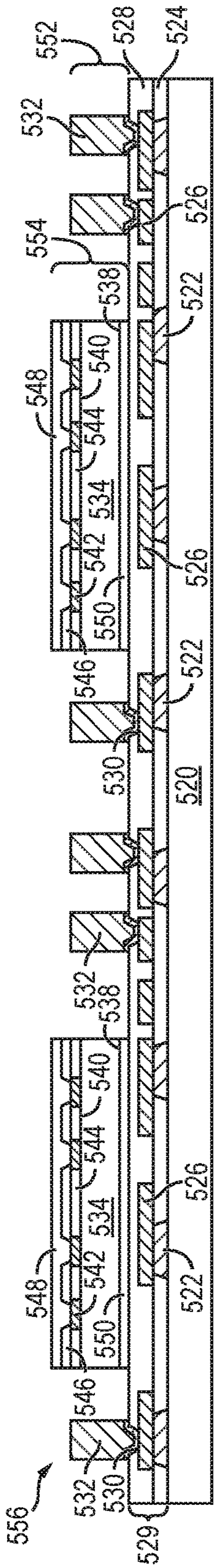

FIG. 12*d* shows conductive columns 532 formed over build-up interconnect structure 529. Columns 532 are formed by depositing an electrically conductive layer 530 over insulating layer 528 and along the exposed portions of conductive layer 526 using a patterning and metal deposition process such as PVD, CVD, sputtering, electrolytic plating, and electroless plating. Conductive layer 530 is a Cu plating seed layer. Seed layer 530 includes Ti/Cu, TiW/Cu, Ni, NiV, Au, Al, or other suitable seed material.

A patterning or photoresist layer is formed over seed layer 530, similar to photoresist layer 410 in FIG. 10*c*. A portion of the photoresist layer is removed by a photolithography and etching process or by LDA to form openings over the removed portions of insulating layer 528. The openings in the photoresist extend to seed layer 530. An electrically conductive material is deposited in the removed portions of the photoresist layer using Cu plating, electrolytic plating, electroless plating, or other suitable metal deposition process to form conductive columns or vertical interconnect structures 532. In one embodiment, columns 532 are formed to a height of at least 75 μm above the surface of insulating layer 528. The remaining portions of the photoresist layer are then stripped leaving conductive columns or vertical interconnect structures 532. After stripping the photoresist, the portions of seed layer 530 outside conductive columns 532 are etched away and a leakage descum is performed. Conductive columns 532 can have a cylindrical shape with a circular or oval cross-section, or conductive columns 532 can have a cubic shape with a rectangular cross-section.

Forming conductive columns 532 over Si substrate 520 provides increased design flexibility and minimizes fabrication costs because the fabrication materials and equipment compatible with Si substrates have a more established infrastructure, i.e., more materials and standardized equipment are available and common to fabrication methods that employ Si substrates. The common materials and standardized equipment lowers manufacturing costs and capital risk by reducing or eliminating the need for specialized semiconductor processing lines based on other substrate materials or methods of forming 3D interconnect structures.

Build-up interconnect structure 529 and conductive columns 532 are inspected and tested to be known good at the wafer level by open/short probe or auto-scope inspection at the present interim stage, i.e., prior to mounting a semiconductor die. Leakage can be tested at a sampling location. Screening for defective interconnections prior to mounting semiconductor die over build-up interconnect structure 529 minimizes KGD die loss as KGD are not wasted over defective interconnect structures.

Semiconductor die 534, as singulated from a semiconductor wafer similar to FIG. 2*a*, are disposed over insulating layer 528 between conductive columns 532.

Semiconductor die 534 are KGD having been tested prior to mounting to build-up interconnect structure 529.

Semiconductor die 534 has a back surface 538 and active surface 540 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 540 to implement analog circuits or digital circuits, such as DSP, ASIC, MEMS, memory, or other signal processing circuit. In one embodiment, active surface 540 contains a MEMS, such as an accelerometer, gyroscope, strain gauge, microphone, or other sensor responsive to various external stimuli. Semiconductor die 534 may also contain IPDs, such as inductors, capacitors, and resistors, for RF signal processing.

An electrically conductive layer 542 is formed over active surface 540 using PVD, CVD, electrolytic plating, electroless plating process, or other suitable metal deposition process. Conductive layer 542 can be one or more layers of Al, Cu, Sn, Ni, Au, Ag, or other suitable electrically conductive material. Conductive layer 542 operates as contact pads electrically connected to the circuits on active surface 540.

An insulating or passivation layer 544 is formed over active surface 540 and conductive layer 542 using PVD, CVD, printing, lamination, spin coating, spray coating, sintering or thermal oxidation. The insulating layer 544 contains one or more layers of SiO2, Si3N4, SiON, Ta2O5, Al2O3, or other material having similar insulating and structural properties. A portion of insulating layer 544 is removed by LDA to expose conductive layer 542.

An optional insulating or protection layer 546 is formed over insulating layer 544 and conductive layer 542 using PVD, CVD, printing, lamination, spin coating, spray coating, sintering or thermal oxidation. The insulating layer 546 contains one or more layers of SiO2, Si3N4, SiON, Ta2O5, Al2O3, or other material having similar insulating and structural properties. The insulating layer 546 protects semiconductor die 534. Alternatively, insulating layers 544 and 546 can be the same layer.

A temporary insulating or protection layer 548 is formed over insulating layer 546 and conductive layer 542 using PVD, CVD, printing, lamination, spin coating, spray coating, sintering or thermal oxidation. The insulating layer 548 contains one or more layers of SiO2, Si3N4, SiON, Ta2O5, Al2O3, or other material having similar insulating and structural properties. The insulating layer 548 protects semiconductor die 534 during handling and subsequent manufacturing steps.

A DAF 550 is disposed over back surface 538 of semiconductor die 534. Alternatively, DAF can be disposed on insulating layer 528 prior to mounting semiconductor die 534. Semiconductor die 534 are disposed on insulating layer 528 using a pick and place operation with back surface 538 oriented toward insulating layer 528.

FIG. 12*d* shows semiconductor die 534 mounted to insulating layer 528 of build-up interconnect structure 529 as a reconstituted wafer 556. In one embodiment, conductive layer 526 is configured to provide an EMI shield within the semiconductor package. Conductive columns 532 are disposed around or in a peripheral region of semiconductor die 534. A height 552 of conductive columns 532 is 0-50 μm less than a height 554 of semiconductor die 534. In one embodiment, the height 552 of conductive column 532 is 10 μm less than the height 554 of semiconductor die 534.

Figure 12E:
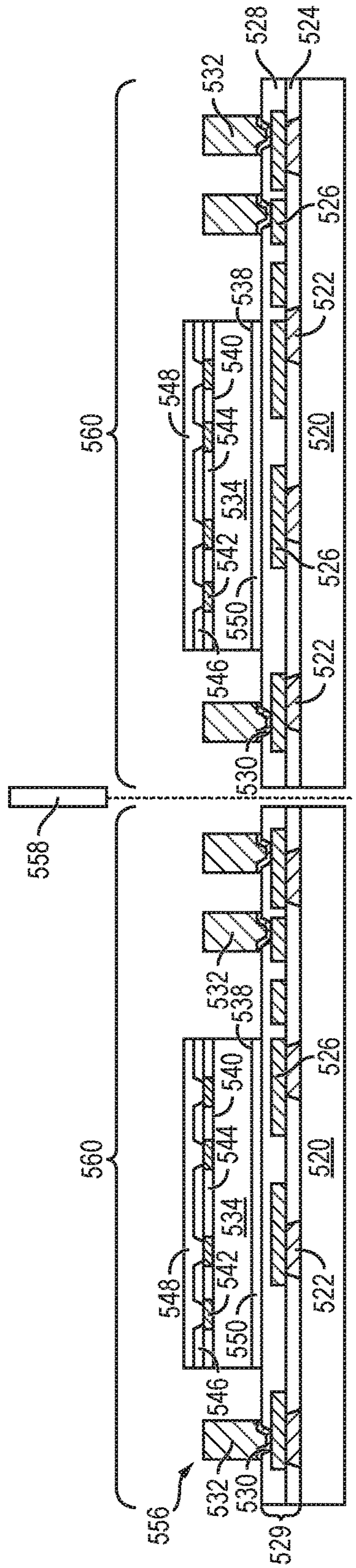

In FIG. 12*e*, reconstituted wafer 556 is singulated into individual semiconductor units 560 using a saw blade or laser cutting tool 558. Semiconductor units 560 each include a semiconductor die 534 disposed over build-up interconnect structure 529 and Si substrate 520 with conductive columns 532 disposed around semiconductor die 534. Conductive columns 532 are electrically connected to conductive layers 526 and 522 to provide vertical or 3D electrical interconnect for subsequent PoP fabrication. Substrate 520 provides structural support during subsequent handling of semiconductor units 560 and fabrication processes performed over semiconductor units 560.

Figure 12F:
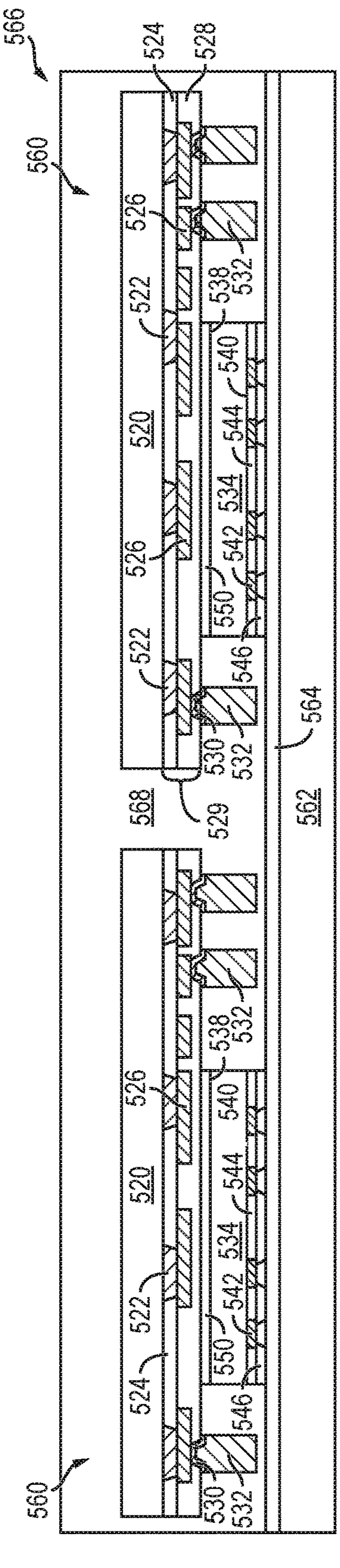

In FIG. 12*f*, semiconductor units 560 from FIG. 12*e* are mounted to a carrier 562 and interface layer 564 using, for example, a pick and place operation with insulating layer 546 and conductive columns 532 oriented toward the carrier. In one embodiment, temporary protective layer 548 is removed from over semiconductor die 534 prior to disposing semiconductor unit 560 over carrier 562. In other embodiments, temporary protective layer 548 remains over semiconductor die 534 until later in the manufacturing process.

Carrier or temporary substrate 562 contains a sacrificial base material such as silicon, polymer, beryllium oxide, glass, or other suitable low-cost, rigid material for structural support. Interface layer or double-sided tape 564 is formed over carrier 562 as a temporary adhesive bonding film, etch-stop layer, or thermal release layer.

Semiconductor units 560 mounted to interface layer 564 of carrier 562 form a reconstituted or reconfigured wafer 566.

Reconstituted wafer 566 is configured according to the specifications of the resulting final semiconductor package. In one embodiment, semiconductor units 560 are separated by a distance of 100 μm or greater over carrier 562.

An encapsulant or molding compound 568 is deposited over semiconductor units 560 and carrier 562 using a paste printing, compressive molding, transfer molding, liquid encapsulant molding, vacuum lamination, spin coating, or other suitable applicator. Encapsulant 568 can be polymer composite material, such as epoxy resin with filler, epoxy acrylate with filler, or polymer with proper filler. Encapsulant 568 has a filler size of 55 μm or less. In one embodiment, encapsulant 568 has a filler size of 30 μm or less. The small filler size allows encapsulant 568 to easily flow between semiconductor units 560 and interface layer 564, i.e., into the area between insulating layer 528 and interface layer 564. Encapsulant 568 flows around conductive columns 532 and semiconductor die 534. Encapsulant 568 also flows between interface layer 564 and the surface of conductive columns 532 that is opposite seed layer 530 due to the height of conductive columns 532 being less than the height of semiconductor die 534. Encapsulant 568 is non-conductive and environmentally protects the semiconductor device from external elements and contaminants. Encapsulant 568 also protects semiconductor die 534 from degradation due to exposure to light.

Figure 12G:
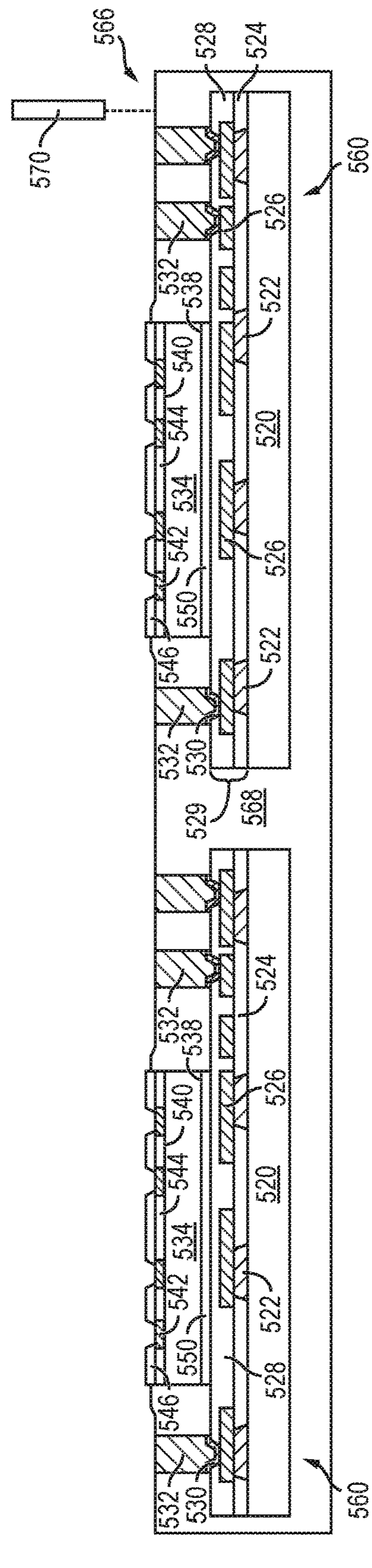

In FIG. 12*g*, carrier 562 and interface layer 564 are removed by chemical etching, mechanical peeling, CMP, mechanical grinding, thermal bake, UV light, laser scanning, or wet stripping to expose insulating layer 546 and conductive layer 542 of semiconductor die 534. In one embodiment, protective layer 548 of semiconductor die 534 is removed from over insulating layer 546 after debonding carrier 562 and interface layer 564.

A portion of encapsulant 568 is removed by LDA using laser 570 to expose conductive columns 532. Alternately, encapsulant 568 can be removed from over conductive columns 532 by grinding or other suitable removal process.

Figure 12H:
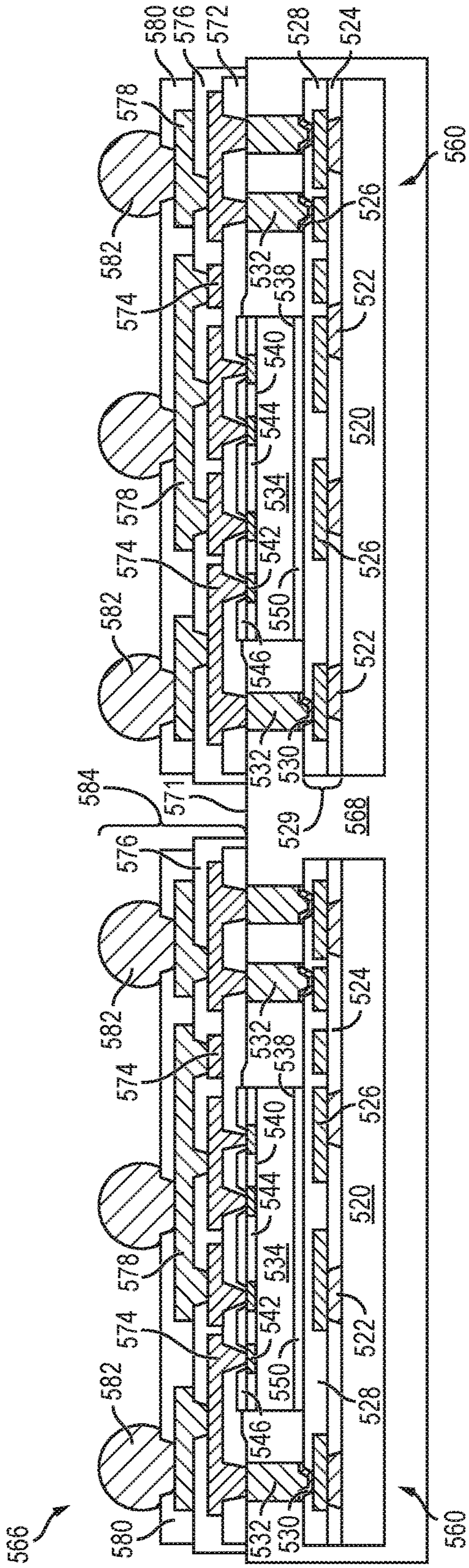

In FIG. 12*h*, an insulating or passivation layer 572 is formed over encapsulant 568, conductive columns 532, and insulating layer 546 and conductive layer 542 of semiconductor die 534 using PVD, CVD, printing, spin coating, spray coating, screen printing or lamination. Insulating layer 572 can be one or more layers of SiO2, Si3N4, SiON, Ta2O5, Al2O3, or other material having similar insulating and structural properties. In one embodiment, insulating layer 572 is a photosensitive dielectric polymer low-cured at less than 200° C. A portion of insulating layer 572 is removed by an etching process with a patterned photoresist layer or by LDA to form openings over and exposing conductive layer 542 and conductive columns 532. In one embodiment, insulating layer 572 is formed over a footprint of semiconductor unit 560 and does not extend outside the footprint of semiconductor unit 560. In other words, the portions of surface 571 of encapsulant 568 in a peripheral region of semiconductor unit 560 adjacent to semiconductor unit 560 are devoid of insulating layer 572. In another embodiment, insulating layer 572 is formed continuously over insulating layer 546, conductive layer 542, conductive columns 532, and encapsulant 568, and a portion of insulating layer 572 is removed from over the portions of surface 571 that are outside the footprint of semiconductor unit 560 by an etching process with a patterned photoresist layer or by LDA. In other embodiments, insulating layer 572 is formed over and remains over the portions of surface 571 of encapsulant 568 that are outside the footprint of semiconductor unit 560.

An electrically conductive layer or RDL 574 is formed over insulating layer 572, conductive layer 542, and conductive columns 532 using a patterning and metal deposition process such as printing, PVD, CVD, sputtering, electrolytic plating, and electroless plating. Conductive layer 574 can be one or more layers of Al, Cu, Sn, Ti, Ni, Au, Ag, W, or other suitable electrically conductive material. A portion of conductive layer 574 extends horizontally along insulating layer 572 and parallel to active surface 540 of semiconductor die 534 to laterally redistribute the electrical interconnect to conductive layer 542 and conductive columns 532. A portion of conductive layer 574 is electrically connected to conductive layer 542. A portion of conductive layer 574 is electrically connected to conductive columns 532. Other portions of conductive layer 574 are electrically common or electrically isolated depending on the design and function of the semiconductor device. In one embodiment, conductive layer 574 is formed over the footprint of semiconductor unit 560 and does not extend over the portions of surface 571 of encapsulant 568 that are outside the footprint of semiconductor unit 560. In other words, a peripheral region of semiconductor unit 560 adjacent to semiconductor unit 560 is devoid of conductive layer 574. In other embodiments, conductive layer 574 extends over the portions of surface 571 of encapsulant 568 that are outside the footprint of semiconductor unit 560.

An insulating or passivation layer 576 is formed over insulating layer 572 and conductive layer 574 using PVD, CVD, printing, spin coating, spray coating, screen printing or lamination. Insulating layer 576 can be one or more layers of SiO2, Si3N4, SiON, Ta2O5, Al2O3, or other material having similar insulating and structural properties. In one embodiment, insulating layer 576 is a photosensitive dielectric polymer low-cured at less than 200° C. A portion of insulating layer 576 is removed by an etching process with a patterned photoresist layer or by LDA to form openings exposing conductive layer 574. In one embodiment, insulating layer 576 is formed within the footprint of semiconductor unit 560 and does not extend over the portions of surface 571 of encapsulant 568 that are outside the footprint of semiconductor unit 560. In other words, the portions of surface 571 of encapsulant 568 in a peripheral region of semiconductor unit 560 remain exposed from insulating layer 576. In another embodiment, insulating layer 576 is formed over insulating layer 572, conductive layer 574, and encapsulant 568, and a portion of insulating layer 576 is removed from over the portion of surface 571 that is outside the footprint of semiconductor unit 560 by an etching process with a patterned photoresist layer or by LDA. In other embodiments, insulating layer 576 is formed over and remains over the portions of surface 571 of encapsulant 568 that are outside the footprint of semiconductor unit 560.

An electrically conductive layer or RDL 578 is formed over insulating layer 576 and conductive layer 574 using a patterning and metal deposition process such as printing, PVD, CVD, sputtering, electrolytic plating, and electroless plating. Conductive layer 578 can be one or more layers of Al, Cu, Sn, Ti, Ni, Au, Ag, W, or other suitable electrically conductive material. A portion of conductive layer 578 extends horizontally along insulating layer 576 and parallel to active surface 540 of semiconductor die 534 to laterally redistribute the electrical interconnect to conductive layer 574. A portion of conductive layer 578 is electrically connected to conductive layer 574. Other portions of conductive layer 578 are electrically common or electrically isolated depending on the design and function of the semiconductor device. In one embodiment, conductive layer 578 is formed over the footprint of semiconductor unit 560 and does not extend over the portions of surface 571 of encapsulant 568 that are outside the footprint of semiconductor unit 560. In other embodiments, conductive layer 578 extends over portions of surface 571 of encapsulant 568 that are outside the footprint of semiconductor unit 560.

An insulating or passivation layer 580 is formed over insulating layer 576 and conductive layer 578 using PVD, CVD, printing, spin coating, spray coating, screen printing or lamination. Insulating layer 580 can be one or more layers of SiO2, Si3N4, SiON, Ta2O5, Al2O3, or other material having similar insulating and structural properties. In one embodiment, insulating layer 580 is a photosensitive dielectric polymer low-cured at less than 200° C. A portion of insulating layer 580 is removed by an etching process with a patterned photoresist layer or by LDA to form openings exposing conductive layer 578. In one embodiment, insulating layer 580 is formed within the footprint of semiconductor unit 560 and does not extend over the portions of surface 571 of encapsulant 568 that are outside the footprint of semiconductor unit 560. In other words, the portions of surface 571 of encapsulant 568 in a peripheral region of semiconductor unit 560 remain exposed from insulating layer 580. In another embodiment, insulating layer 580 is formed continuously over insulating layer 576, conductive layer 578, and encapsulant 568, and a portion of insulating layer 580 is removed from over the portions of surface 571 that are outside the footprint of semiconductor unit 560 by an etching process with a patterned photoresist layer or by LDA. In other embodiments, insulating layer 580 is formed over and remains over the portions of surface 571 of encapsulant 568 that are outside the footprint of semiconductor unit 560.

An electrically conductive bump material is deposited over conductive layer 578 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 578 using a suitable attachment or bonding process. In one embodiment, the bump material is reflowed by heating the material above the material's melting point to form balls or bumps 582. In some applications, bumps 582 are reflowed a second time to improve electrical contact to conductive layer 578. In one embodiment, bumps 582 are formed over a UBM having a wetting layer, barrier layer, and adhesive layer. Bumps 582 can also be compression bonded or thermocompression bonded to conductive layer 578. Bumps 582 represent one type of interconnect structure that can be formed over conductive layer 578. The interconnect structure can also use bond wires, conductive paste, stud bump, micro bump, or other electrical interconnect.

Collectively, insulating layers 572, 576, and 580, conductive layers 574 and 578, and bumps 582 constitute a build-up interconnect structure 584 formed over semiconductor unit 560. Build-up interconnect structure 584 may include as few as one RDL or conductive layer, such as conductive layer 574, and one insulating layer, such as insulating layer 572. Additional insulating layers and RDLs can be formed over insulating layer 580 prior to forming bumps 582, to provide additional vertical and horizontal electrical connectivity across the package according to the design and functionality of the semiconductor device. Additional insulating and metal layers may also be formed within build-up interconnect structure 584 to provide grounding and EMI shielding layers within the semiconductor package. Build-up interconnect structure 584 is inspected and tested to be known good at an interim stage, i.e., prior to additional device integration, see FIG. 9.

Substrate 520 is present during the formation of build-up interconnect structure 584. Substrate 520 provides support during formation of build-up interconnect structure 584 and decreases warpage of reconstituted wafer 566. The decreased warpage increases the reliability of interconnect structures 529 and 584, i.e., decreases a likelihood and occurrence of defective interconnections within build-up interconnect structures 529 and 584 and between conductive columns 532 and build-up interconnect structures 529 and 584.

Figure 12I:
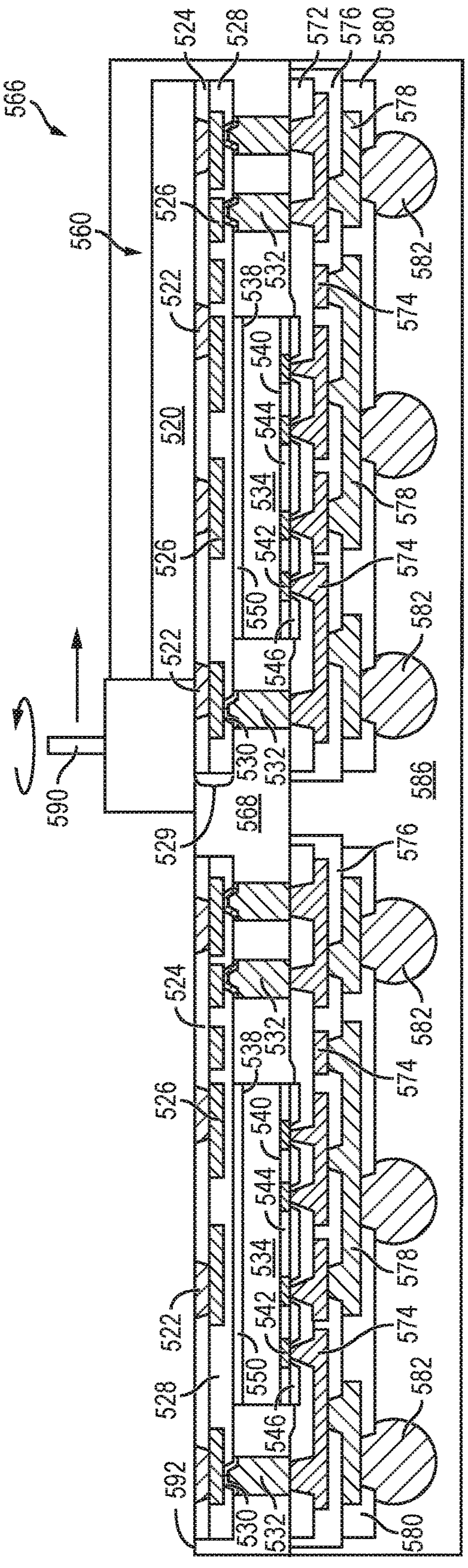

In FIG. 12*i*, a backgrinding tape or support carrier 586 is applied over interconnect structure 584 and in contact with insulating layer 580 and bumps 582. Substrate 520 of semiconductor unit 560 and a portion of encapsulant 568 are then removed in a grinding operation using grinder 590. The removal of substrate 520 exposes conductive layer 522 and insulating layer 524 of semiconductor unit 560. After grinding, a new back surface 592 of encapsulant 568 is coplanar with the surfaces of insulating layer 524 and conductive layer 522. Exposed conductive layer 522 provides interconnect pads for subsequent electrical interconnect of semiconductor die or devices, for example, memory devices, passive devices, saw filters, inductors, antenna, etc., stacked over semiconductor die 534. In one embodiment, a finish such as Cu OSP is applied to the exposed portions of conductive layer 522 to prevent Cu oxidation.

Figure 12J:
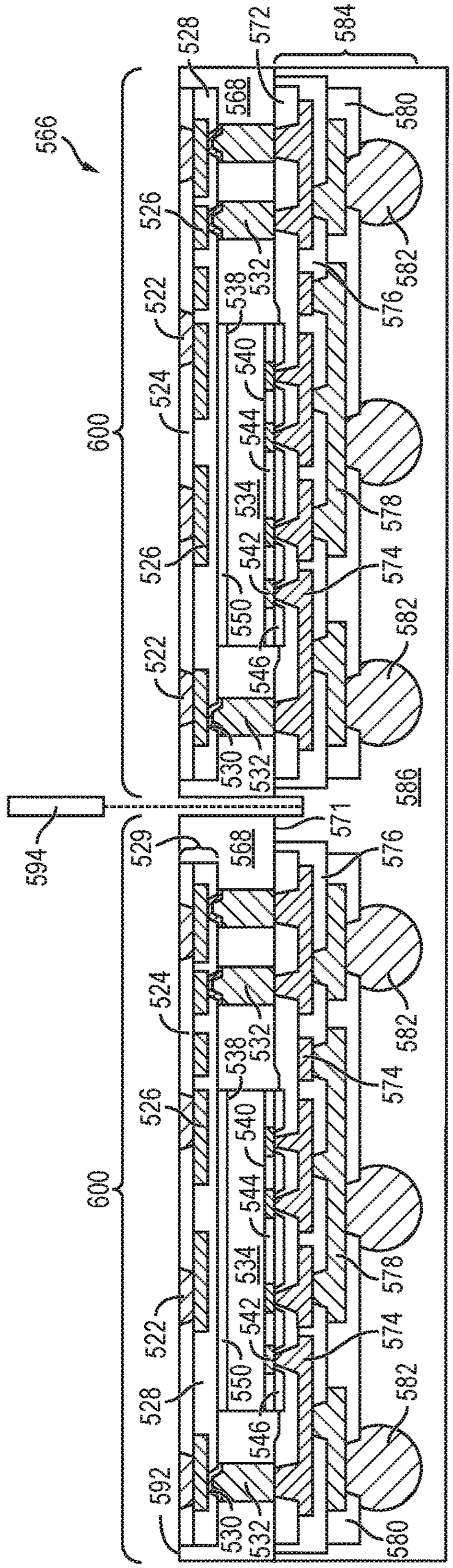

In FIG. 12*j*, reconstituted wafer 566 is singulated through encapsulant 568 using a saw blade or laser cutting tool 594 into individual Fo-WLPs 600. Insulating layers 572, 576, and 580, and conductive layers 574 and 578 of build-up interconnect structure 584 are formed over a footprint of semiconductor unit 560 such that a portion of surface 571 of encapsulant 568 is exposed from build-up interconnect structure 584. After singulation, a distance between a side surface, or sidewall, of build-up interconnect structure 584 and the outer edge, or sidewall, of encapsulant 568 is greater than 0 μm. Forming build-up interconnect structure 584 over the footprint of semiconductor unit 560 allows reconstituted wafer 566 to be singulated by cutting through only encapsulant 568, thereby eliminating a need to cut through build-up interconnect structure 584, and reducing a risk of damaging the layers of build-up interconnect structure 584 during singulation.

Figure 13:
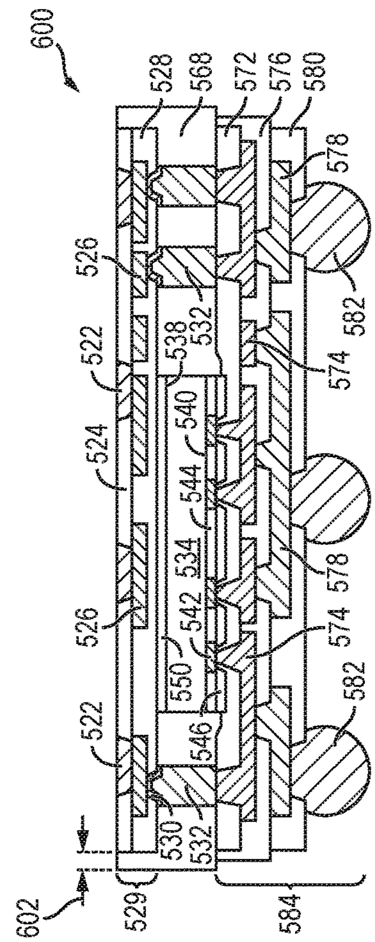
FIG. 13 illustrates a Fo-WLP with top and bottom interconnect structures formed using an embedded temporary substrate.

FIG. 13 shows Fo-WLP 600 after singulation. Semiconductor die 534 is electrically connected through conductive layers 574 and 578 to bumps 582 for connection to external devices, for example a PCB. Build-up interconnect structures 529 and 584 route electrical signals between semiconductor die 534, conductive columns 532, and external devices stacked over conductive layer 522. Build-up interconnect structure 529 and conductive columns 532 are formed over substrate 520 prior to mounting semiconductor die 534. Forming build-up interconnect structure 529 and conductive columns 532 over substrate 520 allows established Si substrate fabrication materials and techniques to be utilized during the formation of build-up interconnect structure 529 and conductive columns 532. The established materials and standardized equipment lowers manufacturing costs and capital risk by reducing or eliminating the need for specialized semiconductor processing lines for forming interconnect structures within Fo-WLP 600. Forming conductive columns 532 over substrate 520 provides vertical or 3D interconnection within Fo-WLP 600 without requiring laser drilling through the semiconductor package. Accordingly, forming build-up interconnect structure 529 and conductive columns 532 on substrate 520 minimizes the manufacturing time and cost of Fo-WLP 600, while providing increased flexibility in interconnect location and design.

Build-up interconnect structure 529 and conductive columns 532 are inspected and tested to be known good before additional device integration, which prevents fabrication materials and KGD from being wasted over defective interconnect structures 529. Forming build-up interconnect structure 529 prior to depositing encapsulant 568 also reduces the number of manufacturing steps taking place over reconstituted wafer 566, as only interconnect structure 584 is formed over reconstituted wafer 566, i.e., after deposition of encapsulant 568. Reducing the number of manufacturing steps taking place over reconstituted wafer 566 decreases the amount of stress placed on reconstituted wafer 566 and semiconductor die 534 as less insulating and conductive layer fabrication cycles are performed over encapsulated semiconductor die 534.

Semiconductor units 560 are disposed over carrier 562 prior to deposition of encapsulant 568. Disposing individual, or singulated, semiconductor units 560 over carrier 562 allows each semiconductor unit 560 to be tested prior mounting semiconductor units 560 to interface layer 564. Accordingly, only known good semiconductor units 560 are included in reconstituted wafer 566. Encapsulating individual, or singulated, semiconductor units 560 also allows encapsulant 568 to flow between the semiconductor units and around the side surfaces, or sidewalls, of build-up interconnect structure 529. After singulation of reconstituted wafer 566, encapsulant 568 is disposed around the side surfaces of build-up interconnect structure 529 such that a distance 602 between the side surface of build-up interconnect structure 529 and an outer edge of Fo-WLP 600 is greater than 0 μm. Disposing encapsulant 568 around build-up interconnect structure 529 provides structural support and environmentally protects the insulating and conductive layers of build-up interconnect structure 529 from external elements and contaminants.

Substrate 520 is encapsulated within reconstituted wafer 566 to provide structural support during subsequent wafer handling and during the formation of build-up interconnect structure 584. Substrate 520 is a Si substrate and has a CTE similar to the CTE of semiconductor die 534. The similarity in the CTEs of substrate 520 and semiconductor die 534 decreases CTE mismatch within reconstituted wafer 566 and reduces warpage caused by CTE-induced stress. The reduction of warpage and decrease of thermal stress in reconstituted wafer 566 decreases the occurrence of interconnection failures within build-up interconnect structures 529 and 584, thereby increasing the reliability of Fo-WLP 600. Substrate 520 is removed prior to singulation of reconstituted wafer 566. Thus, substrate 520 is able to provide support and reduce warpage during the manufacturing of Fo-WLP 600 without increasing a final height of Fo-WLP 600.

Figure 14A:
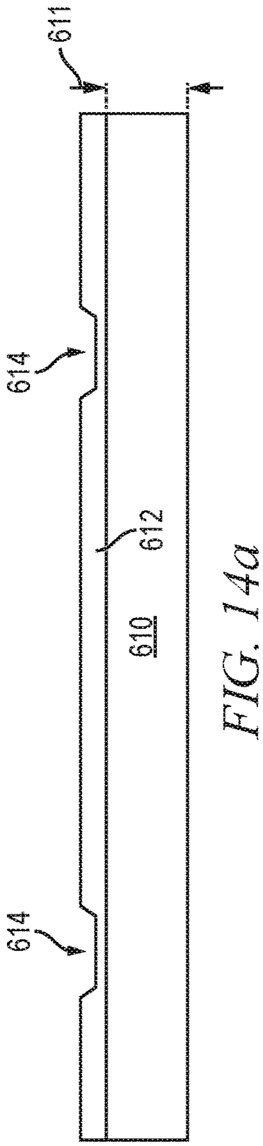
FIGS. 14*a*-14*m* illustrate another process of forming top and bottom build-up interconnect structures using an embedded temporary substrate.

FIGS. 14*a*-14*m* illustrate, in relation to FIG. 1, a process of forming top and bottom interconnect structures in a Fo-WLP using an embedded temporary substrate for warpage control. FIG. 14*a* shows a cross-sectional view of a portion of a substrate 610. Substrate 610 is Si or other material having a CTE similar to the CTE of Si, e.g. within 5 ppm/° C. of the CTE of Si. In one embodiment, an interface layer or double-sided tape is formed over substrate 610 as a temporary adhesive bonding film, etch-stop layer, or thermal release layer. A thickness 611 of substrate 610 is between 200-775 μm. In one embodiment, thickness 611 of substrate 610 is between 300-550 μm.

An insulating or passivation layer 612 is formed over substrate 610 using PVD, CVD, printing, lamination, spin coating, spray coating, sintering or thermal oxidation. The insulating layer 612 contains one or more layers of SiO2, Si3N4, SiON, Ta2O5, Al2O3, polymer dielectric resist with or without fillers or fibers, or other material having similar insulating and structural properties. Insulating layer 612 may be transparent or semi-transparent. In one embodiment, insulating layer 612 includes a glass cloth, glass cross, filler, or fiber, such as E-glass cloth, T-glass cloth, Al2O3, or silica filler, for enhanced bending strength. A plurality of grooves 614 is formed in insulating layer 612 using an etching process with a patterned photoresist layer or by LDA. Grooves 614 extend partially through insulating layer 612 such that a portion of insulating layer 612 remains between the bottom of grooves 614 and substrate 610. In one embodiment, grooves 614 are formed completely through insulating layer 612 and expose the surface of substrate 610.

Figure 14B:
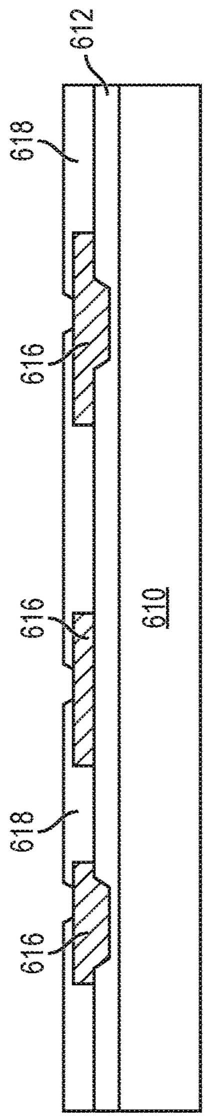

In FIG. 14*b*, an electrically conductive layer or RDL 616 is formed over insulating layer 612 and within grooves 614 using a patterning and metal deposition process such as sputtering, electrolytic plating, electroless plating, or Cu foil lamination. Conductive layer 616 can be one or more layers of Al, Cu, Sn, Ni, Au, Ag, or other suitable electrically conductive material. Alternatively, insulating layer 612 and conductive layer 616, with an optional Cu layer formed under insulating layer 612, together provide an RCC tape or prepreg sheet laminated on substrate 610. Conductive layer 616 is patterned with optional etch-thinning process before patterning.

An insulating or passivation layer 618 is formed over insulating layer 612 and conductive layer 616 using PVD, CVD, printing, lamination, spin coating, spray coating, sintering or thermal oxidation. The insulating layer 618 contains one or more layers of SiO2, Si3N4, SiON, Ta2O5, Al2O3, polymer dielectric resist with or without fillers or fibers, or other material having similar insulating and structural properties. A portion of insulating layer 618 is removed by LDA from over conductive layer 616. Alternatively, a portion of insulating layer 618 is removed by an etching process through a patterned photoresist layer to expose conductive layer 616. In one embodiment, insulating layer 618 includes a glass cloth, glass cross, filler, or fiber, such as E-glass cloth, T-glass cloth, Al2O3, or silica filler, for enhanced bending strength.

Figure 14C:
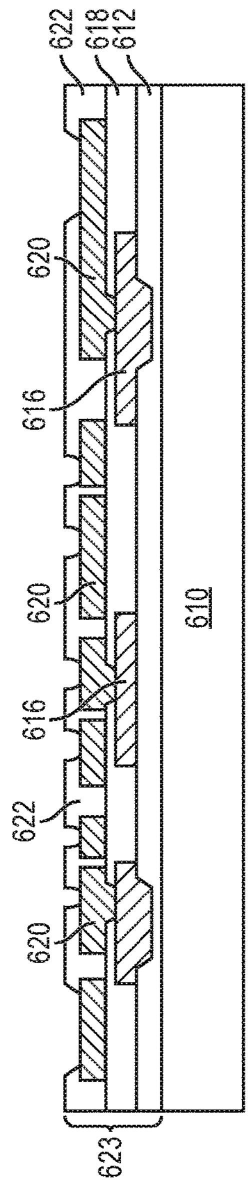

In FIG. 14*c*, an electrically conductive layer or RDL 620 is formed over conductive layer 616 and insulating layer 618 using a patterning and metal deposition process such as printing, PVD, CVD, sputtering, electrolytic plating, and electroless plating. Conductive layer 620 can be one or more layers of Al, Cu, Sn, Ni, Au, Ag, or other suitable electrically conductive material. One portion of conductive layer 620 is electrically connected to conductive layer 616. Other portions of conductive layer 620 can be electrically common or electrically isolated depending on the design and function of later mounted semiconductor die.

An insulating or passivation layer 622 is formed over insulating layer 618 and conductive layer 620 using PVD, CVD, printing, lamination, spin coating, spray coating, sintering or thermal oxidation. The insulating layer 622 contains one or more layers of SiO2, Si3N4, SiON, Ta2O5, Al2O3, polymer dielectric resist with or without fillers or fibers, or other material having similar insulating and structural properties. A portion of insulating layer 622 is removed by LDA to expose conductive layer 620. Alternatively, a portion of insulating layer 622 is removed from over conductive layer 620 using an etching process through a patterned photoresist layer.

The combination of insulating layers 612, 618, and 622 and conductive layers 616 and 620 constitutes a build-up interconnect structure 623 formed over substrate 610. Build-up interconnect structure 623 may include as few as one RDL or conductive layer, such as conductive layer 616, and one insulating layer, such as insulating layer 618. Additional insulating layers and RDLs can be formed over insulating layer 622 to provide additional vertical and horizontal electrical connectivity across the package according to the design and functionality of the semiconductor package. Additional insulating and metal layers may also be formed within build-up interconnect structure 623 to provide grounding and EMI shielding layers within the semiconductor package. The build-up interconnect structure 623 is inspected and tested to be known good at the wafer level by open/short probe or auto-scope inspection at the present interim stage, i.e., prior to mounting a semiconductor die. Leakage can be tested at a sampling location.

Figure 14D:
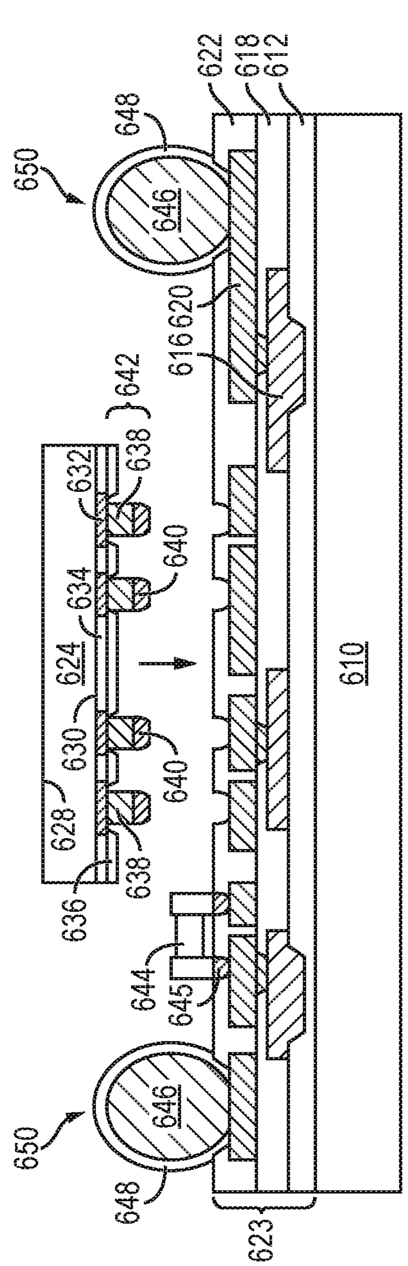

In FIG. 14*d*, a 3D interconnect structure 650 is formed over conductive layer 620 by ball mounting process with optional solder paste. The 3D interconnect structure 650 includes an inner conductive alloy bump 646, such as Cu or Al, and protective layer 648, such as solder alloy SAC305, Cu, polymer, or plastic. Alternatively, an electrically conductive bump material is deposited over conductive layer 620 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 620 using a suitable attachment or bonding process. In one embodiment, the bump material is reflowed by heating the material above the material's melting point to form balls or bumps. In some applications, the bumps are reflowed a second time to improve electrical contact to conductive layer 620. The bumps can also be compression bonded or thermocompression bonded to conductive layer 620. In one embodiment, 3D interconnect structure 650 are formed over a UBM having a wetting layer, barrier layer, and adhesive layer. Conductive alloy bump 646 with protective layer 648 represent one type of 3D interconnect structure that can be formed over conductive layer 620. The interconnect structure can also use stud bump, conductive column, or other vertical interconnect structure.

Forming build-up interconnect structure 623 and 3D interconnect structures 650 over Si substrate 610 provides increased design flexibility and minimizes fabrication costs because the fabrication materials and equipment compatible with Si substrates have a more established infrastructure, i.e., more materials and standardized equipment are available and common to fabrication methods that employ Si substrates. The common materials and standardized equipment lowers manufacturing costs and capital risk by reducing or eliminating the need for specialized semiconductor processing lines based on other substrate materials or methods of forming 3D interconnect structures.

Semiconductor die 624, as singulated from a semiconductor wafer similar to FIG. 2*a*, are disposed over insulating layer 622. Semiconductor die 624 are KGD having been tested prior to mounting to build-up interconnect structure 623.

Semiconductor die 624 has a back surface 628 and active surface 630 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 630 to implement analog circuits or digital circuits, such as DSP, ASIC, MEMS, memory, or other signal processing circuit. In one embodiment, active surface 630 contains a MEMS, such as an accelerometer, gyroscope, strain gauge, microphone, or other sensor responsive to various external stimuli. Semiconductor die 624 may also contain IPDs, such as inductors, capacitors, and resistors, for RF signal processing.

An electrically conductive layer 632 is formed over active surface 630 using PVD, CVD, electrolytic plating, electroless plating process, or other suitable metal deposition process. Conductive layer 632 can be one or more layers of Al, Cu, Sn, Ni, Au, Ag, or other suitable electrically conductive material. Conductive layer 632 operates as contact pads electrically connected to the circuits on active surface 630.

An insulating or passivation layer 634 is formed over active surface 630 and conductive layer 632 using PVD, CVD, printing, lamination, spin coating, spray coating, sintering or thermal oxidation. The insulating layer 634 contains one or more layers of SiO2, Si3N4, SiON, Ta2O5, Al2O3, or other material having similar insulating and structural properties. A portion of insulating layer 634 is removed by LDA to expose conductive layer 632.

An optional insulating or protection layer 636 is formed over insulating layer 634 and conductive layer 632 using PVD, CVD, printing, lamination, spin coating, spray coating, sintering or thermal oxidation. The insulating layer 636 contains one or more layers of SiO2, Si3N4, SiON, Ta2O5, Al2O3, or other material having similar insulating and structural properties. The insulating layer 636 protects semiconductor die 624. Alternatively, insulating layers 634 and 636 can be the same layer.

A plurality of conductive pillars 638 are formed over conductive layer 632. Conductive pillars 638 are formed by depositing a patterning or photoresist layer over insulating layer 636. A portion of the photoresist layer is removed by an etching process to form vias down to conductive layer 632. Alternatively, a portion of the photoresist layer is removed by LDA to form vias exposing conductive layer 632. An electrically conductive material is deposited within the vias over conductive layer 632 using an evaporation, sputtering, electrolytic plating, electroless plating, screen printing, or other suitable metal deposition process. The conductive material can be Cu, Al, W, Au, solder, or other suitable electrically conductive material. In one embodiment, the conductive material is deposited by plating Cu in the vias. The photoresist layer is removed to leave individual conductive pillars 638. Conductive pillars 638 can have a cylindrical shape with a circular or oval cross-section, or conductive pillars 638 can have a cubic shape with a rectangular cross-section. In another embodiment, conductive pillars 638 are implemented with stacked bumps or stud bumps.

An electrically conductive bump material is deposited over conductive pillars 638 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded bump cap 640. The combination of conductive pillars 638 and bump cap 640 constitutes a composite interconnect structure 642 with a non-fusible portion (conductive pillar 638) and a fusible portion (bump cap 640). In one embodiment, composite interconnect structures 642 are formed over a UBM having a wetting layer, barrier layer, and adhesive layer. Composite interconnect structures 642 represent one type of interconnect structure that can be formed over semiconductor die 624. The interconnect structure can also use bond wire, bumps, conductive paste, stud bump, micro bump, or other electrical interconnect.

Semiconductor die 624 are disposed over build-up interconnect structure 623 using, for example, a pick and place operation with interconnect structures 642 oriented toward the build-up interconnect structure. A discrete semiconductor device 644 is metallurgically and electrically coupled to conductive layer 620 using conductive paste 645. Discrete semiconductor device 644 can be an inductor, capacitor, resistor, transistor, or diode.

Figure 14E:
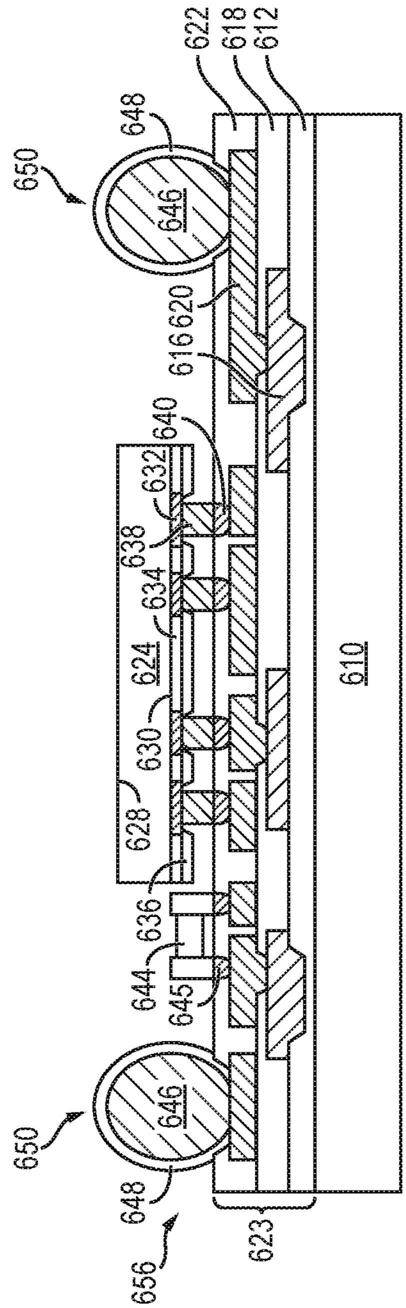

FIG. 14*e* shows semiconductor die 624 mounted to build-up interconnect structure 623 as a reconstituted wafer 656. Bumps 640 are metallurgically and electrically coupled to conductive layer 620. Semiconductor die 624 is a KGD having been tested prior to mounting to build-up interconnect structure 623. In one embodiment, an underfill material, such as an epoxy resin with fillers, is deposited between semiconductor die 624 and build-up interconnect structure 623. Alternatively, underfill may be applied as NCP or NCF on semiconductor die 624 before singulation of the die.

Figure 14F:
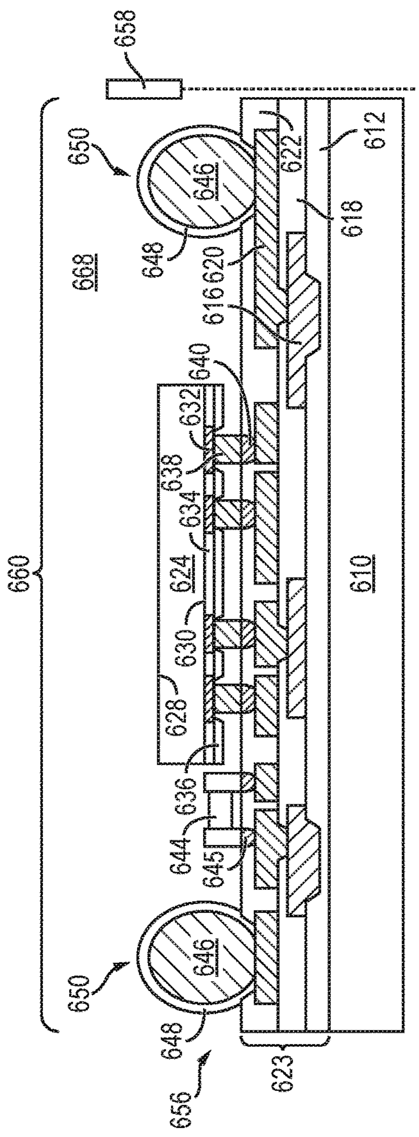

In FIG. 14*f*, reconstituted wafer 656 is singulated into individual semiconductor units 660 using a saw blade or laser cutting tool 658. Semiconductor units 660 each include a semiconductor die 624 and a discrete device 644 disposed over build-up interconnect structure 623 and Si substrate 610 with 3D interconnect structures 650 disposed around semiconductor die 624 and discrete device 644. 3D interconnect structures 650 are electrically connected to conductive layers 616 and 620 to provide vertical or 3D electrical interconnect for subsequent PoP fabrication. Substrate 610 provides structural support during subsequent handling of semiconductor units 660 and fabrication processes performed over semiconductor units 660.

Figure 14G:
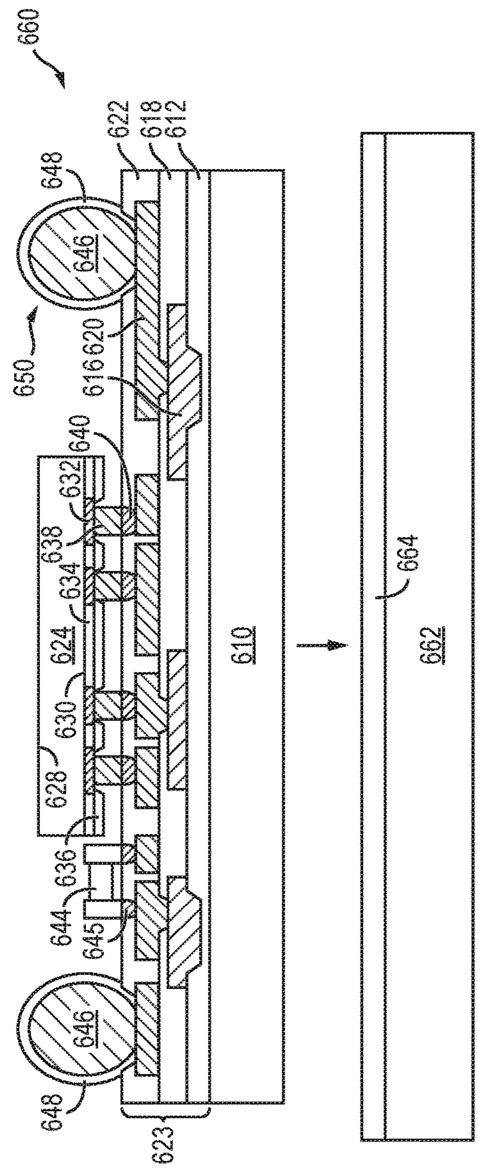

In FIG. 14*g*, semiconductor units 660 including substrate 610 are disposed over a carrier 662 and interface layer 664 using, for example, a pick and place operation with substrate 610 oriented toward the carrier. Carrier or temporary substrate 662 contains a sacrificial base material such as silicon, polymer, beryllium oxide, glass, or other suitable low-cost, rigid material for structural support. Interface layer or double-sided tape 664 is formed over carrier 662 as a temporary adhesive bonding film, etch-stop layer, or thermal release layer.

Figure 14H:
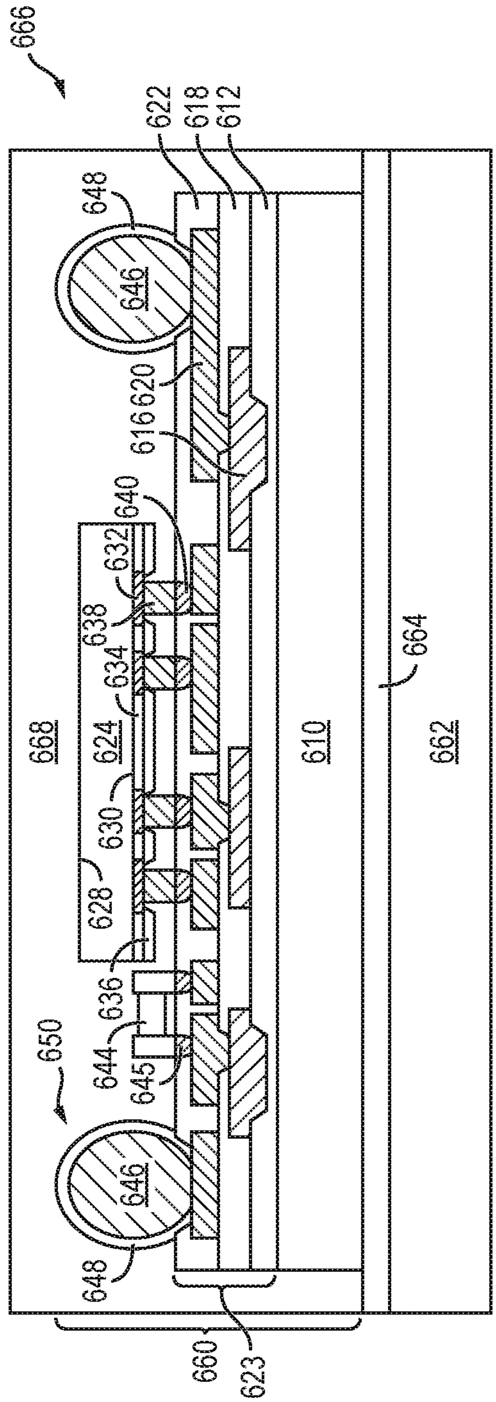

FIG. 14*h* shows semiconductor units 660 mounted to interface layer 664 on carrier 662 as a reconstituted or reconfigured wafer 666. Reconstituted wafer 666 is configured according to the specifications of the resulting final semiconductor package. In one embodiment, adjacent semiconductor units 660 in reconstituted wafer 666 are separated by a distance of 100 μm or greater.

An encapsulant or molding compound 668 is deposited over semiconductor units 660 and carrier 662 using a paste printing, compressive molding, transfer molding, liquid encapsulant molding, vacuum lamination, spin coating, or other suitable applicator. Encapsulant 668 can be polymer composite material, such as epoxy resin with filler, epoxy acrylate with filler, or polymer with proper filler. Encapsulant 668 is disposed over and around semiconductor units 660. Encapsulant 668 is non-conductive and environmentally protects the semiconductor device from external elements and contaminants. Encapsulant 668 also protects semiconductor die 624 from degradation due to exposure to light.

Figure 14I:
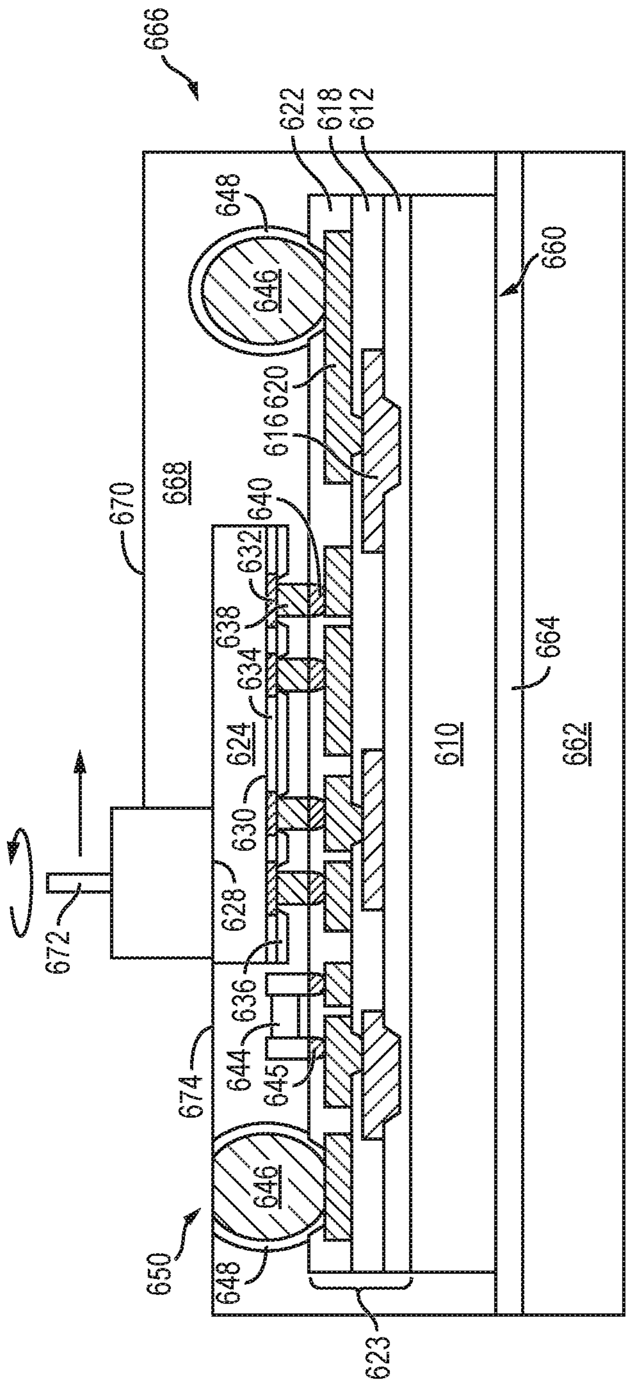

In FIG. 14*i*, a portion of encapsulant 668 in removed from back surface 670 in a grinding operation using grinder 672. The grinding operation exposes inner conductive bump 646 and planarizes a surface 674 of encapsulant 668 with back surface 628 of semiconductor die 624. The grinding operation reduces a thickness of the encapsulant and reconstituted wafer 666. A portion of back surface 628 of semiconductor die 624 may be removed in the grinding operation to further thin reconstituted wafer 666. In one embodiment, back surface 628 of semiconductor die 624 remains covered by encapsulant 668 after the grinding operation. A chemical etch or CMP process can also be used to remove mechanical damage resulting from the grinding operation and planarize encapsulant 668.

Figure 14J:
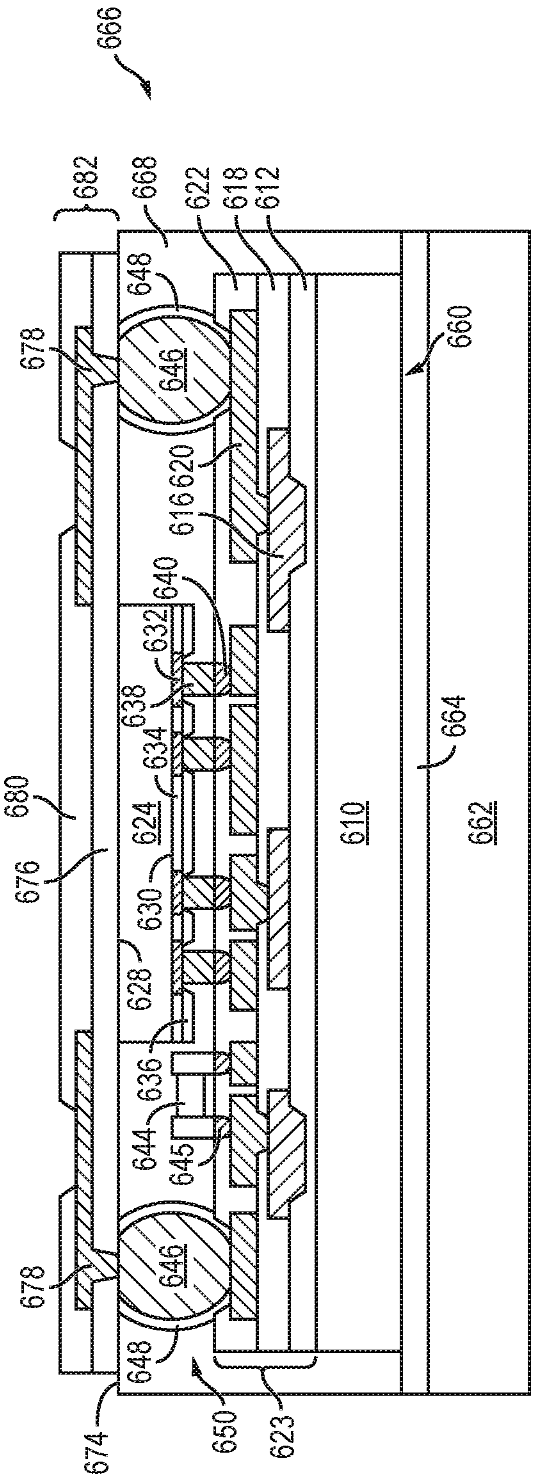

In FIG. 14*j*, an optional insulating or passivation layer 676 is formed over surface 674 of encapsulant 668, back surface 628 of semiconductor die 624, and 3D interconnect structure 650 using PVD, CVD, printing, lamination, spin coating, spray coating, sintering or thermal oxidation. The insulating layer 676 contains one or more layers of SiO2, Si3N4, SiON, Ta2O5, Al2O3, polymer dielectric resist with or without fillers or fibers, or other material having similar insulating and structural properties. A portion of insulating layer 676 is removed by LDA or by an etching process through a patterned photoresist layer to form openings over and exposing inner conductive bump 646. In one embodiment, insulating layer 676 is formed within the footprint of semiconductor unit 660 and does not extend over the portions of surface 674 of encapsulant 668 that are outside the footprint of semiconductor unit 660. In other words, the portions of surface 874 of encapsulant 868 in the peripheral region of semiconductor unit 860 remain exposed from insulating layer 878. In another embodiment, insulating layer 878 is formed continuously over surface 874 of encapsulant 868 between semiconductor units 860, and a portion of insulating layer 878 is removed from over the portions of surface 874 that are outside the footprint of semiconductor unit 860 by an etching process with a patterned photoresist layer or by LDA. Alternatively, insulating layer 878 is formed over and remains over the portions of encapsulant 868 that are outside the footprint of semiconductor unit 860.

An electrically conductive layer or RDL 678 is formed over insulating layer 676 and inner conductive bump 646 using a patterning and metal deposition process such as sputtering, electrolytic plating, and electroless plating. Conductive layer 678 can be one or more layers of Al, Cu, Sn, Ni, Au, Ag, or other suitable electrically conductive material. One portion of conductive layer 678 is electrically connected to inner conductive bump 646. Other portions of conductive layer 678 can be electrically common or electrically isolated depending on the design and function of semiconductor die 624. In one embodiment, a portion of conductive layer 678 is configured to provide an EMI shield over semiconductor die 624.

An optional insulating or passivation layer 680 is formed over insulating layer 676 and conductive layer 678 using PVD, CVD, printing, lamination, spin coating, spray coating, sintering or thermal oxidation. The insulating layer 680 contains one or more layers of SiO2, Si3N4, SiON, Ta2O5, Al2O3, polymer dielectric resist with or without fillers or fibers, or other material having similar insulating and structural properties. In one embodiment, insulating layer 680 includes an embedded glass cloth, glass cross, filler, or fiber, such as E-glass cloth, T-glass cloth, Al2O3, or silica filler, for enhanced bending strength. A portion of insulating layer 680 is removed by LDA to expose conductive layer 678. Alternatively, a portion of insulating layer 680 is removed by an etching process through a patterned photoresist layer to expose conductive layer 678.

The combination of insulating layers 676 and 680 and conductive layer 678 constitutes a build-up interconnect structure 682. Build-up interconnect structure 682 may include as few as one RDL or conductive layer, such as conductive layer 678, and one insulating layer, such as insulating layer 680. Additional insulating layers and RDLs can be formed over insulating layer 680 to provide additional vertical and horizontal electrical connectivity across the package according to the design and functionality of later mounted semiconductor die and devices. Additional insulating and metal layers may also be formed within build-up interconnect structure 682 to provide grounding and EMI shielding layers within the semiconductor package. Build-up interconnect structure 682 is inspected and tested to be known good at an interim stage, i.e., prior to additional device integration, see FIG. 9. In one embodiment, insulating layers 676 and 680 and conductive layer 678 are formed within the footprint of semiconductor unit 660 and do not extend over the portions of surface 674 of encapsulant 668 that are outside the footprint of semiconductor unit 660. In other words, the portions of surface 674 of encapsulant 668 in the peripheral region of semiconductor unit 660 remain exposed from the insulating and conductive layers of build-up interconnect structure 682.

Substrate 610 is present during the formation of build-up interconnect structure 682. Substrate 610 provides support during formation of build-up interconnect structure 682 and decreases warpage of reconstituted wafer 666. The decreased warpage increases the reliability of interconnect structures 623 and 682, i.e., decreases a likelihood and occurrence of defective interconnections within build-up interconnect structures 623 and 682 and between 3D interconnect structures 650 and build-up interconnect structures 623 and 682.

Figure 14K:
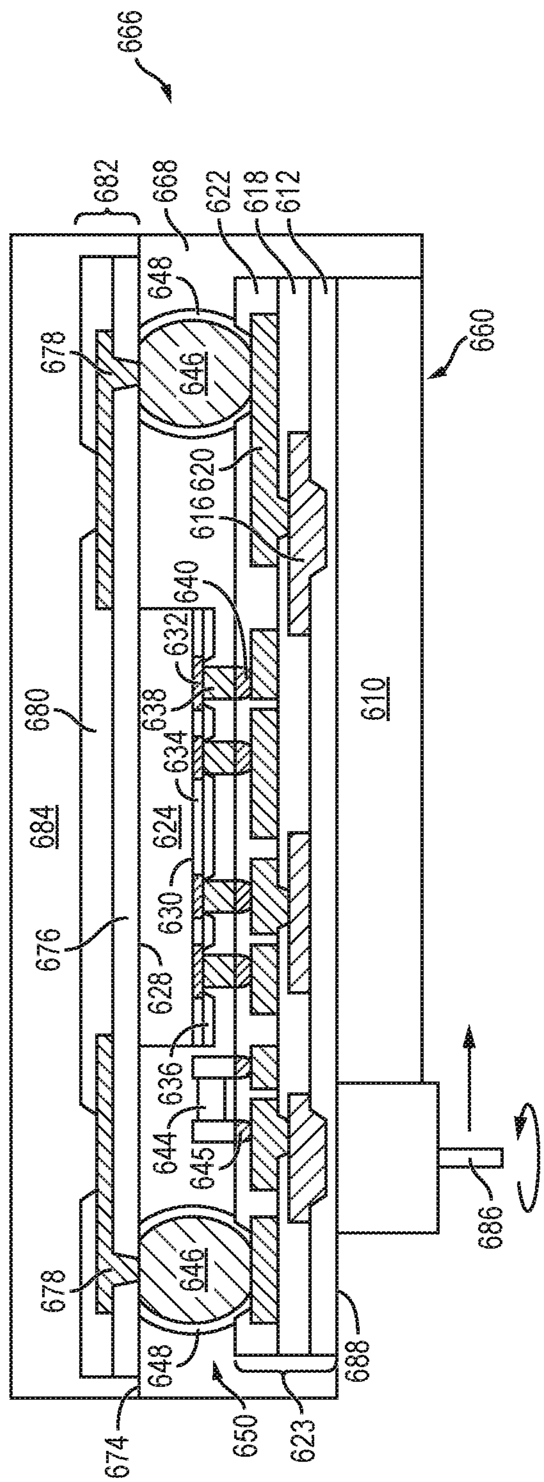

In FIG. 14*k*, carrier 662 and interface layer 664 are removed by chemical etching, mechanical peeling, CMP, mechanical grinding, thermal release, UV light, laser scanning, or wet stripping to expose substrate 610 and encapsulant 668.

A backgrinding tape or support carrier 684 is applied over interconnect structure 682 and in contact with insulating layer 680. Substrate 610 of semiconductor unit 660 is removed in a grinding operation using grinder 686. The grinding operation exposes a surface 688 of insulating layer 612. After grinding, a surface of encapsulant 668 is coplanar with surface 688 of insulating layer 612.

Figure 14L:
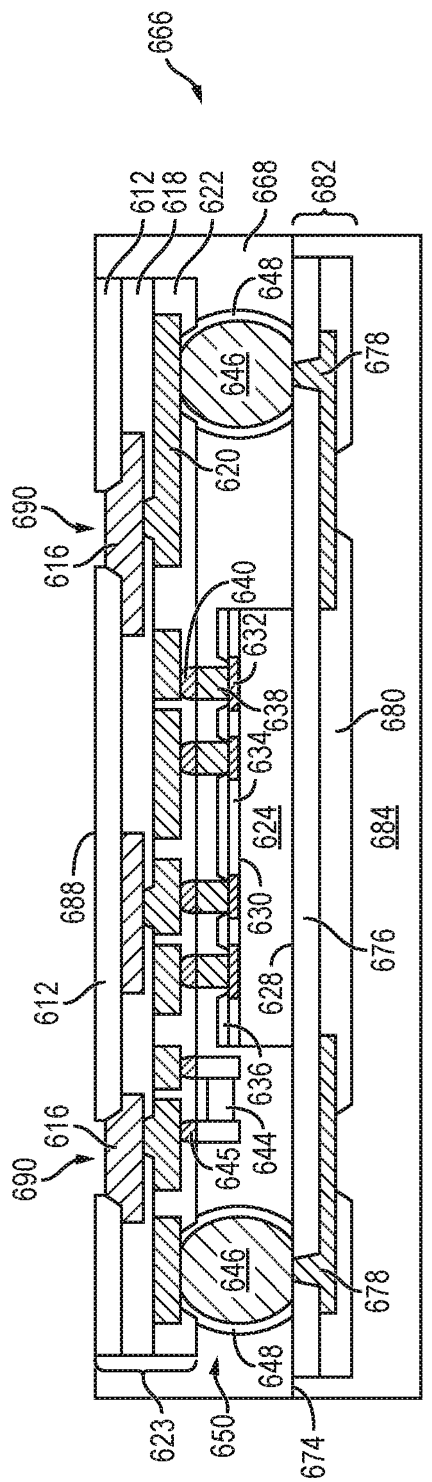

In FIG. 14*l*, a portion of insulating layer 612 is removed from surface 688 to form a plurality of openings 690 over conductive layer 616. Openings 690 are formed by LDA, etching, or other suitable process. The surface of conductive layer 616 exposed by openings 690 is recessed or below surface 688 of insulating layer 612 due to grooves 614 being formed partially through insulating layer 612. In one embodiment, grooves 614 expose substrate 610 such that the portions of conductive layer 616 within grooves 614 contact substrate 610 and are exposed upon removal of substrate 610.

Figure 14M:
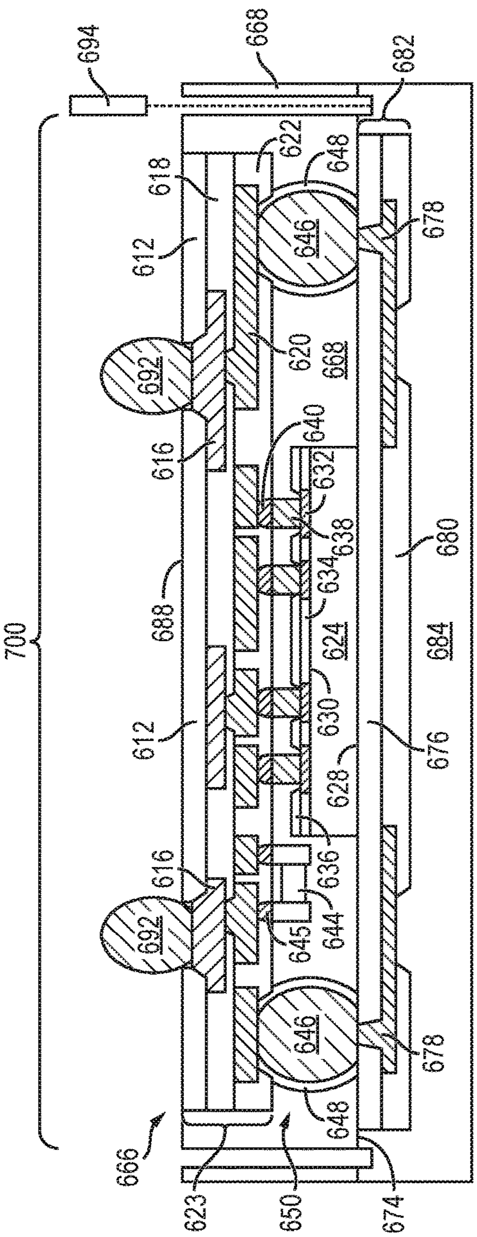

In FIG. 14*m*, an electrically conductive bump material is deposited over exposed conductive layer 616 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 616 using a suitable attachment or bonding process. In one embodiment, the bump material is reflowed by heating the material above the material's melting point to form balls or bumps 692. In some applications, bumps 692 are reflowed a second time to improve electrical contact to conductive layer 616. In one embodiment, bumps 692 are formed over a UBM having a wetting layer, barrier layer, and adhesive layer. Bumps 692 can also be compression bonded or thermocompression bonded to conductive layer 616. Bumps 692 represent one type of interconnect structure that can be formed over conductive layer 616. The interconnect structure can also use bond wires, conductive paste, stud bump, micro bump, or other electrical interconnect.

Reconstituted wafer 666 is then singulated through encapsulant 668 using a saw blade or laser cutting tool 694 into individual Fo-WLPs 700.

Figure 15:
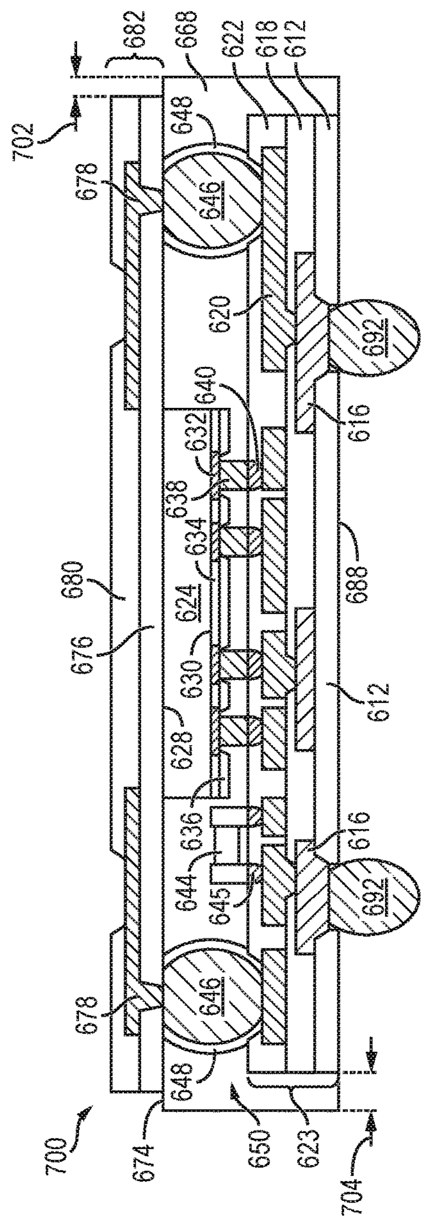
FIG. 15 illustrates a Fo-WLP with top and bottom interconnect structures formed using an embedded temporary substrate.

FIG. 15 shows a Fo-WLP 700 after singulation. Semiconductor die 624 is electrically connected through conductive layers 620 and 616 to bumps 692 for connection to external devices, for example a PCB. Build-up interconnect structures 623 and 682 route electrical signals between semiconductor die 624, 3D interconnect structures 650, and external devices stacked over conductive layer 678. Build-up interconnect structure 623 and 3D interconnect structures 650 are formed over substrate 610 prior to mounting semiconductor die 624. Forming build-up interconnect structure 623 and 3D interconnect structures 650 over substrate 610 allows established Si substrate fabrication materials and techniques to be utilized during the formation of build-up interconnect structure 623 and 3D interconnect structures 650. The established materials and standardized equipment lowers manufacturing costs and capital risk by reducing or eliminating the need for specialized semiconductor processing lines in the formation of the interconnect structures within Fo-WLP 700. Forming 3D interconnect structures 650 over substrate 610 provides vertical or 3D interconnection within Fo-WLP 700 without requiring laser drilling through the semiconductor package. Accordingly, forming build-up interconnect structure 623 and 3D interconnect structures 650 on substrate 610 minimizes the manufacturing time and cost of Fo-WLP 700, while providing increased flexibility in interconnect location and design.

Build-up interconnect structure 623 and 3D interconnect structures 650 are inspected and tested to be known good before additional device integration, which prevents fabrication materials and KGD from being wasted over defective interconnect structures 623. Forming build-up interconnect structure 623 prior to depositing encapsulant 668 also reduces the number of manufacturing steps taking place over reconstituted wafer 666, as only interconnect structure 682 is formed over reconstituted wafer 666, i.e., after deposition of encapsulant 668. Reducing the number of manufacturing steps taking place over reconstituted wafer 666 decreases the amount of stress placed on reconstituted wafer 666 and semiconductor die 624 as less insulating and conductive layer fabrication cycles are performed over encapsulated semiconductor die 624.

Insulating layers 676 and 680 and conductive layer 678 of build-up interconnect structure 682 are formed over a footprint of semiconductor unit 660 such that a portion of surface 674 of encapsulant 668 is exposed from build-up interconnect structure 682 and a distance 702 between the side surface, or sidewall, of build-up interconnect structure 682 and the outer edge, or sidewall, of encapsulant 668 is greater than 0 μm. Forming build-up interconnect structure 682 over the footprint of semiconductor unit 660 allows reconstituted wafer 666 to be singulated by cutting through only encapsulant 668, thereby eliminating a need to cut through build-up interconnect structure 682, and reducing a risk of damaging the layers of build-up interconnect structure 682 during singulation.

Semiconductor units 660 are disposed over carrier 662 prior to deposition of encapsulant 668. Disposing individual, or singulated, semiconductor units 660 over carrier 662 allows each semiconductor unit 660 to be tested prior mounting semiconductor units 660 to interface layer 664. Accordingly, only known good semiconductor units 660 are included in reconstituted wafer 666. Encapsulating individual, or singulated, semiconductor units 660 also allows encapsulant 668 to flow between the semiconductor units and around the side surfaces of build-up interconnect structure 623. After singulation of reconstituted wafer 666, encapsulant 668 is disposed around the side surfaces, or sidewalls, of build-up interconnect structure 623 such that a width 704 between the side surface of build-up interconnect structure 623 and an outer edge of Fo-WLP 700 is greater than 0 μm. Disposing encapsulant 668 around build-up interconnect structure 623 provides structural support and environmentally protects the layers of build-up interconnect structure 623 from external elements and contaminants.

Substrate 610 is encapsulated within reconstituted wafer 666 to provide structural support during subsequent wafer handling and during the formation of build-up interconnect structure 682. Substrate 610 is a Si substrate and has a CTE similar to the CTE of semiconductor die 624. The similarity in the CTEs of substrate 610 and semiconductor die 624 decreases CTE mismatch within reconstituted wafer 666 and reduces warpage caused by CTE-induced stress. The reduction of warpage and decrease of thermal stress in reconstituted wafer 666 decreases the occurrence of interconnection failures within build-up interconnect structures 623 and 682, thereby increasing the reliability of Fo-WLP 700. Substrate 610 is removed prior to singulation of reconstituted wafer 666. Thus, substrate 610 is able to provide support and reduce warpage during the manufacturing of Fo-WLP 700 without increasing a final height of Fo-WLP 700.

FIGS. 16*a*-16*g* illustrate, in relation to FIG. 1, a process of forming top and bottom interconnect structures in a Fo-WLP using an embedded temporary substrate for warpage control. Continuing from FIG. 14*f*, semiconductor units 660 including substrate 610 are disposed over a carrier 710 and interface layer 712 using, for example, a pick and place operation with semiconductor die 624 and 3D interconnect structures 650 oriented toward the carrier. Carrier or temporary substrate 710 contains a sacrificial base material such as silicon, polymer, beryllium oxide, glass, or other suitable low-cost, rigid material for structural support. Interface layer or double-sided tape 712 is formed over carrier 710 as a temporary adhesive bonding film, etch-stop layer, or thermal release layer.

Figure 16A:
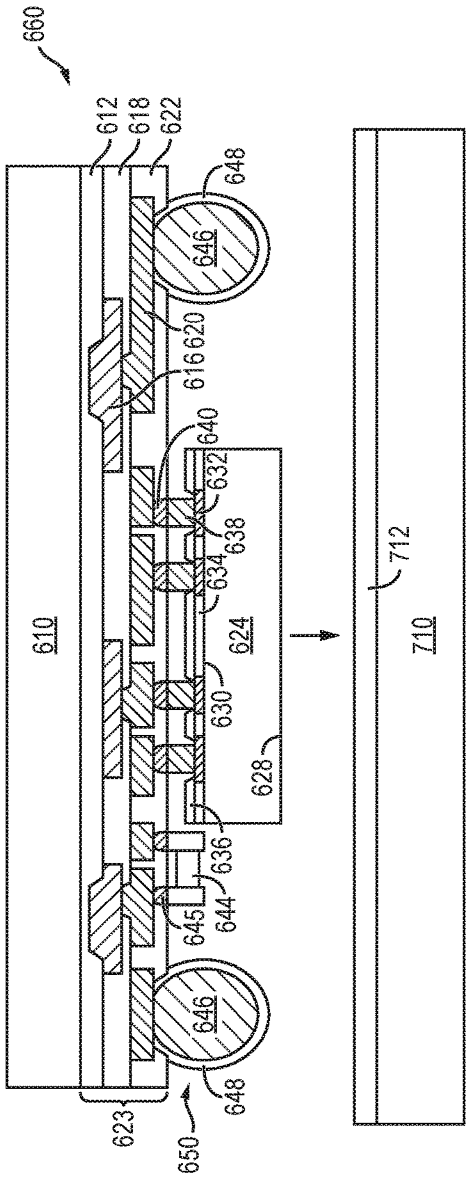
FIGS. 16*a*-16*g* illustrate another process of forming top and bottom build-up interconnect structures using an embedded temporary substrate.
Figure 16B:
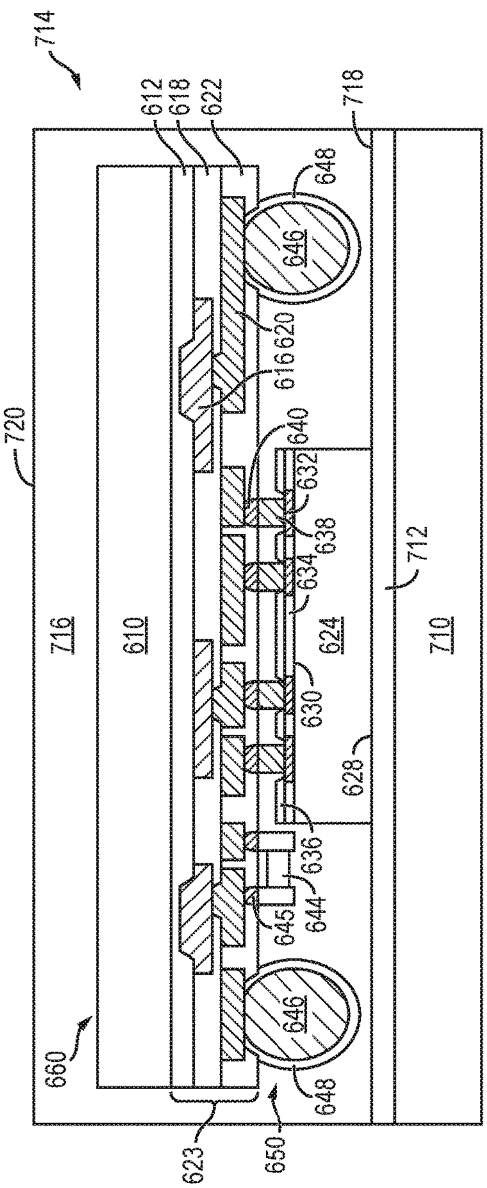
Figure 16C:
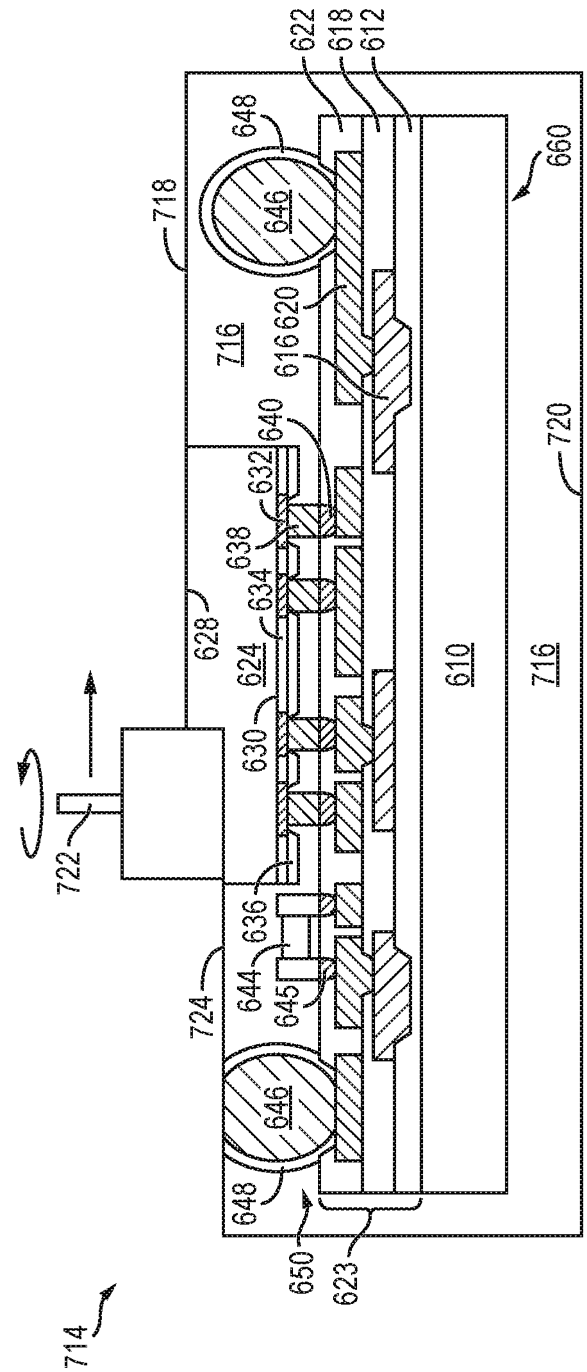

FIG. 16*b* shows semiconductor units 660 mounted to interface layer 712 on carrier 710 as a reconstituted or reconfigured wafer 714. Reconstituted wafer 714 is configured according to the specifications of the resulting final semiconductor package. In one embodiment, semiconductor units 660 are separated by a distance of 100 μm or greater over carrier 710.

An encapsulant or molding compound 716 is deposited over semiconductor units 660 and carrier 710 using a paste printing, compressive molding, transfer molding, liquid encapsulant molding, vacuum lamination, spin coating, or other suitable applicator. Encapsulant 716 can be polymer composite material, such as epoxy resin with filler, epoxy acrylate with filler, or polymer with proper filler. Encapsulant 716 includes opposing surfaces 720 and 718. Encapsulant 716 has a filler size of 55 μm or less. In one embodiment, encapsulant 716 has a filler size of 30 μm or less. The small filler size allows encapsulant 716 to easily flow into the area between insulating layer 622 and interface layer 712, and around 3D interconnect structures 650, semiconductor die 624, and discrete device 644. In one embodiment, a height of semiconductor die 624 is greater than a height of 3D interconnect structures 650 such that encapsulant 716 flows between interface layer 712 and the surface of 3D interconnect structures 650 that is opposite build-up interconnect structure 623. Encapsulant 716 is non-conductive and environmentally protects the semiconductor device from external elements and contaminants. Encapsulant 716 also protects semiconductor die 624 from degradation due to exposure to light In FIG. 16*c*, carrier 710 and interface layer 712 are removed by chemical etching, mechanical peeling, CMP, mechanical grinding, thermal release, UV light, laser scanning, or wet stripping to expose back surface 628 of semiconductor die 624 and surface 718 of encapsulant 716.

A portion of encapsulant 716 and semiconductor die 624 is removed in a grinding operation using grinder 722. The grinding operation exposes inner conductive bump 646. After grinding, a surface 724 of encapsulant 716 is coplanar with the back surface of semiconductor die 624. The grinding operation reduces a thickness of the encapsulant and reconstituted wafer 714. In embodiments where a height of 3D interconnect structures 650 is greater than a height of semiconductor die 624, back surface 628 of semiconductor die 624 may remain covered by encapsulant 716 after the grinding operation. A chemical etch or CMP process can also be used to remove mechanical damage resulting from the grinding operation and planarize encapsulant 716.

Figure 16D:
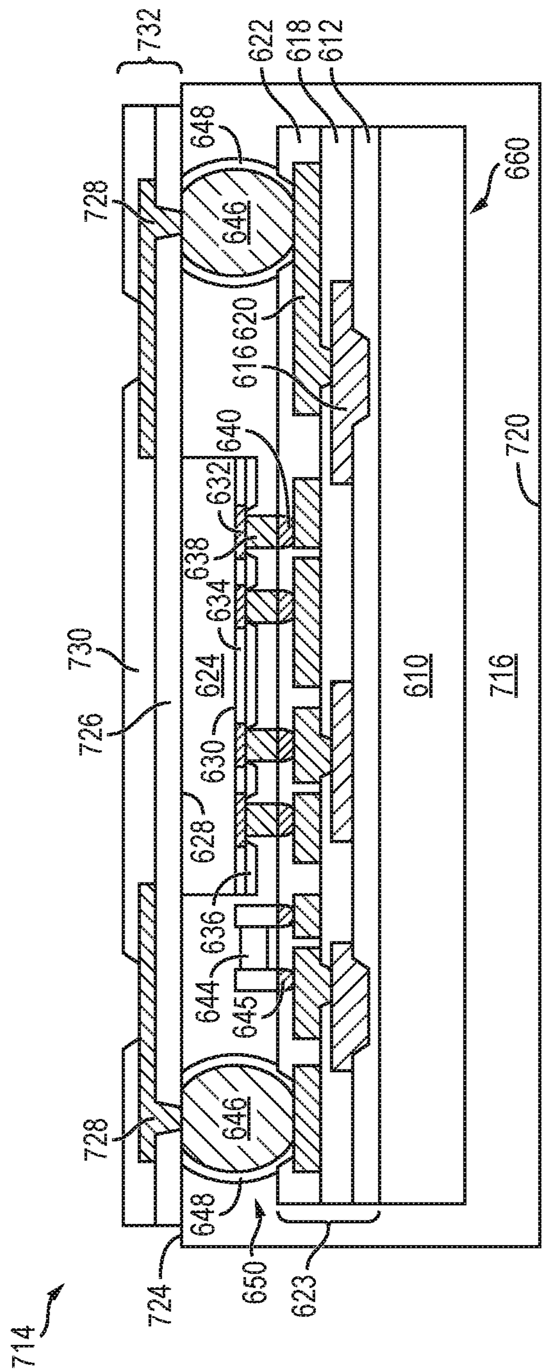

In FIG. 16*d*, an insulating or passivation layer 726 is formed over surface 724 of encapsulant 716, back surface 628 of semiconductor die 624, and 3D interconnect structure 650 using PVD, CVD, printing, lamination, spin coating, spray coating, sintering or thermal oxidation. The insulating layer 726 contains one or more layers of SiO2, Si3N4, SiON, Ta2O5, Al2O3, polymer dielectric resist with or without fillers or fibers, or other material having similar insulating and structural properties. A portion of insulating layer 726 is removed by LDA or etching process through a patterned photoresist layer to expose inner conductive bump 646.

An electrically conductive layer or RDL 728 is formed over insulating layer 726 and inner conductive bump 646 using a patterning and metal deposition process such as sputtering, electrolytic plating, and electroless plating. Conductive layer 728 can be one or more layers of Al, Cu, Sn, Ni, Au, Ag, or other suitable electrically conductive material. One portion of conductive layer 728 is electrically connected to inner conductive bump 646. Other portions of conductive layer 728 can be electrically common or electrically isolated depending on the design and function of semiconductor die 624. In one embodiment, a portion of conductive layer 728 is configured to provide an EMI shield over semiconductor die 624.

An insulating or passivation layer 730 is formed over insulating layer 726 and conductive layer 728 using PVD, CVD, printing, lamination, spin coating, spray coating, sintering or thermal oxidation. The insulating layer 730 contains one or more layers of SiO2, Si3N4, SiON, Ta2O5, Al2O3, polymer dielectric resist with or without fillers or fibers, or other material having similar insulating and structural properties. In one embodiment, insulating layer 730 includes an embedded glass cloth, glass cross, filler, or fiber, such as E-glass cloth, T-glass cloth, Al2O3, or silica filler, for enhanced bending strength. A portion of insulating layer 730 is removed by LDA to expose conductive layer 728. Alternatively, a portion of insulating layer 730 is removed by an etching process through a patterned photoresist layer to expose conductive layer 728.

The combination of insulating layers 726 and 730 and conductive layer 728 constitutes a build-up interconnect structure 732. Build-up interconnect structure 732 may include as few as one RDL or conductive layer, such as conductive layer 728, and one insulating layer, such as insulating layer 730. Additional insulating layers and RDLs can be formed over insulating layer 730 depending on the design and routing requirement of the final semiconductor package. Additional insulating and metal layers may also be formed within build-up interconnect structure 732 to provide grounding and EMI shielding layers within the semiconductor package. Build-up interconnect structure 732 is inspected and tested to be known good at an interim stage, i.e., prior to additional device integration, see FIG. 9. In one embodiment, insulating layers 726 and 730 and conductive layer 728 are formed within the footprint of semiconductor unit 660 and do not extend over the portions of surface 724 of encapsulant 716 that are outside the footprint of semiconductor unit 660. In other words, the portions of surface 724 of encapsulant 716 in the peripheral region of semiconductor unit 660 remain exposed from the insulating and conductive layers of build-up interconnect structure 732.

Substrate 610 is present during the formation of build-up interconnect structure 732. Substrate 610 provides support during formation of build-up interconnect structure 732 and decreases warpage of reconstituted wafer 714. The decreased warpage increases the reliability of interconnect structures 623 and 723, i.e., decreases a likelihood and occurrence of defective interconnections within build-up interconnect structures 623 and 732 and between 3D interconnect structures 650 and build-up interconnect structures 623 and 732.

Figure 16E:
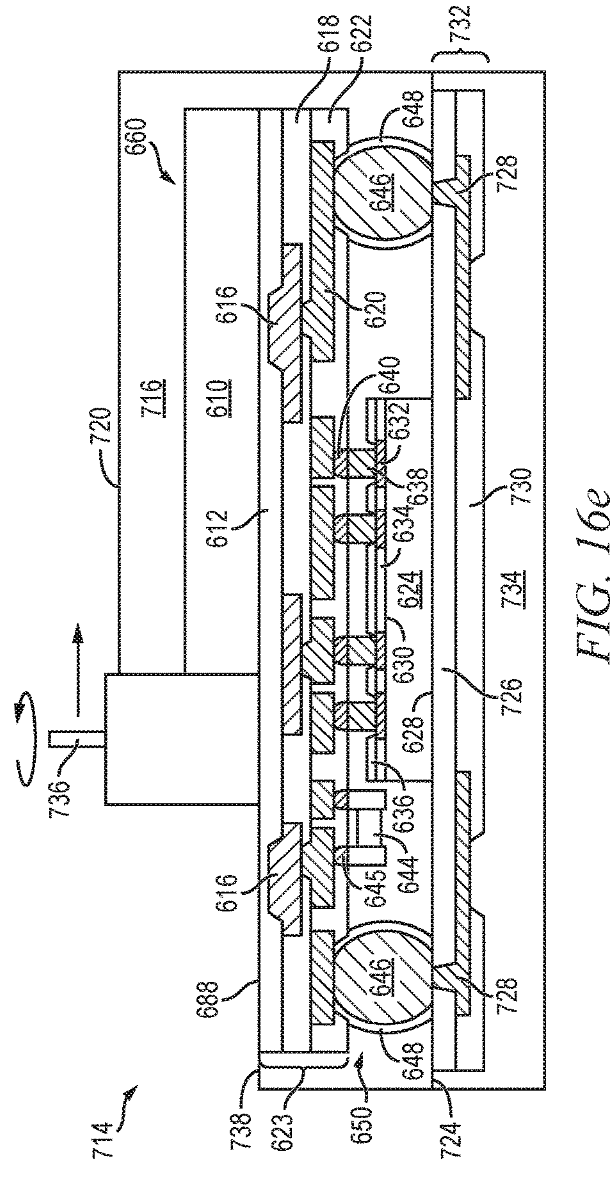

In FIG. 16*e*, a backgrinding tape or support carrier 734 is applied over interconnect structure 732 and in contact with insulating layer 730. Substrate 610 of semiconductor unit 660 and a portion of encapsulant 716 from back surface 720 are removed in a grinding operation using grinder 736. The grinding operation exposes surface 688 of insulating layer 612. After grinding, surface 738 of encapsulant 716 is coplanar with surface 688 of insulating layer 612.

Figure 16F:
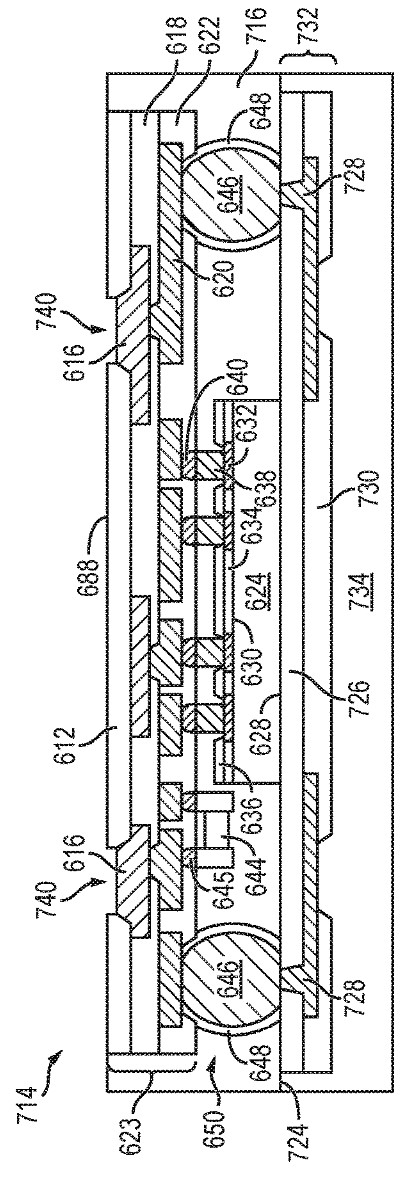

In FIG. 16*f*, a portion of insulating layer 612 is removed from surface 688 to form a plurality of openings 740 over conductive layer 616. The surface of conductive layer 616 exposed by openings 740 is recessed or below surface 688 of insulating layer 612 due to grooves 614 being formed partially through insulating layer 612. In one embodiment, grooves extend to substrate 610 such that conductive layer 616 contacts substrate 610 and is exposed upon removal of substrate 610.

Figure 16G:
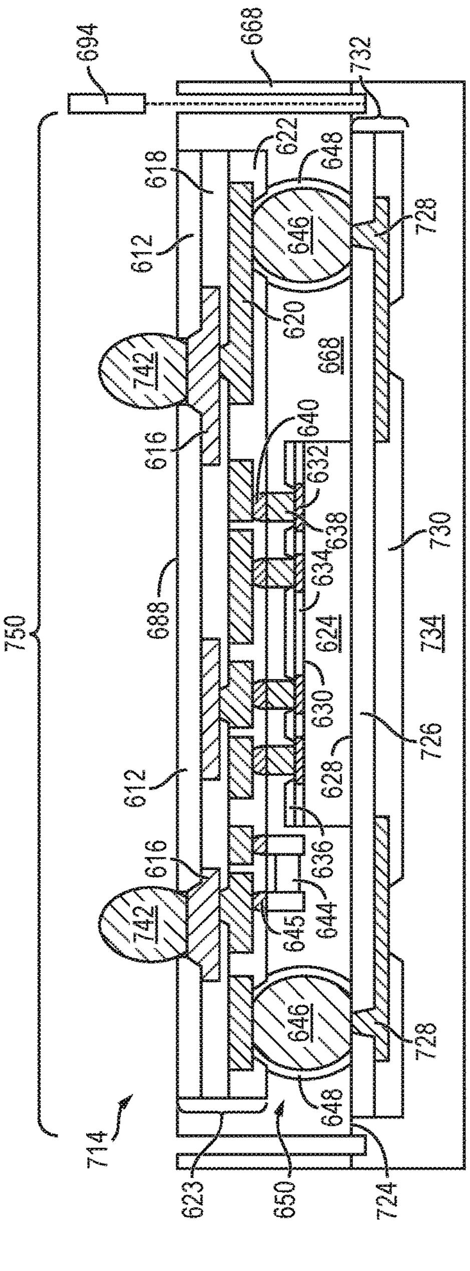

In FIG. 16*g*, an electrically conductive bump material is deposited over exposed conductive layer 616 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 616 using a suitable attachment or bonding process. In one embodiment, the bump material is reflowed by heating the material above the material's melting point to form balls or bumps 742. In some applications, bumps 742 are reflowed a second time to improve electrical contact to conductive layer 616. In one embodiment, bumps 742 are formed over a UBM having a wetting layer, barrier layer, and adhesive layer. Bumps 742 can also be compression bonded or thermocompression bonded to conductive layer 616. Bumps 742 represent one type of interconnect structure that can be formed over conductive layer 616. The interconnect structure can also use bond wires, conductive paste, stud bump, micro bump, or other electrical interconnect.

Reconstituted wafer 714 is then singulated through encapsulant 716 using saw blade or laser cutting tool 694 into individual Fo-WLP 750.

Figure 17:
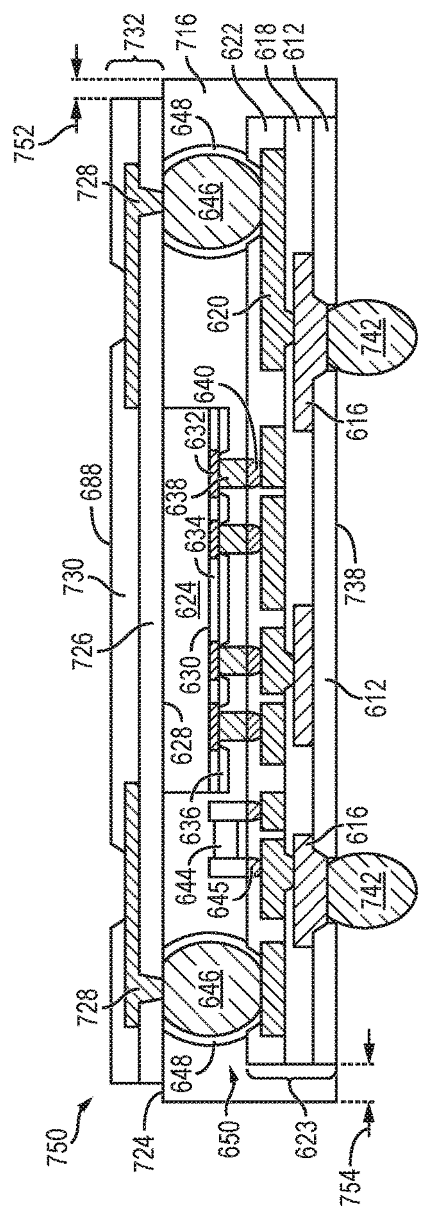
FIG. 17 illustrates a Fo-WLP with top and bottom interconnect structures formed using an embedded temporary substrate.

FIG. 17 shows Fo-WLP 750 after singulation. Semiconductor die 624 is electrically connected through conductive layers 620 and 616 to bumps 742 for connection to external devices, for example a PCB. Build-up interconnect structures 623 and 732 route electrical signals between semiconductor die 624, 3D interconnect structures 650, and external devices stacked over conductive layer 728. Build-up interconnect structure 623 and 3D interconnect structures 650 are formed over substrate 610 prior to mounting semiconductor die 624. Forming build-up interconnect structure 623 and 3D interconnect structures 650 over substrate 610 allows established Si substrate fabrication materials and techniques to be utilized during the formation of build-up interconnect structure 623 and 3D interconnect structures 650. The established materials and standardized equipment lowers manufacturing costs and capital risk by reducing or eliminating the need for specialized semiconductor processing lines in the formation of the interconnect structures within Fo-WLP 750. Forming 3D interconnect structures 650 over substrate 610 provides vertical or 3D interconnection within Fo-WLP 750 without requiring laser drilling through the semiconductor package. Accordingly, forming build-up interconnect structure 623 and 3D interconnect structures 650 on substrate 610 minimizes the manufacturing time and cost of Fo-WLP 750, while providing increased flexibility in interconnect location and design.

Build-up interconnect structure 623 and 3D interconnect structures 650 are inspected and tested to be known good before additional device integration, which prevents fabrication materials and KGD from being wasted over defective interconnect structures 623. Forming build-up interconnect structure 623 prior to depositing encapsulant 716 also reduces the number of manufacturing steps taking place over reconstituted wafer 714, as only interconnect structure 732 is formed over reconstituted wafer 714, i.e., after deposition of encapsulant 716. Reducing the number of manufacturing steps taking place over reconstituted wafer 714 decreases the amount of stress placed on reconstituted wafer 714 and semiconductor die 624 as less insulating and conductive layer fabrication cycles are performed over encapsulated semiconductor die 624.

Insulating layers 726 and 730 and conductive layer 728 of build-up interconnect structure 732 are formed over a footprint of semiconductor unit 660 such that a portion of surface 724 of encapsulant 716 is exposed from build-up interconnect structure 732 and a distance 752 between the side surface, or sidewall, of build-up interconnect structure 732 and the outer edge, or sidewall, of encapsulant 716 is greater than 0 μm. Forming build-up interconnect structure 732 over the footprint of semiconductor unit 660 allows reconstituted wafer 714 to be singulated by cutting through only encapsulant 716, thereby eliminating a need to cut through build-up interconnect structure 732, and reducing a risk of damaging the layers of build-up interconnect structure 732 during singulation.

Semiconductor units 660 are disposed over carrier 710 prior to deposition of encapsulant 716. Disposing individual, or singulated, semiconductor units 660 over carrier 710 allows each semiconductor unit 660 to be tested prior mounting semiconductor units 660 to interface layer 712 such that only known good semiconductor units 660 are included in reconstituted wafer 714. Encapsulating individual, or singulated, semiconductor units 660 also allows encapsulant 716 to flow between the semiconductor units and around the side surfaces of build-up interconnect structure 623. After singulation of reconstituted wafer 714, encapsulant 716 is disposed around the side surfaces, or sidewalls, of build-up interconnect structure 623 such that a width 754 between the side surface of build-up interconnect structure 623 and an outer edge of Fo-WLP 750 is greater than 0 μm. Disposing encapsulant 716 around build-up interconnect structure 623 provides structural support and environmentally protects the layers of build-up interconnect structure 623 from external elements and contaminants.

Substrate 610 is encapsulated within reconstituted wafer 714 to provide structural support during subsequent wafer handling and during the formation of build-up interconnect structure 732. Substrate 610 is a Si substrate and has a CTE similar to the CTE of semiconductor die 624. The similarity in the CTEs of substrate 610 and semiconductor die 624 decreases CTE mismatch within reconstituted wafer 714 and reduces warpage caused by CTE-induced stress. The reduction of warpage and decrease of thermal stress in reconstituted wafer 714 decreases the occurrence of interconnection failures within build-up interconnect structures 623 and 732, thereby increasing the reliability of Fo-WLP 750. Substrate 610 is removed prior to singulation of reconstituted wafer 714. Thus, substrate 610 is able to provide support and reduce warpage during the manufacturing of Fo-WLP 750 without increasing a final height of Fo-WLP 750.

Figure 18A:
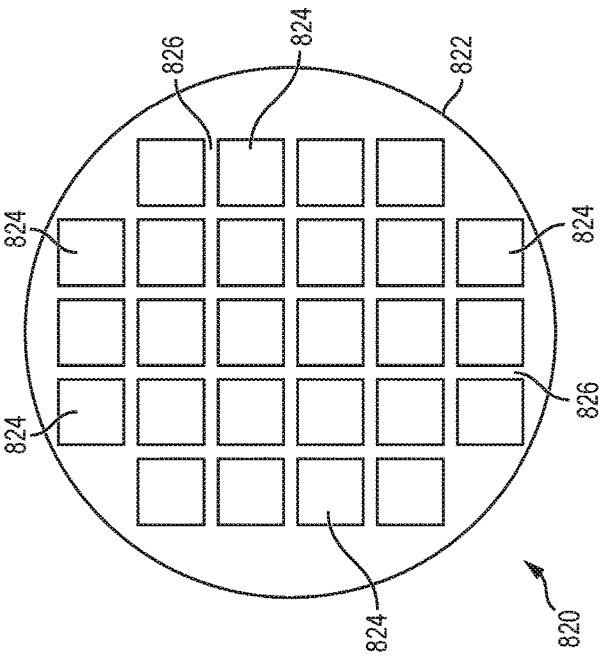
FIGS. 18*a*-18*c* illustrate a semiconductor wafer with a plurality of semiconductor die separated by a saw street.

FIG. 18*a* shows a semiconductor wafer 820, similar to wafer 120 in FIG. 2*a*, with a base substrate material 822, such as silicon, germanium, aluminum phosphide, aluminum arsenide, gallium arsenide, gallium nitride, indium phosphide, silicon carbide, or other bulk semiconductor material for structural support. A plurality of semiconductor die or components 824 is formed on wafer 820 separated by a non-active, inter-die wafer area or saw street 826 as described above. Saw street 826 provides cutting areas to singulate semiconductor wafer 820 into individual semiconductor die 824. In one embodiment, semiconductor wafer 820 has a width or diameter of 100-450 mm.

Figure 18B:
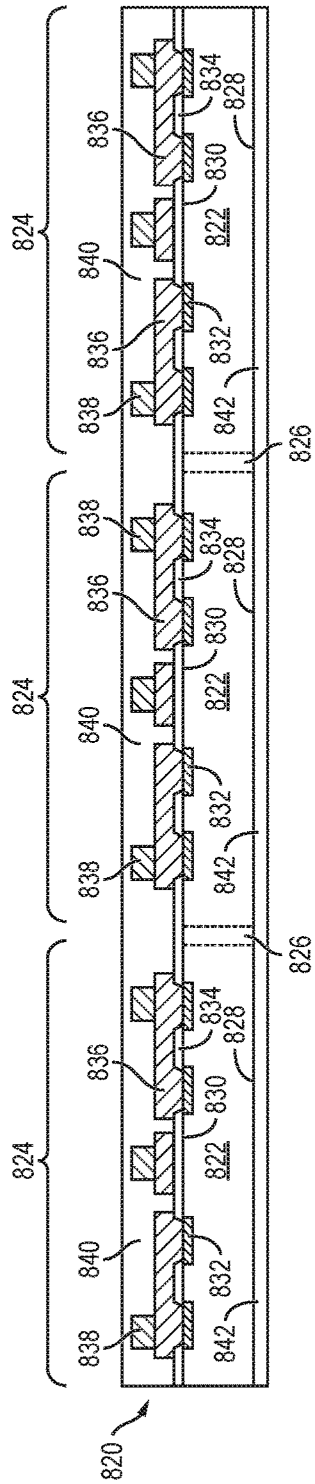

FIG. 18*b* shows a cross-sectional view of a portion of semiconductor wafer 820. Each semiconductor die 824 has a back or non-active surface 828 and an active surface 830 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 830 to implement analog circuits or digital circuits, such as DSP, ASIC, MEMS, memory, or other signal processing circuit. In one embodiment, active surface 830 contains a MEMS, such as an accelerometer, gyroscope, strain gauge, microphone, or other sensor responsive to various external stimuli. Semiconductor die 824 may also contain IPDs, such as inductors, capacitors, and resistors, for RF signal processing.

An electrically conductive layer 832 is formed over active surface 830 using PVD, CVD, electrolytic plating, electroless plating process, or other suitable metal deposition process. Conductive layer 832 includes one or more layers of Al, Cu, Sn, Ni, Au, Ag, or other suitable electrically conductive material or combination thereof. Conductive layer 832 operates as contact pads electrically connected to the circuits on active surface 830. Conductive layer 832 is formed as contact pads disposed side-by-side a first distance from the edge of semiconductor die 824, as shown in FIG. 18*b*. Alternatively, conductive layer 832 is formed as contact pads that are offset in multiple rows such that a first row of contact pads is disposed a first distance from the edge of the die, and a second row of contact pads alternating with the first row is disposed a second distance from the edge of the die.

An insulating or passivation layer 834 is formed over active surface 830 and conductive layer 832 using PVD, CVD, printing, spin coating, spray coating, sintering or thermal oxidation. The insulating layer 834 contains one or more layers of SiO2, Si3N4, SiON, Ta2O5, Al2O3, or other material having similar insulating and structural properties. A portion of insulating layer 834 is removed by LDA or an etching process through a patterned photoresist layer to expose conductive layer 832.

An electrically conductive layer or RDL 836 is formed over insulating layer 834 and conductive layer 832 using a patterning and metal deposition process such as printing, PVD, CVD, sputtering, electrolytic plating, and electroless plating. Conductive layer 836 can be one or more layers of Al, Cu, Sn, Ti, Ni, Au, Ag, W, or other suitable electrically conductive material. Conductive layer 836 extends horizontally along insulating layer 834 and parallel to active surface 830 of semiconductor die 824 to laterally redistribute the electrical interconnect to conductive layer 832. In one embodiment, conductive layer 836 is comprised of Cu traces formed with a fine line spacing or narrow pitch, e.g., a line spacing of 10 μm or less. One portion of conductive layer 836 is electrically connected to conductive layer 832. Other portions of conductive layer 836 can be electrically common or electrically isolated depending on the design and function of semiconductor die 824.

A plurality of conductive pillars 838 is formed over conductive layer 836. Conductive pillars 838 are formed by depositing a patterning or photoresist layer over insulating layer 834 and conductive layer 836. A portion of the photoresist layer is removed by an etching process to form vias exposing to conductive layer 836. Alternatively, a portion of the photoresist layer is removed by LDA to form vias exposing conductive layer 836. An electrically conductive material is deposited within the vias over conductive layer 836 using an evaporation, sputtering, electrolytic plating, electroless plating, screen printing, or other suitable metal deposition process. The conductive material can be Cu, Al, W, Au, solder, or other suitable electrically conductive material. In one embodiment, the conductive material is deposited by plating Cu in the vias. The photoresist layer is then removed to leave individual conductive pillars 838. Conductive pillars 838 can have a cylindrical shape with a circular or oval cross-section, or conductive pillars 838 can have a cubic shape with a rectangular cross-section.

An insulating or dielectric layer 840 is formed over insulating layer 834, conductive layer 836, and conductive pillars 838 using PVD, CVD, printing, lamination, spin coating, spray coating, sintering or thermal oxidation. The insulating layer 840 contains one or more layers of SiO2, Si3N4, SiON, Ta2O5, Al2O3, or other material having similar insulating and structural properties. The insulating layer 840 protects semiconductor die 824 during handling and subsequent manufacturing steps.

A DAF 842 is disposed over back surface 828 of semiconductor die 824. In one embodiment, semiconductor wafer 820 is thinned in a backgrinding operation prior to attachment of DAF 842 to reduce a height of semiconductor die 824.

Semiconductor wafer 820 undergoes electrical testing and inspection as part of a quality control process. Manual visual inspection and automated optical systems are used to perform inspections on semiconductor wafer 820. Software can be used in the automated optical analysis of semiconductor wafer 820. Visual inspection methods may employ equipment such as a scanning electron microscope, high-intensity or ultra-violet light, or metallurgical microscope. Semiconductor wafer 820 is inspected for structural characteristics including warpage, thickness variation, surface particulates, irregularities, cracks, delamination, and discoloration.

The active and passive components within semiconductor die 824 undergo testing at the wafer level for electrical performance and circuit function. Each semiconductor die 824 is tested for functionality and electrical parameters, using a test probe head, similar to FIG. 2*c*, or other testing device. The inspection and electrical testing of semiconductor wafer 820 enables semiconductor die 824 that pass to be designated as KGD for use in a semiconductor package.

Figure 18C:
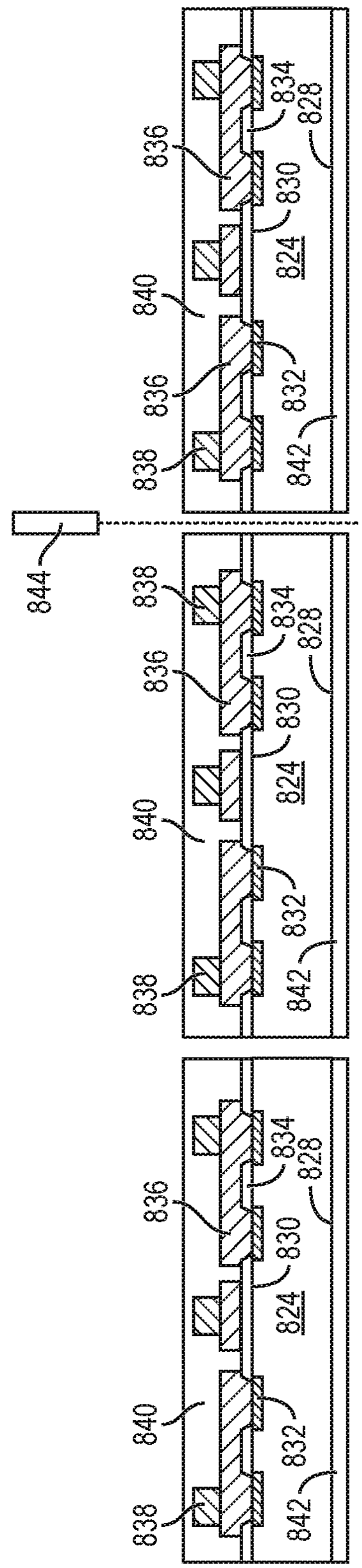

In FIG. 18*c*, semiconductor wafer 820 is singulated through saw street 826 using a saw blade or laser cutting tool 844 into individual semiconductor die 824. Individual semiconductor die 824 can be inspected and electrically tested for identification of KGD post singulation.

Figure 19A:
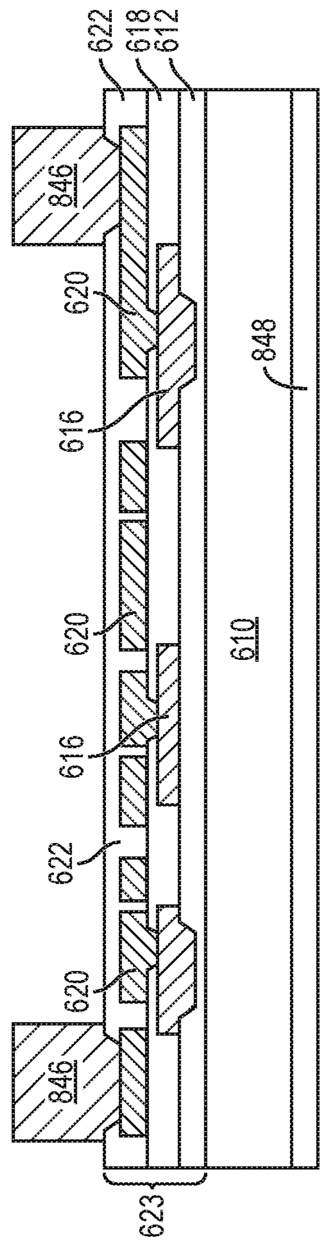
FIGS. 19*a*-19*k* illustrate another process of forming top and bottom build-up interconnect structures using an embedded temporary substrate.

FIGS. 19*a*-19*k* illustrate, in relation to FIG. 1, a process of forming top and bottom interconnect structures in a Fo-WLP using an embedded temporary substrate for warpage control. Continuing from FIG. 14*c*, FIG. 19*a* shows build-up interconnect structure 623 formed over substrate 610. Conductive columns 846 are formed over conductive layer 620 of build-up interconnect structure 623. Columns 846 are formed by depositing a seed layer over insulating layer 622 and along the exposed portions of conductive layer 620 using a patterning and metal deposition process such as PVD, CVD, sputtering, electrolytic plating, and electroless plating. In one embodiment, the seed layer is a Cu plating seed layer. A patterning or photoresist layer is formed over the seed layer, similar to photoresist layer 410 in FIG. 10*c*. A portion of the photoresist layer is removed by a photolithography and etching process or by LDA to form openings over the removed portions of insulating layer 622. An electrically conductive material is deposited in the removed portions of the photoresist layer using Cu plating, electrolytic plating, electroless plating, or other suitable metal deposition process to form conductive columns or vertical interconnect structures 846. In one embodiment, columns 846 are formed to a height of at least 75 μm above the surface of insulating layer 622. The remaining portions of the photoresist layer are then stripped leaving conductive columns or vertical interconnect structures 846. After stripping the photoresist, any portions of the seed layer outside conductive columns 846 are etched away and a leakage descum is performed. Conductive columns 846 can have a cylindrical shape with a circular or oval cross-section, or conductive columns 846 can have a cubic shape with a rectangular cross-section. Conductive columns 846 represent one type of interconnect structure that can be formed over conductive layer 620. The interconnect structure can also use stud bump, Cu bump, micro bump, or other electrical interconnect.

Forming conductive columns 846 over Si substrate 610 provides increased design flexibility and minimizes fabrication costs because the fabrication materials and equipment compatible with Si substrates have a more established infrastructure, i.e., more materials and standardized equipment are available and common to fabrication methods that employ Si substrates. The common materials and standardized equipment lowers manufacturing costs and capital risk by reducing or eliminating the need for specialized semiconductor processing lines based on other substrate materials or methods of forming 3D interconnect structures.

Build-up interconnect structure 623 and conductive columns 846 are inspected and tested to be known good at the wafer level by open/short probe or auto-scope inspection at the present interim stage, i.e., prior to mounting a semiconductor die. Leakage can be tested at a sampling location. Screening for defective interconnections prior to mounting semiconductor die over build-up interconnect structure 623 minimizes KGD die loss as KGD are not wasted over defective interconnect structures.

An optional backside protection or warpage balance layer 848 is formed over the back surface of substrate 610 opposite build-up interconnect structure 623 using PVD, CVD, printing, lamination, spin coating, spray coating, sintering, or thermal oxidation. Warpage balance layer 848 can be one or more layers of photosensitive polymer dielectric film with or without fillers, non-photosensitive polymer dielectric film, epoxy, epoxy resin, polymeric materials, polymer composite material such as epoxy resin with filler, epoxy acrylate with filler, or polymer with proper filler, thermoset plastic laminate, or other material having similar insulating and structural properties. Warpage balance layer 848 is non-conductive and provides physical support and warpage tuning capability to control overall package warpage.

Figure 19B:
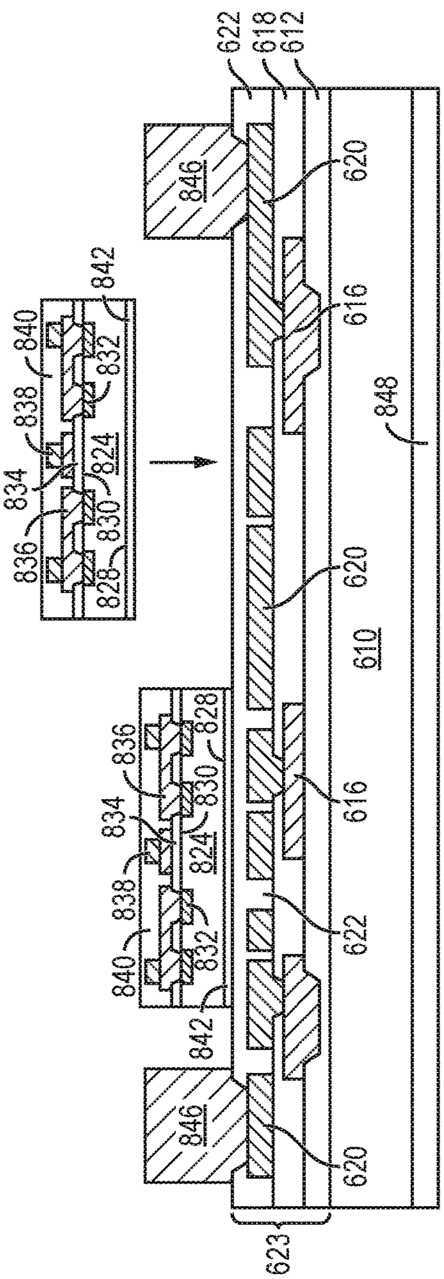

In FIG. 19*b*, semiconductor die 824, from FIG. 18*c*, are disposed over build-up interconnect structure 623 between conductive columns 846 using, for example, a pick and place operation with DAF 842 and back surface 828 oriented toward build-up interconnect structure 623. Semiconductor die 824 are KGD having been tested prior to mounting semiconductor die 824 to insulating layer 622.

Figure 19C:
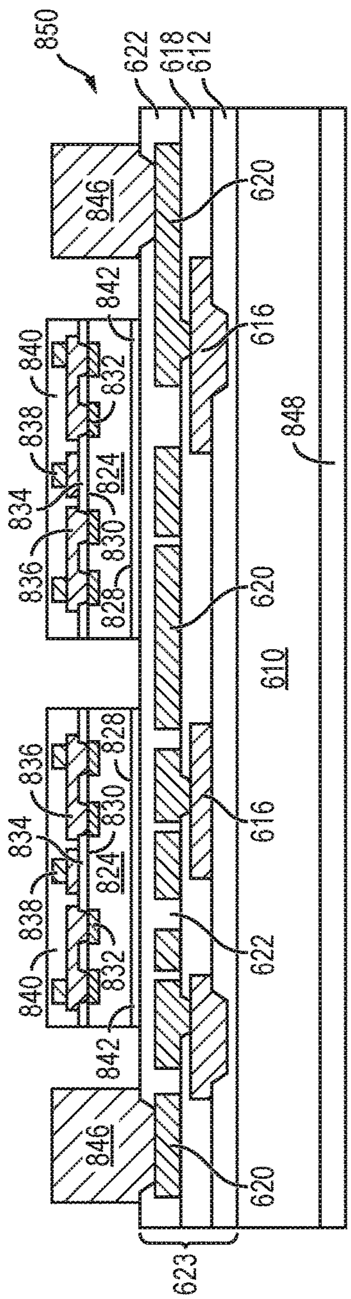

FIG. 19*c* shows semiconductor die 824 mounted to insulating layer 622 as a reconstituted wafer 850. Conductive columns 846 are disposed around or in a peripheral region of semiconductor die 824. In one embodiment, a portion of conductive layer 616 or 620 is configured to provide an EMI shield over semiconductor die 824.

Figure 19D:
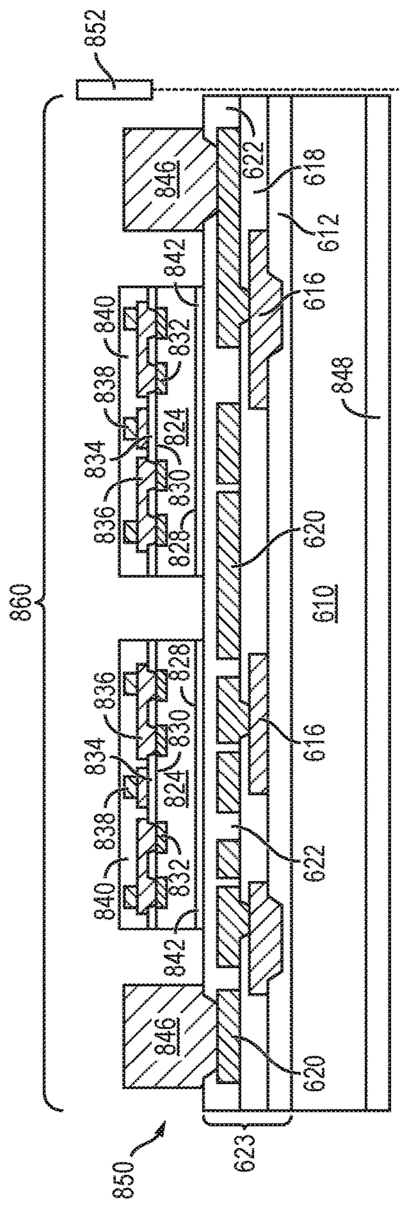

In FIG. 19*d*, reconstituted wafer 850 is singulated into individual semiconductor units 860 using a saw blade or laser cutting tool 852. Semiconductor units 860 each include a semiconductor die 824 disposed over build-up interconnect structure 623 and substrate 610 with conductive columns 846 disposed around semiconductor die 824. Conductive columns 846 are electrically connected to conductive layers 620 and 616 and provide vertical or 3D electrical interconnect for subsequent PoP fabrication. Substrate 610 provides structural support during subsequent handling of semiconductor units 860 and fabrication processes performed over semiconductor units 860.

Figure 19E:
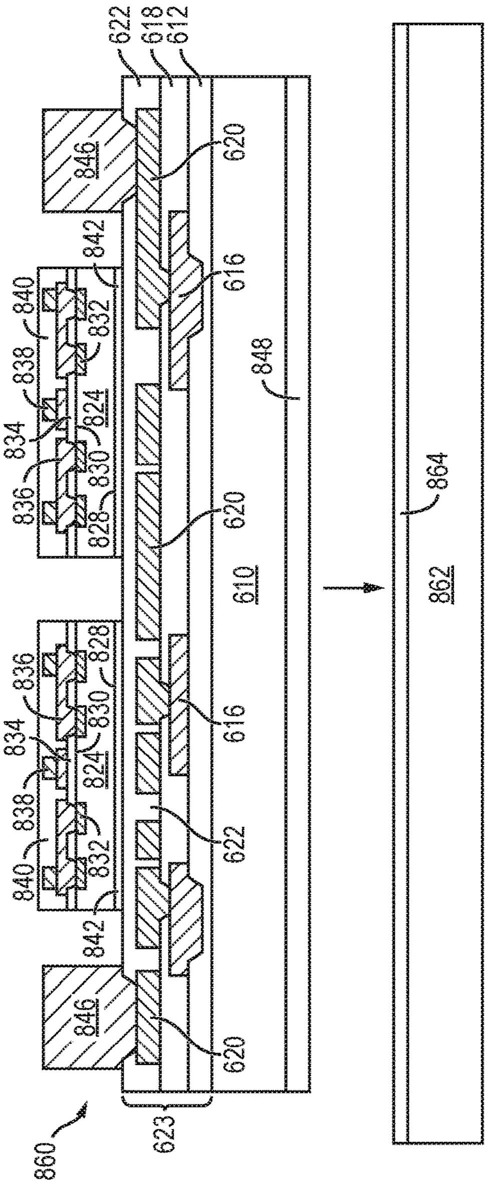

In FIG. 19*e*, semiconductor units 860 including substrate 610 are disposed over a carrier 862 and interface layer 864 using, for example, a pick and place operation with substrate 610 and optional warpage balance layer 848 oriented toward the carrier. Carrier or temporary substrate 862 contains a sacrificial base material such as silicon, polymer, beryllium oxide, glass, or other suitable low-cost, rigid material for structural support. Interface layer or double-sided tape 864 is formed over carrier 862 as a temporary adhesive bonding film, etch-stop layer, or thermal release layer.

Figure 19F:
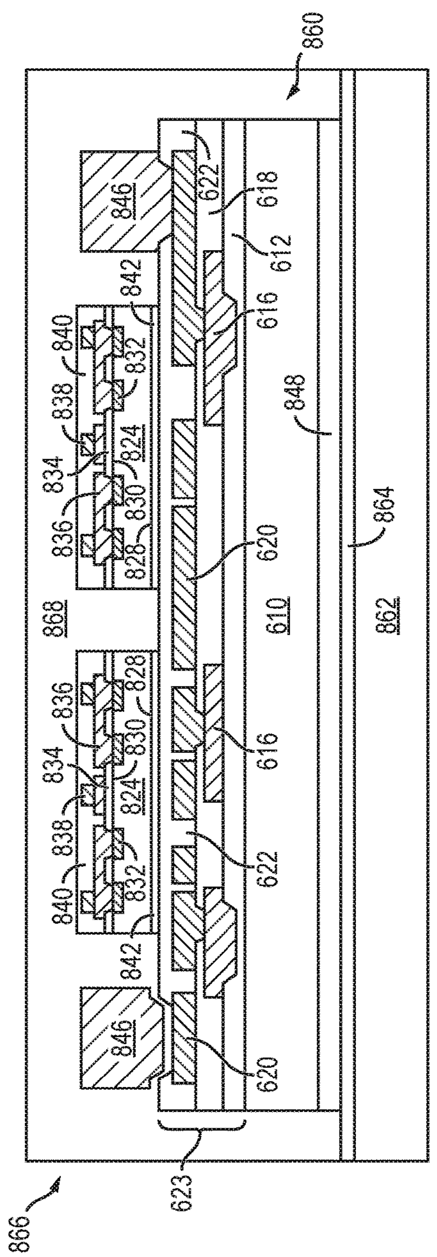

FIG. 19*f* shows semiconductor units 860 mounted to interface layer 864 on carrier 862 as a reconstituted or reconfigured wafer 866. Reconstituted wafer 866 is configured according to the specifications of the resulting final semiconductor package. In one embodiment, adjacent semiconductor units 860 are separated by a distance of 100 μm or greater over carrier 862.

An encapsulant or molding compound 868 is deposited over semiconductor units 860 and carrier 862 using a paste printing, compressive molding, transfer molding, liquid encapsulant molding, vacuum lamination, spin coating, or other suitable applicator. Encapsulant 868 can be polymer composite material, such as epoxy resin with filler, epoxy acrylate with filler, or polymer with proper filler. Encapsulant 868 is disposed over and around semiconductor units 860. Encapsulant 868 flows between semiconductor units 860 and around the side surfaces of build-up interconnect structure 623. Encapsulant 868 is non-conductive and environmentally protects the semiconductor device from external elements and contaminants. Encapsulant 868 also protects semiconductor die 824 from degradation due to exposure to light.

Figure 19G:
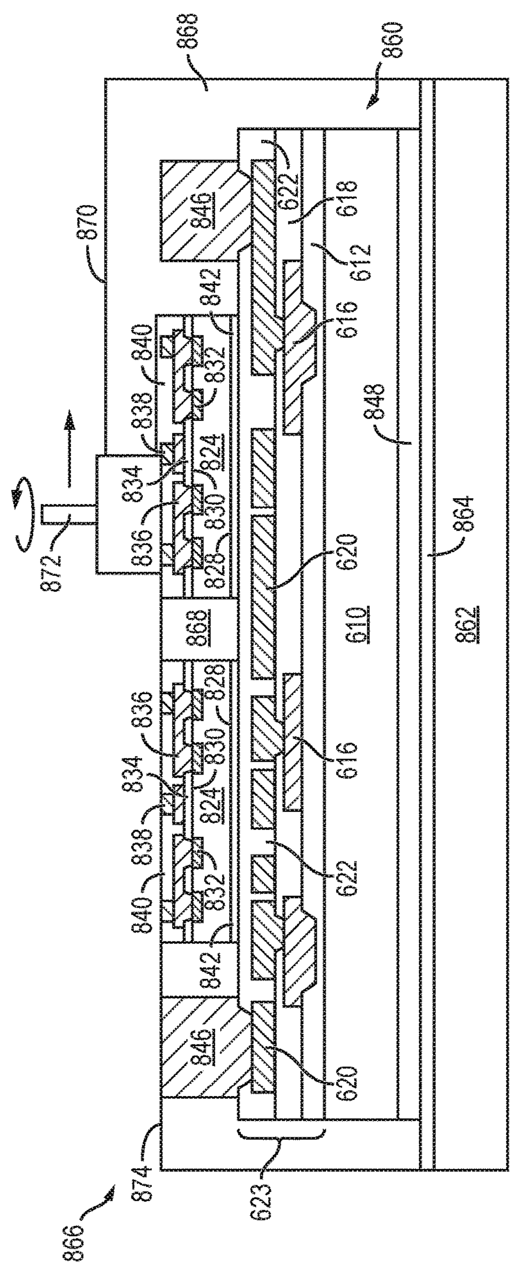

In FIG. 19*g*, a portion of encapsulant 868 in removed from back surface 870 in a grinding operation using grinder 872. The grinding operation exposes conductive columns 846 and conductive pillars 838 of semiconductor die 824. Alternatively, conductive columns 846 and conductive pillars 838 may exposed be by LDA. The grinding operation planarizes a surface 874 of encapsulant 868 with conductive columns 846 and conductive pillars 838. The grinding operation reduces a thickness of the encapsulant and reconstituted wafer 866. A chemical etch or CMP process can also be used to remove mechanical damage resulting from the grinding operation and planarize encapsulant 868.

Figure 19H:
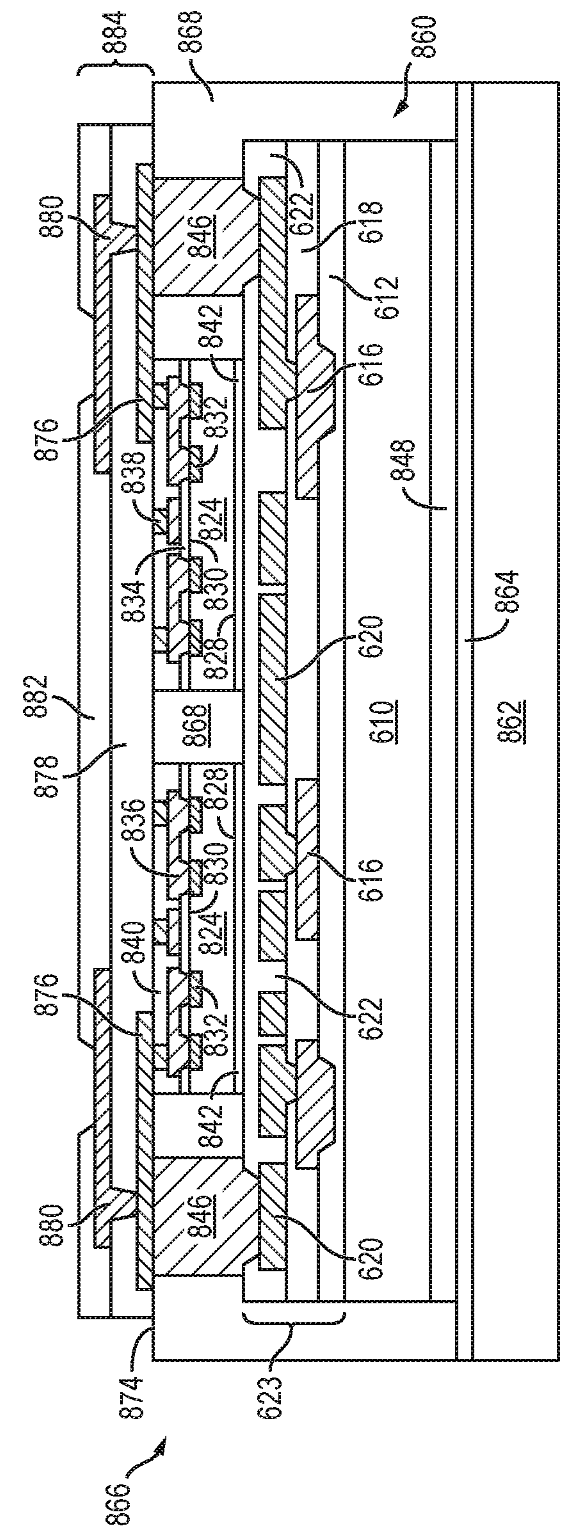

In FIG. 19*h*, an electrically conductive layer or RDL 876 is formed over conductive columns 846, surface 874 of encapsulant 868, and semiconductor die 824 using a patterning and metal deposition process such as sputtering, electrolytic plating, and electroless plating. Conductive layer 876 can be one or more layers of Al, Cu, Sn, Ni, Au, Ag, or other suitable electrically conductive material. A portion of conductive layer 876 extends horizontally along insulating layer 840 and surface 874 of encapsulant 868 parallel to active surface 830 of semiconductor die 824 to laterally redistribute the electrical interconnect to conductive pillars 838 and conductive columns 846. Conductive layer 876 is formed over the footprint of semiconductor unit 860 and does not extend over the portions of surface 874 of encapsulant 868 that are outside the footprint of semiconductor unit 860. In other words, a peripheral region of semiconductor unit 860 is devoid of conductive layer 876. A portion of conductive layer 876 is electrically connected to conductive pillars 838. A portion of conductive layer 876 is electrically connected to conductive columns 846. Other portions of conductive layer 876 can be electrically common or electrically isolated depending on the design and function of the semiconductor device.

An insulating or passivation layer 878 is formed over conductive layer 876, surface 874 of encapsulant 868, and semiconductor die 824 using PVD, CVD, printing, spin coating, spray coating, screen printing or lamination. Insulating layer 878 can be one or more layers of $SiO_2$, $Si_3N_4$, SiON, $Ta_2O_5$, $Al_2O_3$, or other material having similar insulating and structural properties. In one embodiment, insulating layer 878 is a photosensitive dielectric polymer low-cured at less than 200° C. A portion of insulating layer 878 is removed by an etching process with a patterned photoresist layer or by LDA to form openings exposing conductive layer 876. In one embodiment, insulating layer 878 is formed within the footprint of semiconductor unit 860 and does not extend over the portions of surface 874 of encapsulant 868 that are outside the footprint of semiconductor unit 860. In other words, the portions of surface 874 of encapsulant 868 in the peripheral region of semiconductor unit 860 remain exposed from insulating layer 878. In another embodiment, insulating layer 878 is formed continuously over surface 874 of encapsulant 868 between semiconductor units 860, and a portion of insulating layer 878 is removed from over the portions of surface 874 that are outside the footprint of semiconductor unit 860 by an etching process with a patterned photoresist layer or by LDA. Alternatively, insulating layer 878 is formed over and remains over the portions of encapsulant 868 that are outside the footprint of semiconductor unit 860.

An electrically conductive layer or RDL 880 is formed over insulating layer 878 and conductive layer 876 using a patterning and metal deposition process such as printing, PVD, CVD, sputtering, electrolytic plating, and electroless plating. Conductive layer 880 can be one or more layers of Al, Cu, Sn, Ti, Ni, Au, Ag, W, or other suitable electrically conductive material. A portion of conductive layer 880 extends horizontally along insulating layer 878 and parallel to active surface 830 of semiconductor die 824 to laterally redistribute the electrical interconnect to conductive layer 876. Conductive layer 880 is formed over the footprint of semiconductor unit 860 and does not extend over the portions of surface 874 of encapsulant 868 that are outside the footprint of semiconductor unit 860. A portion of conductive layer 880 is electrically connected to conductive layer 876. Other portions of conductive layer 880 are electrically common or electrically isolated depending on the design and function of the semiconductor device.

An insulating or passivation layer 882 is formed over insulating layer 878 and conductive layer 880 using PVD, CVD, printing, spin coating, spray coating, screen printing or lamination. Insulating layer 882 can be one or more layers of $SiO_2$, $Si_3N_4$, SiON, $Ta_2O_5$, $Al_2O_3$, or other material having similar insulating and structural properties. In one embodiment, insulating layer 882 is a photosensitive dielectric polymer low-cured at less than 200° C. A portion of insulating layer 882 is removed by an etching process with a patterned photoresist layer or by LDA to form openings exposing conductive layer 880. In one embodiment, insulating layer 882 is formed within the footprint of semiconductor unit 860 and does not extend over the portions of surface 874 of encapsulant 868 that are beyond the footprint of semiconductor unit 860. In other words, the portions of surface 874 of encapsulant 868 in a peripheral region of semiconductor unit 860 remain exposed from insulating layer 882. In another embodiment, insulating layer 882 is formed continuously over surface 874 of encapsulant 868 between semiconductor units 860, and a portion of insulating layer 882 is removed from over the portions of surface 874 that are outside the footprint of semiconductor unit 860 by an etching process with a patterned photoresist layer or by LDA. Alternatively, insulating layer 882 is formed over and remains over the portions of encapsulant 868 that are outside the footprint of semiconductor unit 860.

Collectively, insulating layers 878 and 882, and conductive layers 876 and 880 constitute a build-up interconnect structure 884 formed over semiconductor unit 860. Build-up interconnect structure 884 may include as few as one RDL or conductive layer, such as conductive layer 876, and one insulating layer, such as insulating layer 878. Additional insulating layers and RDLs can be formed over insulating layer 882 to provide additional vertical and horizontal electrical connectivity across the package according to the design and functionality of the semiconductor device. Additional insulating and metal layers may also be formed within build-up interconnect structure 884 to provide grounding and EMI shielding layers within the semiconductor package. Build-up interconnect structure 884 is inspected and tested to be known good at an interim stage, i.e., prior to additional device integration, see FIG. 9.

Substrate 610 is present during the formation of build-up interconnect structure 884. Substrate 610 provides support during formation of build-up interconnect structure 884 and decreases warpage of reconstituted wafer 866. The decreased warpage increases the reliability of interconnect structures 623 and 884, i.e., decreases a likelihood and occurrence of defective interconnections within build-up interconnect structures 623 and 884 and between conductive columns 846 and build-up interconnect structures 623 and 884.

Figure 19I:
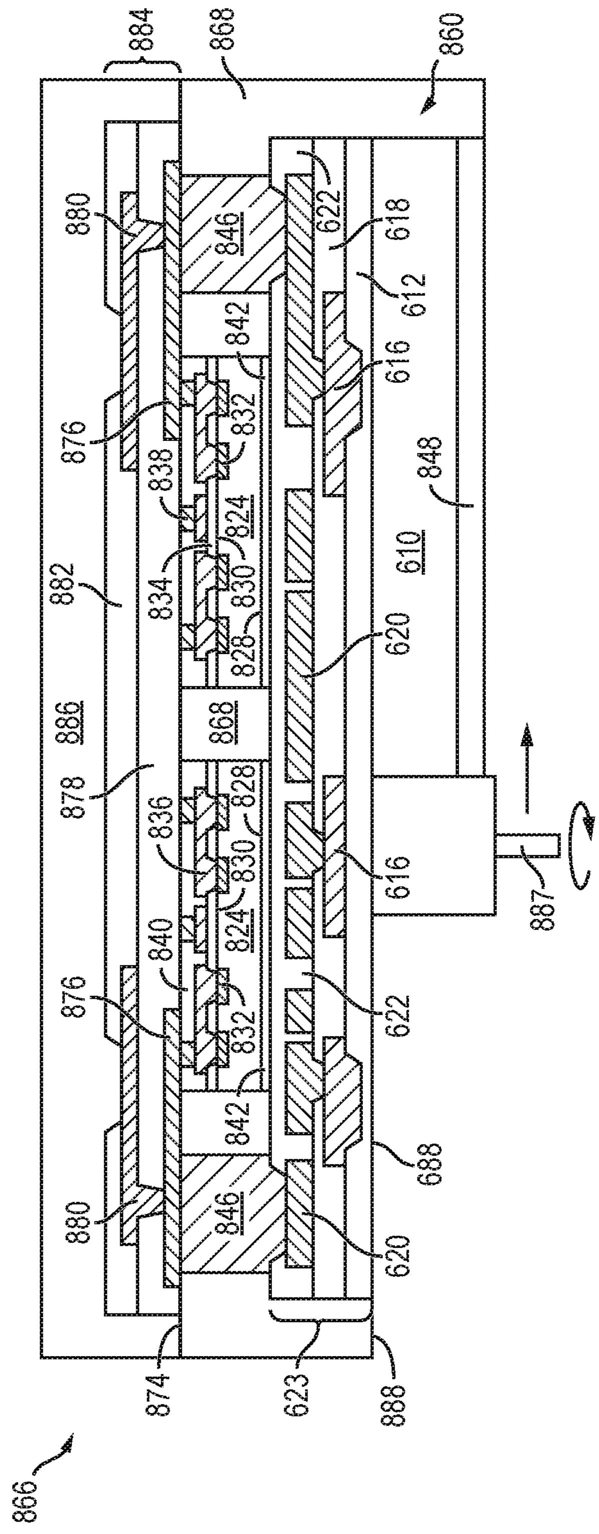

In FIG. 19*i*, carrier 862 and interface layer 864 are removed by chemical etching, mechanical peeling, CMP, mechanical grinding, thermal release, UV light, laser scanning, or wet stripping exposing encapsulant 868 and warpage balance layer 848 of semiconductor unit 860.

A backgrinding tape or support carrier 886 is applied over interconnect structure 884 and in contact with insulating layer 882. Substrate 610 and optional warpage balance layer 848 of semiconductor unit 860 are removed in a grinding operation using grinder 887. The grinding operation exposes a surface 688 of insulating layer 612. After grinding, a surface 888 of encapsulant 868 is coplanar with surface 688 of insulating layer 612.

Figure 19J:
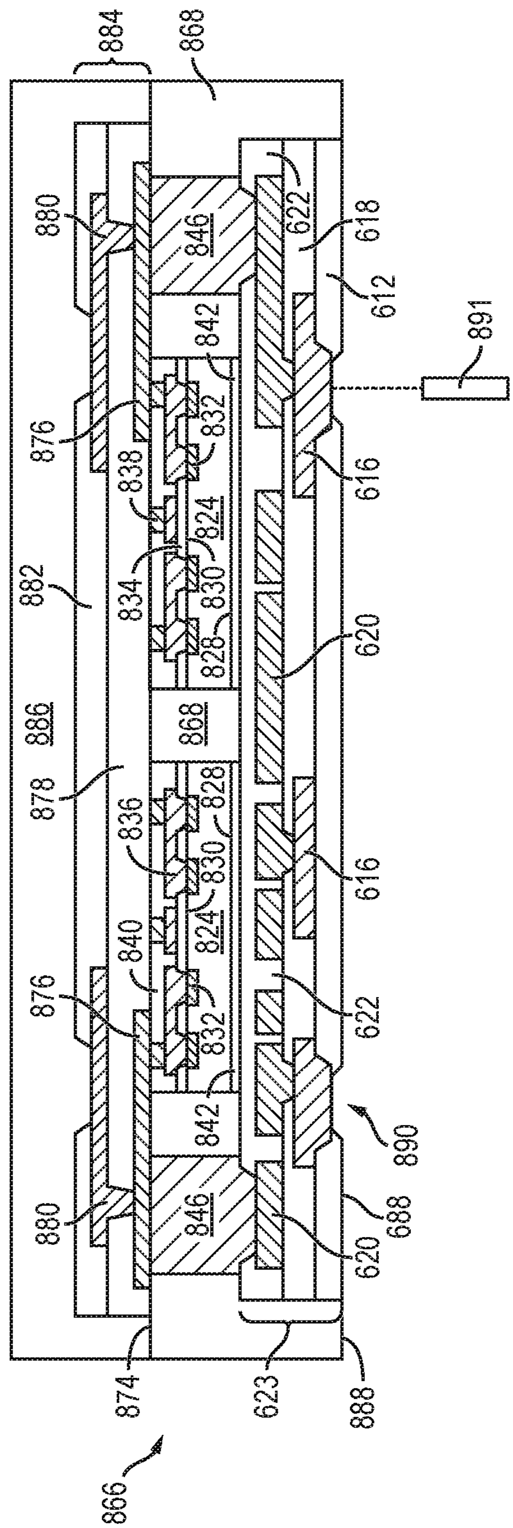

In FIG. 19*j*, a portion of insulating layer 612 is removed from surface 688 to form a plurality of openings 890 over conductive layer 616. Openings 890 are formed by LDA using laser 891 or by etching, or other suitable process. The surface of conductive layer 616 exposed by openings 890 is recessed or below surface 688 of insulating layer 612 due to grooves 614 being formed partially through insulating layer 612. In one embodiment, grooves 614 extend to and expose substrate 610 such that the portions of conductive layer 616 within grooves 614 are exposed upon removal of substrate 610.

Figure 19K:
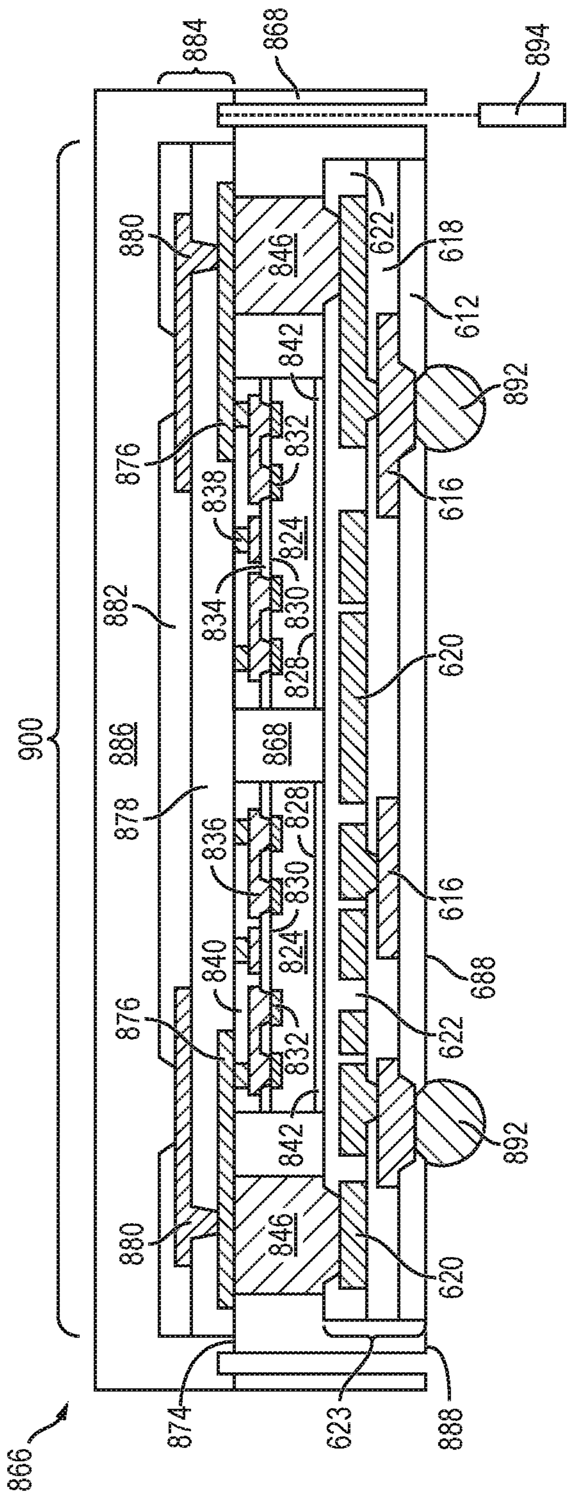

In FIG. 19*k*, an electrically conductive bump material is deposited over exposed conductive layer 616 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 616 using a suitable attachment or bonding process. In one embodiment, the bump material is reflowed by heating the material above the material's melting point to form balls or bumps 892. In some applications, bumps 892 are reflowed a second time to improve electrical contact to conductive layer 616. In one embodiment, bumps 892 are formed over a UBM having a wetting layer, barrier layer, and adhesive layer. Bumps 892 can also be compression bonded or thermocompression bonded to conductive layer 616. Bumps 892 represent one type of interconnect structure that can be formed over conductive layer 616. The interconnect structure can also use bond wires, conductive paste, stud bump, micro bump, or other electrical interconnect.

Reconstituted wafer 866 is singulated through encapsulant 868 using a saw blade or laser cutting tool 894 into individual Fo-WLPs 900.

Figure 20:
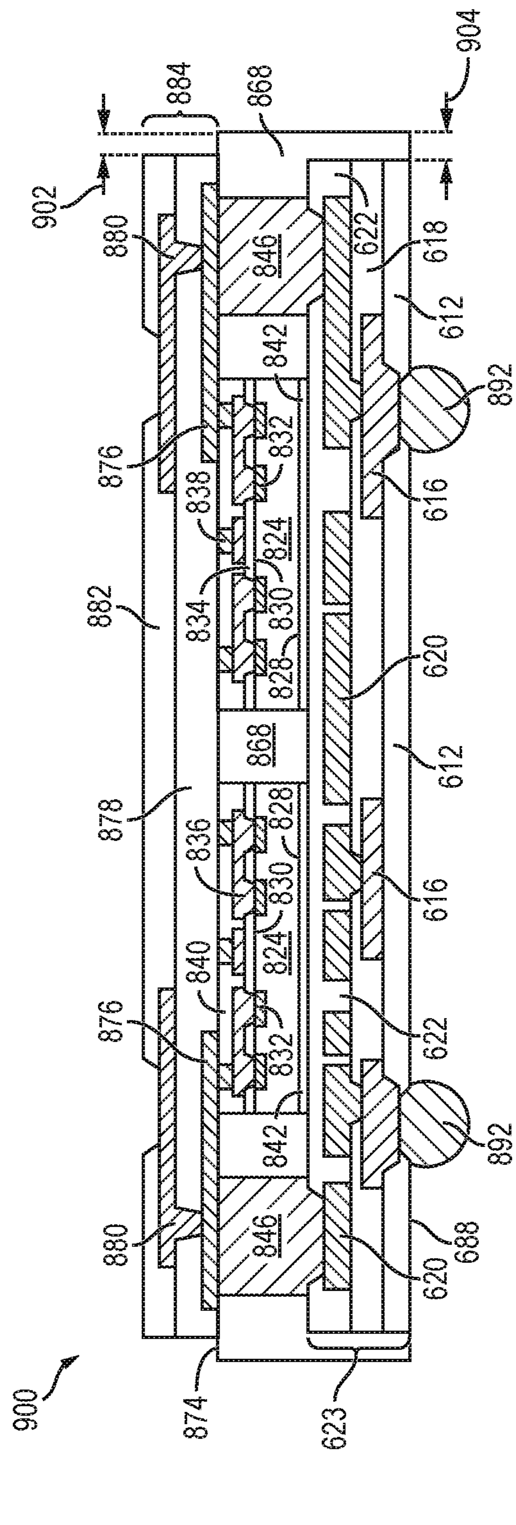
FIG. 20 illustrates a Fo-WLP with top and bottom interconnect structures formed using an embedded temporary substrate.

FIG. 20 shows Fo-WLP 900 after singulation. Semiconductor die 824 are electrically connected through build-up interconnect structures 623 and 884, and conductive columns 846 to bumps 892 for connection to external devices, for example a PCB. Build-up interconnect structure 884 routes electrical signals between semiconductor die 824, conductive columns 846, and external devices stacked over conductive layer 880. Build-up interconnect structure 623 and conductive columns 846 are formed over substrate 610 prior to mounting semiconductor die 824. Forming build-up interconnect structure 623 and conductive columns 846 over substrate 610 allows established Si substrate fabrication materials and techniques to be utilized during the formation of build-up interconnect structure 623 and conductive columns 846. The established materials and standardized equipment lowers manufacturing costs and capital risk by reducing or eliminating the need for specialized semiconductor processing lines in the formation of the interconnect structures within Fo-WLP 900. Conductive columns 846 provide vertical or 3D interconnection within Fo-WLP 900 without requiring laser drilling through the semiconductor package. Accordingly, forming build-up interconnect structure 623 and conductive columns 846 on substrate 610 minimizes the manufacturing time and cost of Fo-WLP 900, while providing increased flexibility in interconnect location and design.

Build-up interconnect structure 623 and conductive columns 846 are inspected and tested to be known good before additional device integration, which prevents fabrication materials and KGD from being wasted over defective interconnect structures 623. Forming build-up interconnect structure 623 prior to depositing encapsulant 868 also reduces the number of manufacturing steps taking place over reconstituted wafer 866, as only interconnect structure 884 is formed over reconstituted wafer 866, i.e., after deposition of encapsulant 868. Reducing the number of manufacturing steps taking place over reconstituted wafer 866 decreases the amount of stress placed on reconstituted wafer 866 and semiconductor die 824 as less insulating and conductive layer fabrication cycles are performed over encapsulated semiconductor die 824.

Insulating layers 878 and 882 and conductive layers 876 and 880 of build-up interconnect structure 884 are formed over a footprint of semiconductor unit 860 such that a portion of surface 874 of encapsulant 868 is exposed from build-up interconnect structure 884 and a distance 902 between a side surface, or sidewall, of build-up interconnect structure 884 and the outer edge, or sidewall, of encapsulant 868 is greater than 0 μm. Forming build-up interconnect structure 884 over the footprint of semiconductor unit 860 allows reconstituted wafer 866 to be singulated by cutting through only encapsulant 868, thereby eliminating a need to cut through build-up interconnect structure 884, and reducing a risk of damaging the layers of build-up interconnect structure 884 during singulation.

Semiconductor units 860 are disposed over carrier 862 prior to deposition of encapsulant 868. Disposing individual, or singulated, semiconductor units 860 allows each semiconductor unit 860 to be tested prior mounting semiconductor units 860 to carrier 862 such that only known good semiconductor units 860 are included in reconstituted wafer 866. Encapsulating individual, or singulated, semiconductor units 860 also allows encapsulant 868 to flow between semiconductor units 860 and around the side surfaces of build-up interconnect structure 623. After singulation of reconstituted wafer 866, encapsulant 868 is disposed around the side surfaces, or sidewalls, of build-up interconnect structure 623 such that a width 904 between the side surface of build-up interconnect structure 623 and an outer edge of Fo-WLP 900 is greater than 0 μm. Disposing encapsulant 868 around build-up interconnect structure 623 provides structural support and environmentally protects the layers of build-up interconnect structure 623 from external elements and contaminants.

Substrate 610 is encapsulated within reconstituted wafer 866 to provide structural support during subsequent wafer handling and during the formation of build-up interconnect structure 884. Substrate 610 is a Si substrate and has a CTE similar to the CTE of semiconductor die 824. The similarity in the CTEs of substrate 610 and semiconductor die 824 decreases CTE mismatch within reconstituted wafer 866 and reduces warpage caused by CTE-induced stress. The reduction of warpage and decrease of thermal stress in reconstituted wafer 866 decreases the occurrence of interconnection failures within build-up interconnect structures 623 and 884 thereby increasing the reliability of Fo-WLP 900. Substrate 610 is removed prior to singulation. Thus, substrate 610 is able to provide support and reduce warpage during the manufacturing of Fo-WLP 900 without increasing a final height of Fo-WLP 900.

Figure 21A:
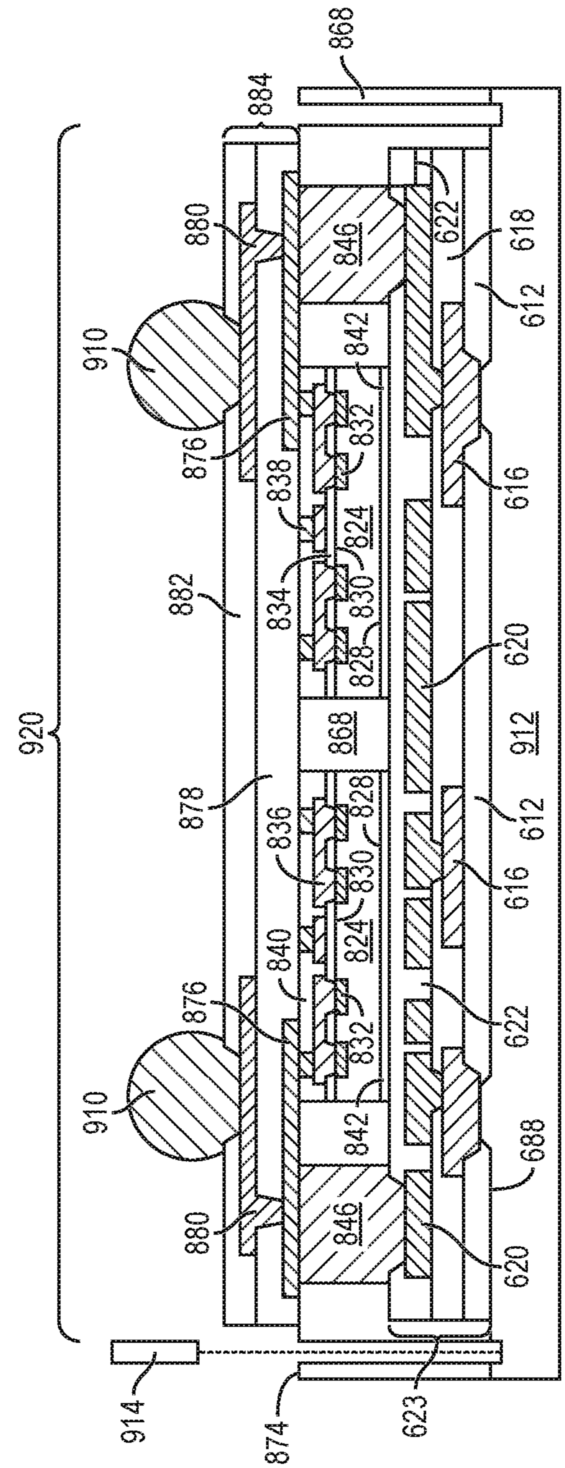
FIGS. 21*a*-21*b* illustrate another process of forming top and bottom build-up interconnect structures using an embedded temporary substrate.
Figure 21B:
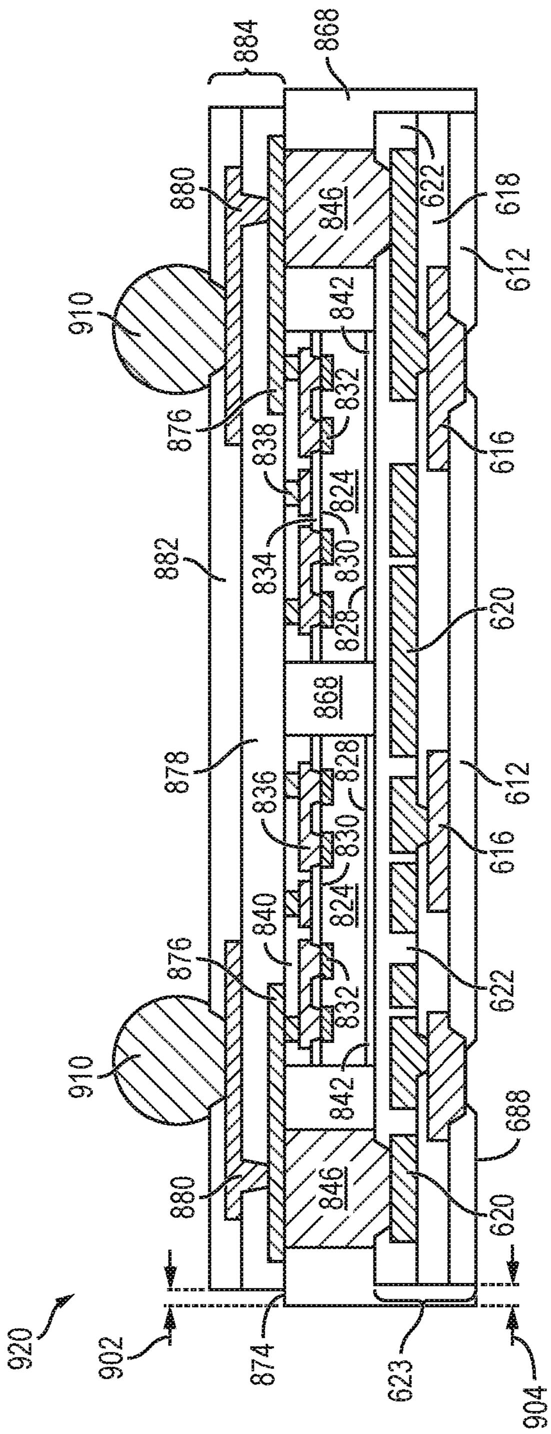

FIGS. 21*a*-21*b* illustrate, in relation to FIG. 1, a process of forming top and bottom interconnect structures in a Fo-WLP using an embedded temporary substrate for warpage control. Continuing from FIG. 19*j*, FIG. 21*a* shows reconstituted wafer 866 after removal of substrate 610 and exposure of conductive layer 616.

An electrically conductive bump material is deposited over conductive layer 880 of build-up interconnect structure 884 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 880 using a suitable attachment or bonding process. In one embodiment, the bump material is reflowed by heating the material above the material's melting point to form balls or bumps 910. In some applications, bumps 910 are reflowed a second time to improve electrical contact to conductive layer 880. In one embodiment, bumps 910 are formed over a UBM having a wetting layer, barrier layer, and adhesive layer. Bumps 910 can also be compression bonded or thermocompression bonded to conductive layer 880. Bumps 910 represent one type of interconnect structure that can be formed over conductive layer 880. The interconnect structure can also use bond wires, conductive paste, stud bump, micro bump, or other electrical interconnect.

A dicing tape or support carrier 912 is applied over insulating layer 612 and encapsulant 868. Reconstituted wafer 866 is then singulated through surface 874 of encapsulant 868 using a saw blade or laser cutting tool 914 into individual Fo-WLPs 920. Dicing tape 912 supports reconstituted wafer 866 during singulation.

FIG. 21*b* shows Fo-WLPs 920 after singulation. Semiconductor die 824 are electrically connected through build-up interconnect structure 884 to bumps 910 for connection to external devices, for example a PCB. Build-up interconnect structure 623 routes electrical signals between semiconductor die 824, conductive columns 846, and external devices stacked on conductive layer 616. Build-up interconnect structure 623 and conductive columns 846 are formed over substrate 610 prior to mounting semiconductor die 824. Forming build-up interconnect structure 623 and conductive columns 846 over substrate 610 allows established Si substrate fabrication materials and techniques to be utilized during the formation of build-up interconnect structure 623 and conductive columns 846. The established materials and standardized equipment lowers manufacturing costs and capital risk by reducing or eliminating the need for specialized semiconductor processing lines in the formation of the interconnect structures within Fo-WLP 920. Conductive columns 846 provide vertical or 3D interconnection within Fo-WLP 920 without requiring laser drilling through the semiconductor package. Accordingly, forming build-up interconnect structure 623 and conductive columns 846 on substrate 610 minimizes the manufacturing time and cost of Fo-WLP 920, while providing increased flexibility in interconnect location and design.

Build-up interconnect structure 623 and conductive columns 846 are inspected and tested to be known good before additional device integration, which prevents fabrication materials and KGD from being wasted over defective interconnect structures. Forming build-up interconnect structure 623 prior to depositing encapsulant 868 also reduces the number of manufacturing steps taking place over reconstituted wafer 866, as only interconnect structure 884 is formed over reconstituted wafer 866, i.e., after deposition of encapsulant 868. Reducing the number of manufacturing steps taking place over reconstituted wafer 866 decreases the amount of stress placed on reconstituted wafer 866 and semiconductor die 824 as less insulating and conductive layer deposition cycles are performed over encapsulated semiconductor die 824.

Insulating layers 878 and 882 and conductive layers 876 and 880 of build-up interconnect structure 884 are formed over a footprint of semiconductor unit 860 such that a portion of surface 874 of encapsulant 868 is exposed from build-up interconnect structure 884 and the distance 902 between the side surface of build-up interconnect structure 884 and the outer edge of encapsulant 868 is greater than 0 μm. Forming build-up interconnect structure 884 over the footprint of semiconductor unit 860 allows reconstituted wafer 866 to be singulated by cutting through only encapsulant 868, thereby eliminating a need to cut through build-up interconnect structure 884, and reducing a risk of damaging the layers of build-up interconnect structure 884 during singulation.

Semiconductor units 860 are disposed over carrier 862 prior to deposition of encapsulant 868. Disposing individual, or singulated, semiconductor units 860 over carrier 862 allows each semiconductor unit 860 to be tested prior mounting semiconductor units 860 to interface layer 864 such that only known good semiconductor units 860 are included in reconstituted wafer 866. Encapsulating individual, or singulated, semiconductor units 860 also allows encapsulant 868 to flow between the semiconductor units and around the side surfaces of build-up interconnect structure 623. After singulation of reconstituted wafer 866, encapsulant 868 is disposed around the side surfaces of build-up interconnect structure 623 such that the width 904 between the side surface of build-up interconnect structure 623 and an outer edge of Fo-WLP 920 is greater than 0 μm. Disposing encapsulant 868 around build-up interconnect structure 623 provides structural support and environmentally protects the layers of build-up interconnect structure 623 from external elements and contaminants.

Substrate 610 is encapsulated within reconstituted wafer 866 to provide structural support during subsequent wafer handling and during the formation of build-up interconnect structure 884. Substrate 610 is a Si substrate and has a CTE similar to the CTE of semiconductor die 824. The similarity in the CTEs of substrate 610 and semiconductor die 824 decreases CTE mismatch within reconstituted wafer 866 and reduces warpage caused by CTE-induced stress. The reduction of warpage and decrease of thermal stress in reconstituted wafer 866 decreases the occurrence of interconnection failures within build-up interconnect structures 623 and 884, thereby increasing the reliability of Fo-WLP 920. Substrate 610 is removed prior to singulation of reconstituted wafer 866. Thus, substrate 610 is able to provide support and reduce warpage during the manufacturing of Fo-WLP 920 without increasing a final height of Fo-WLP 920.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate;

forming a first interconnect structure over the substrate;

disposing a first semiconductor die over the first interconnect structure;

disposing the substrate over a carrier with the first semiconductor die oriented away from the carrier;

depositing an encapsulant over the carrier, substrate, and first semiconductor die;

forming a second interconnect structure over the encapsulant and semiconductor die; and removing the substrate to expose the first interconnect structure after forming the second interconnect structure.

2. The method of claim 1, further including forming a conductive column over the first interconnect structure.

3. The method of claim 2, wherein the conductive column extends from the first interconnect structure to the second interconnect structure.

4. The method of claim 1, further including forming a shielding layer within the first interconnect structure or second interconnect structure.

5. The method of claim 1, further including forming a conductive pillar over the first semiconductor die.

6. The method of claim 1, further including disposing a second semiconductor die over the first interconnect structure.

7. A method of making a semiconductor device, comprising:

providing a substrate;

forming a first interconnect structure over the substrate;

disposing a semiconductor die over the first interconnect structure;

singulating the substrate and first interconnect structure after disposing the semiconductor die over the first interconnect structure;

disposing the substrate over a carrier after singulating the substrate and first interconnect structure;

depositing an encapsulant over the semiconductor die, the substrate, and a side surface of the first interconnect structure while the substrate is over the carrier;

forming a second interconnect structure over the encapsulant and semiconductor die with the semiconductor die between the first interconnect structure and second interconnect structure; and removing the substrate and carrier to expose the first interconnect structure after forming the second interconnect structure over the semiconductor die.

8. The method of claim 7, further including forming a vertical interconnect structure over the first interconnect structure.

9. The method of claim 7, wherein forming the first interconnect structure includes:

forming an insulating layer over the substrate; and forming a conductive layer over the insulating layer.

10. The method of claim 9, further including removing a portion of the insulating layer after removing the substrate.

11. The method of claim 7, further including disposing the substrate in contact with a carrier.

12. A method of making a semiconductor device, comprising:

providing a substrate;

forming a first interconnect structure over the substrate;

disposing a first semiconductor die over the first interconnect structure;

disposing the substrate over a carrier with the substrate oriented toward the carrier;

depositing an encapsulant over the first semiconductor die and substrate, wherein the encapsulant extends over a side surface of the substrate;

forming a second interconnect structure over the encapsulant; and removing the substrate and carrier to expose the first interconnect structure.

13. The method of claim 12, further including removing the substrate after forming the second interconnect structure.

14. The method of claim 12, wherein the substrate includes silicon.

15. The method of claim 12, further including forming a vertical interconnect structure over the first interconnect structure.

16. The method of claim 12, wherein forming the first interconnect structure includes:

forming an insulating layer over the substrate; and forming a conductive layer over the insulating layer.

17. The method of claim 16, further including removing a portion of the insulating layer after removing the substrate.

18. The method of claim 12, further including disposing a second semiconductor die over the first interconnect structure.

19. A semiconductor device, comprising:

a carrier;

a substrate disposed over the carrier;

a first interconnect structure formed over the substrate;

a first semiconductor die disposed over the first interconnect structure;

an encapsulant disposed over the carrier, substrate, first interconnect structure, and first semiconductor die, wherein the encapsulant covers a side surface of the first interconnect structure; and a second interconnect structure formed over the encapsulant with the first semiconductor die disposed between the first interconnect structure and second interconnect structure, wherein the second interconnect structure is formed directly on a top surface of the encapsulant and contacts a contact pad of the first semiconductor die.

20. The semiconductor device of claim 19, further including a second semiconductor die disposed over the first interconnect structure.

21. The semiconductor device of claim 19, wherein the substrate includes glass.

22. The semiconductor device of claim 19, further including a vertical interconnect structure formed through the encapsulant between the first interconnect structure and second interconnect structure, wherein the second interconnect structure contacts the vertical interconnect structure.

* * * * *